(12) United States Patent
Charvat et al.

(10) Patent No.: US 10,074,889 B2
(45) Date of Patent: Sep. 11, 2018

(54) CHIP-SCALE RADIO-FREQUENCY LOCALIZATION DEVICES AND ASSOCIATED SYSTEMS AND METHODS

(71) Applicant: Humatics Corporation, Cambridge, MA (US)

(72) Inventors: Gregory L. Charvat, Guilford, CT (US); David A. Mindell, Cambridge, MA (US)

(73) Assignee: Humatics Corporation, Cambridge, MA (US)

( * ) Notice: Subject to any disclaimer, the term of this patent is extended or adjusted under 35 U.S.C. 154(b) by 0 days.

(21) Appl. No.: 15/469,282

(22) Filed: Mar. 24, 2017

(65) Prior Publication Data

US 2017/0201005 A1    Jul. 13, 2017

Related U.S. Application Data

(62) Division of application No. 15/382,582, filed on Dec. 16, 2016.

(Continued)

(51) Int. Cl.
*H01Q 1/22*  (2006.01)
*H01Q 1/38*  (2006.01)

(Continued)

(52) U.S. Cl.
CPC ............ *H01Q 1/2283* (2013.01); *H01Q 1/24* (2013.01); *H01Q 1/247* (2013.01); *H01Q 1/38* (2013.01);

(Continued)

(58) Field of Classification Search
CPC ........ H01Q 1/2283; H01Q 1/247; H01Q 1/38; H01Q 9/0492
See application file for complete search history.

(56) References Cited

U.S. PATENT DOCUMENTS 3,631,484 A    12/1971    Augenblick
3,781,879 A    12/1973    Staras
(Continued)

FOREIGN PATENT DOCUMENTS

WO    WO 2016/205216 A1    12/2016
WO    WO 2016/205217 A1    12/2016
(Continued)

OTHER PUBLICATIONS

U.S. Appl. No. 15/181,930, filed Jun. 14, 2016, Mindell et al.
(Continued)

*Primary Examiner* — Dameon E Levi
*Assistant Examiner* — Ab Salam Alkassim, Jr.
(74) *Attorney, Agent, or Firm* — Wolf, Greenfield & Sacks, P.C.

(57) ABSTRACT

A device comprising: a substrate; a semiconductor die mounted on the substrate; a transmit antenna fabricated on the substrate and configured to transmit radio-frequency (RF) signals at least at a first center frequency; a receive antenna fabricated on the substrate and configured to receive RF signals at least at a second center frequency different than the first center frequency; and circuitry integrated with the semiconductor die and configured to provide RF signals to the transmit antenna and to receive RF signals from the receive antenna.

8 Claims, 35 Drawing Sheets

Related U.S. Application Data

(60) Provisional application No. 62/306,469, filed on Mar. 10, 2016, provisional application No. 62/306,478, filed on Mar. 10, 2016, provisional application No. 62/306,483, filed on Mar. 10, 2016, provisional application No. 62/275,400, filed on Jan. 6, 2016, provisional application No. 62/268,741, filed on Dec. 17, 2015, provisional application No. 62/268,745, filed on Dec. 17, 2015.

(51) Int. Cl.
   H01Q 1/24 (2006.01)
   H01Q 9/04 (2006.01)
   H04W 64/00 (2009.01)
   G01S 11/02 (2010.01)
   H04B 5/00 (2006.01)

(52) U.S. Cl.
   CPC ............ H01Q 9/0492 (2013.01); *G01S 11/02* (2013.01); *H04B 5/0056* (2013.01); *H04W 64/006* (2013.01)

(56) References Cited

U.S. PATENT DOCUMENTS

| | | | |
|---|---|---|---|
| 4,001,822 A | 1/1977 | Sterzer | |
| 5,108,027 A | 4/1992 | Warner et al. | |
| 5,111,202 A | 5/1992 | Rivera et al. | |
| 5,115,245 A | 5/1992 | Wen et al. | |
| 5,355,283 A | 10/1994 | Marrs et al. | |
| 5,465,099 A * | 11/1995 | Mitsui | G01S 13/753 |
| | | | 343/701 |
| 5,495,255 A | 2/1996 | Komatsu et al. | |
| 6,046,683 A * | 4/2000 | Pidwerbetsky | G01S 5/04 |
| | | | 340/10.32 |
| 6,084,530 A * | 7/2000 | Pidwerbetsky | G06K 7/10069 |
| | | | 340/10.1 |
| 6,114,971 A | 9/2000 | Nysen | |
| 6,297,773 B1 | 10/2001 | Fullerton et al. | |
| 6,353,406 B1 * | 3/2002 | Lanzl | G01S 13/84 |
| | | | 340/10.1 |
| 6,356,764 B1 * | 3/2002 | Ovard | G06K 7/0008 |
| | | | 340/573.4 |
| 6,369,710 B1 * | 4/2002 | Poticny | G08B 13/1427 |
| | | | 340/572.1 |
| 6,480,143 B1 * | 11/2002 | Kruger | G06K 7/0008 |
| | | | 342/42 |
| 6,600,443 B2 * | 7/2003 | Landt | G01S 3/043 |
| | | | 340/6.1 |
| 6,633,226 B1 | 10/2003 | Nysen | |
| 6,657,549 B1 * | 12/2003 | Avery | G01S 5/0081 |
| | | | 340/10.31 |
| 6,667,724 B2 | 12/2003 | Barnes et al. | |
| 6,693,557 B2 | 2/2004 | Arnold et al. | |
| 6,868,073 B1 | 3/2005 | Carrender | |
| 6,914,579 B2 | 7/2005 | Schadler | |
| 6,958,677 B1 | 10/2005 | Carter | |
| 7,023,321 B2 * | 4/2006 | Brillon | G07C 9/00309 |
| | | | 180/287 |
| 7,088,964 B2 | 8/2006 | O | |
| 7,145,453 B2 | 12/2006 | Miller, Jr. et al. | |
| 7,193,504 B2 * | 3/2007 | Carrender | G06K 7/0008 |
| | | | 340/10.1 |
| 7,253,717 B2 * | 8/2007 | Armstrong | G06K 7/0008 |
| | | | 340/10.2 |
| 7,388,464 B2 | 6/2008 | Ward et al. | |
| 7,504,992 B2 * | 3/2009 | Pilcher, Jr. | G01S 13/84 |
| | | | 342/118 |
| 7,580,378 B2 | 8/2009 | Carrender et al. | |
| 7,592,898 B1 * | 9/2009 | Ovard | G06K 7/0008 |
| | | | 340/10.4 |
| 7,626,488 B2 | 12/2009 | Armstrong et al. | |
| 7,649,491 B2 | 1/2010 | Ohara et al. | |
| 7,903,022 B2 * | 3/2011 | Ohara | G01S 13/84 |
| | | | 342/118 |
| 7,965,191 B2 * | 6/2011 | Rofougaran | G06K 7/10237 |
| | | | 340/572.4 |
| 7,979,033 B2 * | 7/2011 | Rofougaran | H01Q 1/2283 |
| | | | 343/795 |
| 8,060,400 B2 | 11/2011 | Wellman | |
| 8,063,744 B2 | 11/2011 | Wu et al. | |
| 8,081,117 B2 | 12/2011 | Nagai et al. | |
| 8,264,226 B1 | 9/2012 | Olsson et al. | |
| 8,279,112 B2 | 10/2012 | Carrick | |
| 8,351,968 B2 | 1/2013 | Ovard et al. | |
| 8,446,254 B2 | 5/2013 | Carrick et al. | |
| 8,525,648 B1 * | 9/2013 | Henty | G06F 3/0231 |
| | | | 340/10.2 |
| 8,723,720 B2 * | 5/2014 | Moffatt | G01S 13/825 |
| | | | 342/118 |
| 8,855,169 B2 * | 10/2014 | Ovard | G06K 7/0008 |
| | | | 340/10.1 |
| 9,141,836 B2 * | 9/2015 | Domokos | G06K 7/0008 |
| 9,413,418 B2 * | 8/2016 | Bottazzi | G01S 7/40 |
| 9,489,813 B1 * | 11/2016 | Beigel | G08B 13/2417 |
| 9,768,837 B2 * | 9/2017 | Charvat | H04B 5/0056 |
| 9,797,988 B2 * | 10/2017 | Charvat | G01S 5/14 |
| 9,903,939 B2 * | 2/2018 | Charvat | G01S 5/14 |
| 9,915,725 B1 * | 3/2018 | Charvat | G01S 5/14 |
| 2002/0071435 A1 | 6/2002 | Bolgiano et al. | |
| 2003/0020173 A1 | 1/2003 | Huff et al. | |
| 2004/0257267 A1 | 12/2004 | Mafune et al. | |
| 2005/0207481 A1 | 9/2005 | Forstner | |
| 2006/0250935 A1 | 11/2006 | Hamamoto et al. | |
| 2007/0013599 A1 | 1/2007 | Gaucher et al. | |
| 2007/0164420 A1 | 7/2007 | Chen et al. | |
| 2007/0182949 A1 | 8/2007 | Niclass | |
| 2007/0237029 A1 | 10/2007 | Watson | |
| 2008/0088503 A1 | 4/2008 | Beasley | |
| 2008/0158081 A1 | 7/2008 | Rofougaran | |
| 2008/0158084 A1 * | 7/2008 | Rofougaran | H01Q 1/2283 |
| | | | 343/793 |
| 2008/0198065 A1 | 8/2008 | Voigtlander et al. | |
| 2008/0204238 A1 * | 8/2008 | White | G06K 19/07745 |
| | | | 340/572.1 |
| 2008/0205495 A1 | 8/2008 | Trott | |
| 2008/0224874 A1 | 9/2008 | Rodgers | |
| 2008/0231420 A1 | 9/2008 | Koyama et al. | |
| 2009/0073054 A1 | 3/2009 | Yoon et al. | |
| 2009/0315777 A1 | 12/2009 | Baughman | |
| 2009/0322491 A1 * | 12/2009 | Wood, Jr. | G06K 7/0008 |
| | | | 340/10.4 |
| 2010/0073188 A1 | 3/2010 | Mickle et al. | |
| 2010/0117823 A1 | 5/2010 | Wholtjen | |
| 2010/0302117 A1 * | 12/2010 | Johnson | H01Q 1/38 |
| | | | 343/803 |
| 2010/0328073 A1 * | 12/2010 | Nikitin | G01S 5/0247 |
| | | | 340/572.1 |
| 2011/0007758 A1 | 1/2011 | Macrae | |
| 2011/0163882 A1 | 7/2011 | August et al. | |
| 2011/0181892 A1 | 7/2011 | Ritter et al. | |
| 2011/0187507 A1 * | 8/2011 | Nikitin | G06K 19/0723 |
| | | | 340/10.1 |
| 2011/0285606 A1 | 11/2011 | De Graauw | H01L 23/49816 |
| | | | 343/904 |
| 2012/0146834 A1 * | 6/2012 | Karr | G01S 13/325 |
| | | | 342/47 |
| 2012/0158235 A1 | 6/2012 | Jaynes | |
| 2012/0182129 A1 * | 7/2012 | Eggers | H04Q 9/00 |
| | | | 340/10.1 |
| 2013/0016023 A1 | 1/2013 | Gaucher et al. | |
| 2013/0023210 A1 * | 1/2013 | Rofougaran | H01L 23/66 |
| | | | 455/41.1 |
| 2013/0150160 A1 | 6/2013 | El Dokor et al. | |
| 2013/0162491 A1 * | 6/2013 | Yu | H01Q 19/30 |
| | | | 343/767 |
| 2013/0307742 A1 | 11/2013 | Hu et al. | |
| 2013/0321095 A1 * | 12/2013 | Lam | H03H 2/005 |
| | | | 333/103 |
| 2014/0096871 A1 | 4/2014 | Kaye | |
| 2014/0135042 A1 | 5/2014 | Buchheim et al. | |

(56) References Cited

U.S. PATENT DOCUMENTS

| | | | |
|---|---|---|---|
| 2014/0347222 A1* | 11/2014 | Ling | H01Q 3/40 |
| | | | 342/373 |
| 2014/0349675 A1 | 11/2014 | Schatzberg et al. | |
| 2014/0359540 A1 | 12/2014 | Kelsey et al. | |
| 2015/0048907 A1 | 2/2015 | Almgren et al. | |
| 2015/0282115 A1* | 10/2015 | Pitt | H04W 64/006 |
| | | | 455/456.1 |
| 2016/0363648 A1 | 12/2016 | Mindell et al. | |
| 2016/0363659 A1 | 12/2016 | Mindell et al. | |
| 2016/0363663 A1 | 12/2016 | Mindell et al. | |
| 2016/0363664 A1 | 12/2016 | Mindell et al. | |
| 2017/0176572 A1 | 6/2017 | Charvat et al. | |
| 2017/0179570 A1 | 6/2017 | Charvat et al. | |
| 2017/0179571 A1 | 6/2017 | Charvat et al. | |
| 2017/0179602 A1 | 6/2017 | Charvat et al. | |
| 2017/0179603 A1 | 6/2017 | Charvat et al. | |
| 2017/0180011 A1 | 6/2017 | Charvat et al. | |
| 2017/0181118 A1* | 6/2017 | Charvat | H01Q 1/525 |
| 2017/0363709 A1* | 12/2017 | Charvat | H01Q 9/27 |
| 2017/0371026 A1* | 12/2017 | Charvat | H04B 5/0056 |
| 2018/0067190 A1* | 3/2018 | Charvat | H01Q 1/525 |

FOREIGN PATENT DOCUMENTS

| | | |
|---|---|---|
| WO | WO 2016/205218 A1 | 12/2016 |
| WO | WO 2016/205219 A1 | 12/2016 |

OTHER PUBLICATIONS

U.S. Appl. No. 15/181,956, filed Jun. 14, 2016, Mindell et al.
U.S. Appl. No. 15/181,978, filed Jun. 14, 2016, Mindell et al.
U.S. Appl. No. 15/181,999, filed Jun. 14, 2016, Mindell et al.
U.S. Appl. No. 15/382,563, filed Dec. 16, 2016, Charvat et al.
U.S. Appl. No. 15/347,534, filed Nov. 9, 2016, Charvat.
U.S. Appl. No. 15/382,573, filed Dec. 16, 2016, Charvat et al.
U.S. Appl. No. 15/382,576, filed Dec. 16, 2016, Charvat et al.
U.S. Appl. No. 15/382,582, filed Dec. 16, 2016, Charvat.
U.S. Appl. No. 15/382,194, filed Dec. 16, 2016, Charvat.
U.S. Appl. No. 15/382,258, filed Dec. 16, 2016, Charvat.
U.S. Appl. No. 15/382,315, filed Dec. 16, 2016, Charvat.
PCT/US2016/037404, Sep. 16, 2016, International Search Report and Written Opinion.
PCT/US2016/037406, Aug. 5, 2016, Invitation to Pay Additional Fees.
PCT/US2016/037406, Oct. 26, 2016, International Search Report and Written Opinion.
PCT/US2016/037403, Sep. 1, 2016, International Search Report and Written Opinion.
PCT/US2016/037407, Sep. 2, 2016, International Search Report and Written Opinion.
PCT/US16/67265, Apr. 14, 2017, International Search Report and Written Opinion.
U.S. Appl. No. 15/663,192, filed Jul. 28, 2017, Charvat et al.
U.S. Appl. No. 15/676,889, filed Aug. 14, 2017, Charvat et al.
U.S. Appl. No. 15/676,904, filed Aug. 14, 2017, Charvat et al.
U.S. Appl. No. 15/796,022, filed Oct. 27, 2017, Charvat et al.
Invitation to Pay Additional Fees for International Application No. PCT/US2016/037406 dated Aug. 5, 2016.
International Search Report and Written Opinion for International Application No. PCT/US2016/037406 dated Oct. 26, 2016.
International Search Report and Written Opinion for International Application No. PCT/US2016/037403 dated Sep. 1, 2016.
International Search Report and Written Opinion for International Application No. PCT/US2016/037407 dated Sep. 2, 2016.
International Search Report and Written Opinion for International Application No. PCT/US16/67265 dated Apr. 14, 2017.
[No Author Listed] Adafruit NeoPixel Digital RGB LED Strip—White 30 LED—White. 7 Pages. https://www.adafruit.com/products/1376 Last accessed Jan. 3, 2017.
Chalvatzis, An Injection-Locked 8.5 GHz VCO with Decade-Wide Programmable Locking Range in SiGe BiCMOS. IEEE. 2015;101-4.
Charvat et al., Harmonic Radar Tag Measurement and Characterization. IEEE. 2003;696-9.
Charvat et al., Time-of-Flight Microwave Camera. Sci. Rep. 5:14709; doi:10.1038/srep14709. 2015;1-6.
Charvat, Police Doppler Radar and Motion Sensors. In: Small and Short Range Radar Systems. 2014. Charvat, Chapter 8:20 pages.
Charvat, Continuous Wave (CW) Radar. In: Small and Short Range Radar Systems. 2014. Charvat, Chapter 2:34 pages.
Charvat, Frequency Modulated Continuous Wave (FMCW) Radar. In: Small and Short Range Radar Systems. 2014. Charvat, Chapter 3:71 pages.
Cho et al., A frequency agile floating-patch MEMS antenna for 42 GHz applications. 0-7803-883-6/05. IEEE. 2005;512-5.
Follmann et al., A Low-Noise 8-12 GHz Fractional-N. PLL in SiGe BiCMOS Technology. Proceedings of the 5th European Microwave Integrated Circuits Conference. EuMA. 2010;98-101.
Ravinuthula et al., A Low Power High Performance PLL with Temperature Compensated VCO in 65nm CMOS. 2016 IEEE Radio Frequency Integrated Circuits Symposium. IEEE. 2016;31-34.
Saiz et al., A 135GHz SiGe Transmitter With a Dielectric Rod Antenna-In-Package for High Eirp/Channel Arrays. Proceedings of the IEEE 2014 Custom Integrated Circuits Conference, Sep. 15-17, 2014;1-4.
Tang et al., 183GHz 13.5mW/Pixel CMOS Regenerative Receiver for mm-Wave Imaging applications. ISSCC 2011/Session 16/mm-Wave Design Techniques/ 16.10. IEEE International Solid-State Circuits Conference. 2011;296-8.
Yan et al., A 8.3-11.3GHz low cost Integer-N. synthesizer with 1.1° RMS phase error in 65nm CMOS. IEEE. 2012;225-7.

* cited by examiner

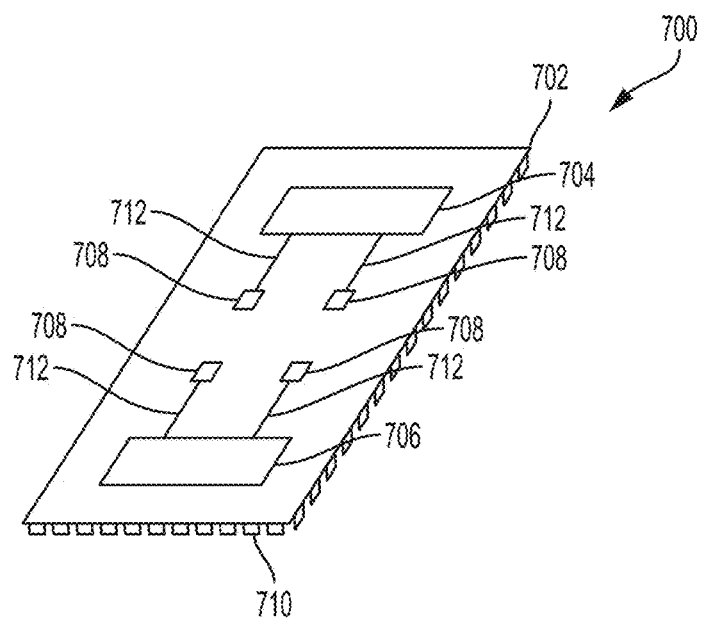
FIG. 7A
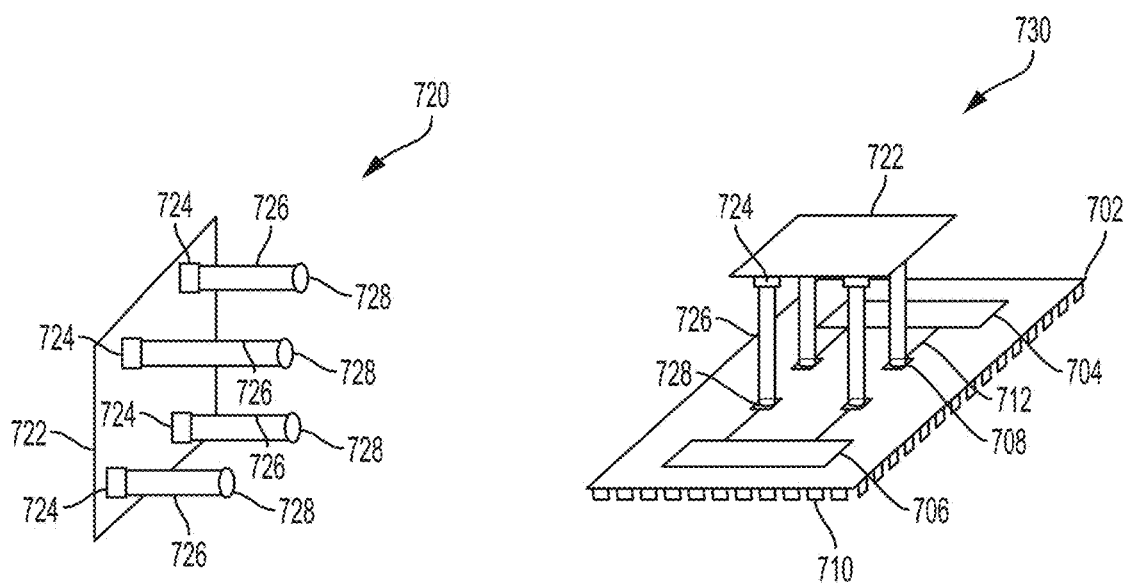
FIG. 7B
FIG. 7C

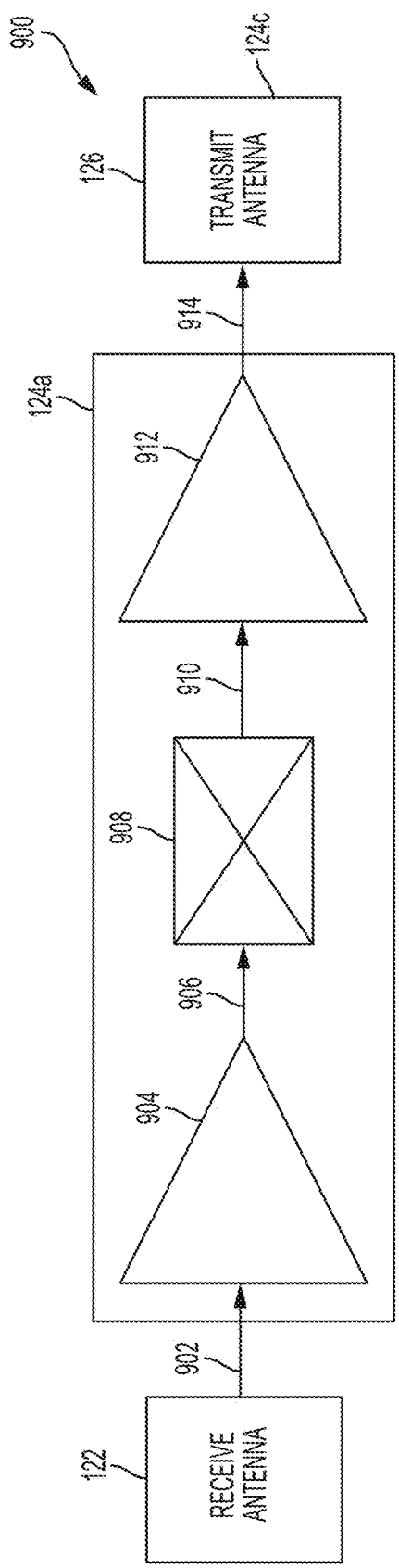
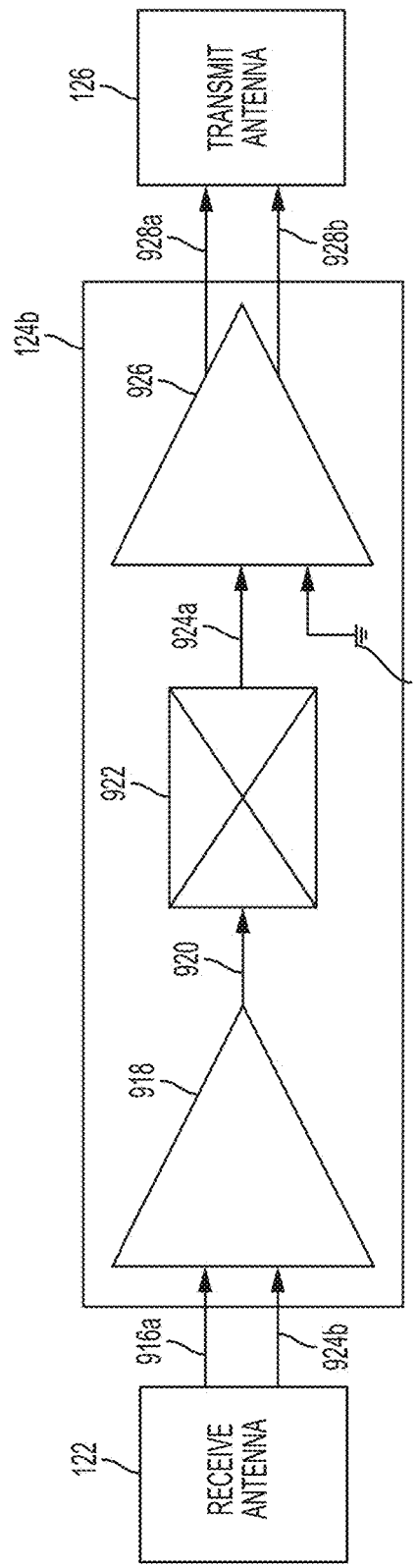
FIG. 9A
FIG. 9B

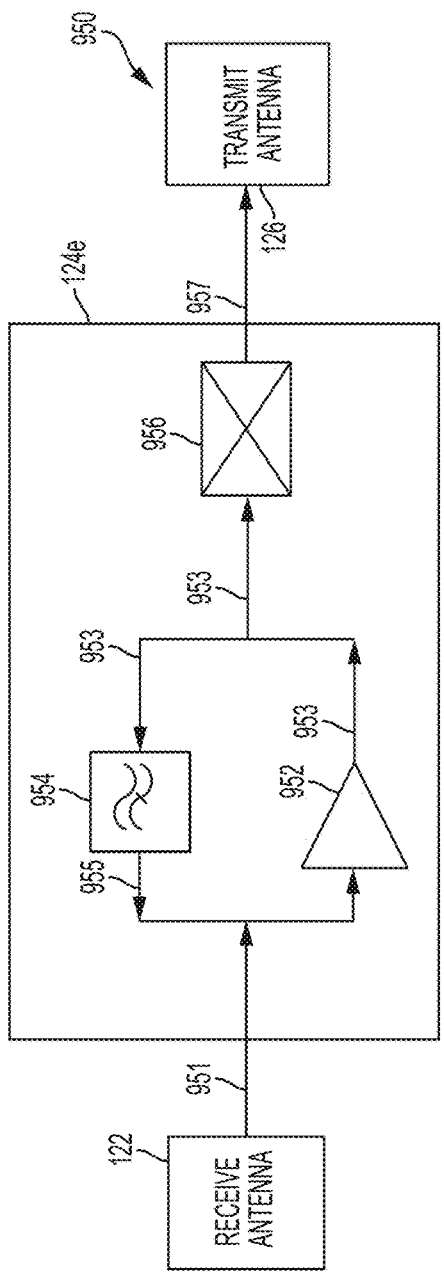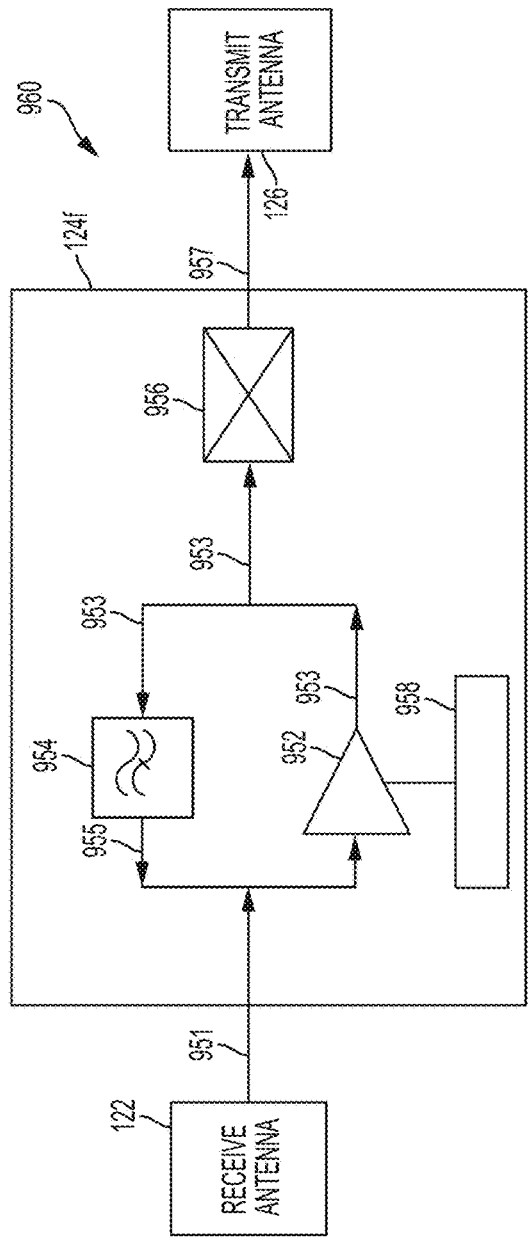
FIG. 9E
FIG. 9F

CHIP-SCALE RADIO-FREQUENCY LOCALIZATION DEVICES AND ASSOCIATED SYSTEMS AND METHODS

CROSS REFERENCE TO RELATED APPLICATIONS

This application is a divisional of and claims the benefit under 35 U.S.C. § 120 of U.S. patent application Ser. No. 15/382,582 entitled "CHIP-SCALE RADIO-FREQUENCY LOCALIZATION DEVICES AND ASSOCIATED SYSTEMS AND METHODS," filed Dec. 16, 2016, which claims the benefit under 35 U.S.C. § 119 to U.S. Provisional Application Ser. No. 62/268,741, titled "FREQUENCY-SHIFT TRANSPONDER," filed on Dec. 17, 2015; U.S. Provisional Application Ser. No. 62/268,745, titled "RADAR ON A CHIP," filed on Dec. 17, 2015; U.S. Provisional Application Ser. No. 62/275,400, titled "HIGH-PRECISION POSITIONING SYSTEM FOR A GROUND PENETRATING RADAR SYSTEM," filed on Jan. 6, 2016; U.S. Provisional Application Ser. No. 62/306,469, titled "HIGH-PRECISION TIME OF FLIGHT MEASUREMENT SYSTEM FOR PICKING AND PACKING," filed on Mar. 10, 2016; U.S. Provisional Application Ser. No. 62/306,478, titled "HIGH-PRECISION TIME OF FLIGHT MEASUREMENT SYSTEM FOR MICRONAVIGATION AND LOCALIZATION," filed on Mar. 10, 2016; and U.S. Provisional Application Ser. No. 62/306,483, titled "HIGH-PRECISION TIME OF FLIGHT MEASUREMENT SYSTEM ON A CHIP," filed on Mar. 10, 2016, each of which is incorporated by reference herein.

BACKGROUND

The ability to accurately determine the location of an object or target has potential benefits for numerous applications. Some exemplary applications benefitting from object localization include motion tracking, virtual reality, gaming, autonomous systems, robotics, etc. A number of technologies have been pursued that seek to provide localization, including global positioning system (GPS) technology, received signal strength indicator (RSSI) measurements, optical image data processing techniques, infrared ranging, etc. Generally, these conventional approaches are limited in application due to one or more deficiencies, including relatively poor or insufficient accuracy and/or precision, computational complexity resulting in relatively long refresh rates, environmental limitations (e.g., operation limited to outdoors, cellular or network access requirements and/or vulnerability to background clutter or noise), cost, size, etc.

SUMMARY

Some embodiments provide for a system comprising: a first interrogator device, comprising: a first antenna configured to transmit, to a target device, a first radio-frequency (RF) signal having a first center frequency; a second antenna configured to receive, from the target device, a second RF signal having a second center frequency that is a harmonic of the first frequency; and first circuitry configured to obtain, using the first RF signal and the second RF signal, a first mixed RF signal indicative of a first distance between the first interrogator and the target device; a second interrogator device, comprising: a third antenna configured to transmit, to the target device, a third RF signal having the first center frequency; a fourth antenna configured to receive, from the target device, a fourth RF signal having the second center frequency; and second circuitry configured to obtain, using the third RF signal and the fourth RF signal, a second mixed RF signal indicative of a second distance between the second interrogator and the target device; and at least one processor configured to: determine the first distance based on the first mixed RF signal; determine the second distance based on the second mixed RF signal; and determine a location of the target device using the determined first distance and second distance.

Some embodiments provide for a system comprising a first interrogator device and a second interrogator device. The first interrogator devices comprises: a first antenna; configured to transmit, to a target device, a first microwave radio-frequency (RF) signal having a first center frequency; a second antenna configured to receive, from the target device, a second microwave RF signal having a second center frequency that is a harmonic of the first frequency; and first circuitry configured to obtain, using the first RF signal and the second RF signal, a first mixed RF signal indicative of a first distance between the first interrogator and the target device. The second interrogator device comprises: a third antenna configured to transmit, to the target device, a third microwave RF signal having the first center frequency; a fourth antenna configured to receive, from the target device, a fourth microwave RF signal having the second center frequency; and second circuitry configured to obtain, using the third RF signal and the fourth RF signal, a second mixed RF signal indicative of a second distance between the second interrogator and the target device.

Some embodiments provide for a method comprising: transmitting, from a first interrogator device to a target device, a first radio-frequency (RF) signal having a first center frequency; receiving, at the first interrogator device and from the target device, a second RF signal having a second center frequency that is a harmonic of the first frequency; transmitting, from a second interrogator device to the target device, a third RF signal having the first center frequency; receiving, at the second interrogator device and from the target device, a fourth RF signal having the second center frequency; determining a first distance based on the first RF signal and the second RF signal; determining a second distance based on the third RF signal and the fourth RF signal; and determining a location of the target device using the determined first distance and second distance.

Some embodiments provide for a device comprising: a transmit antenna configured to transmit radio frequency (RF) signals; a receive antenna configured to receive RF signals; and circuitry, differentially coupled to the transmit and receive antennas, and configured to provide to the transmit antenna RF signals to be transmitted by the transmit antenna and to process RF signals received by the receive antenna.

Some embodiments provide for a device comprising: a substrate; a transmit antenna fabricated on the substrate and configured to transmit radio-frequency (RF) signals; a receive antenna fabricated on the substrate and configured to receive RF signals; and circuitry, disposed on the substrate and differentially coupled to the transmit and receive antennas, and configured to provide to the transmit antenna RF signals to be transmitted by the transmit antenna and to process RF signals received by the receive antenna, wherein the substrate comprises material for reducing harmonic coupling between the transmit antenna and the receive antenna.

Some embodiments are directed to a device comprising: a substrate; a semiconductor die flip-chip bonded to the substrate; a transmit antenna fabricated on the substrate and configured to transmit microwave radio-frequency (RF) signals; and circuitry integrated with the semiconductor die, differentially coupled to the transmit antenna and configured to provide to the transmit antenna microwave RF signals to be transmitted by the transmit antenna.

Some embodiments are directed to a device comprising: a substrate; a semiconductor die mounted on the substrate; a transmit antenna fabricated on the substrate and configured to transmit microwave radio-frequency (RF) signals; and circuitry integrated with the semiconductor die, differentially coupled to the transmit antenna and configured to provide to the transmit antenna microwave linear frequency modulated RF signals to be transmitted by the transmit antenna.

Some embodiments provide for a system comprising: an interrogator device, comprising: a first transmit antenna configured to transmit radio-frequency (RF) signals circularly polarized in a first rotational direction; and a first receive antenna configured to receive RF signals circularly polarized in a second rotational direction different from the first rotational direction; and a target device, comprising: a second receive antenna configured to receive RF signals circularly polarized in the first rotational direction and a second transmit antenna configured to transmit, to the interrogator device, RF signals circularly polarized in the second rotational direction.

Some embodiments provide for a method comprising: transmitting, using a first transmit antenna, a first radio-frequency (RF) signal circularly polarized in a first rotational direction; receiving, using a second receive antenna, a second RF signal circularly polarized in the first rotational direction, the second RF signal resulting from propagation of the first RF signal; transmitting, using a second transmit antenna, a third RF signal circularly polarized in a second rotational direction different from the first rotational direction, the third signal generated using the second RF signal; and receiving, using a first receive antenna, a fourth RF signal circularly polarized in the second rotational direction, the fourth signal resulting from propagation of the third RF signal.

Some embodiments provide for a device comprising: a first transmit antenna configured to transmit, to a target device, a first radio-frequency (RF) signal circularly polarized in a first rotational direction; a first receive antenna configured to receive, from the target device, a second RF signal circularly polarized in a second rotational direction different from the first rotational direction; and circuitry configured to determine a first distance between the device and the target device using the first RF signal and the second RF signal.

Some embodiments provide for a device comprising: a substrate; a semiconductor die mounted on the substrate; a transmit antenna fabricated on the substrate and configured to transmit radio-frequency (RF) signals at least at a first center frequency; a receive antenna fabricated on the substrate and configured to receive RF signals at least at a second center frequency different than the first center frequency; and circuitry integrated with the semiconductor die and configured to provide RF signals to the transmit antenna and to receive RF signals from the receive antenna.

Some embodiments provide for a device comprising: a substrate; a first transmit antenna fabricated on the substrate and configured to transmit radio frequency (RF) signals at least at a first center frequency; a first receive antenna fabricated on the substrate and configured to receive RF signals at least at a second center frequency different from the first center frequency; a second receive antenna fabricated on the substrate and configured to receive RF signals at least at the first center frequency; and a second transmit antenna fabricated on the substrate and configured to transmit RF signals at least at the second center frequency; a semiconductor die mounted to the substrate and coupled to the first transmit antenna, the first receive antenna, the second transmit antenna, and the second receive antenna, the semiconductor die comprising: interrogator circuitry configured to provide RF signals having the first center frequency to the first transmit antenna and to receive RF signals having the second center frequency from the first receive antenna; and target device circuitry configured to receive RF signals having the first center frequency from the second receive antenna and provide RF signals having the second center frequency to the second transmit antenna.

Some embodiments provide for a device comprising: a substrate; a semiconductor die mounted on the substrate; a transmit antenna fabricated on the substrate and configured to transmit radio-frequency (RF) signals circularly polarized in a first rotational direction; a receive antenna fabricated on the substrate and configured to receive RF signals circularly polarized in a second rotational direction different from the first rotational direction; and circuitry integrated with the semiconductor die and configured to provide RF signals to the transmit antenna and to receive RF signals from the receive antenna.

Some embodiments provide for a device, comprising: a substrate; a first transmit antenna fabricated on the substrate and configured to transmit radio frequency (RF) signals circularly polarized in a first rotational direction; a first receive antenna fabricated on the substrate and configured to receive RF signals circularly polarized in a second rotational direction different from the first rotational direction; a second receive antenna fabricated on the substrate and configured to receive RF signals circularly polarized in the first rotational direction; and a second transmit antenna fabricated on the substrate and configured to transmit RF signals circularly polarized in the second rotational direction; a semiconductor die mounted to the substrate and coupled to the first transmit antenna, the first receive antenna, the second transmit antenna, and the second receive antenna, the semiconductor die comprising: interrogator circuitry configured to provide RF signals to the first transmit antenna and to receive RF signals from the first receive antenna; and target device circuitry configured to receive RF signals from the second receive antenna and provide RF signals to the second transmit antenna.

Some embodiments provide for a system comprising: synchronization circuitry; a first interrogator device coupled to the synchronization circuitry and comprising: a transmit antenna; a first receive antenna; and first circuitry configured to: generate, using radio-frequency (RF) signal synthesis information received from the synchronization circuitry, a first RF signal for transmission by the transmit antenna; generate, using the first RF signal and a second RF signal received from a target device by the first receive antenna, a first mixed RF signal indicative of a first distance between the first interrogator and the target device; and a second interrogator device coupled to the synchronization circuitry and comprising: a second receive antenna; and second circuitry configured to: generate, using the RF signal synthesis information a third RF signal; and generate, using the third RF signal and a fourth RF signal received from the target device by the second receive antenna, a second mixed RF signal indicative of a second distance between the second interrogator and the target device.

Some embodiments provide for a method comprising: generating radio-frequency (RF) signal synthesis information; generating a first RF signal using the RF signal synthesis information; transmitting the first RF signal to a target device using a transmit antenna; after transmitting the first RF signal, receiving a second RF signal from the target device using a first receive antenna; generating a third RF signal using the RF signal synthesis information; receiving a fourth RF signal from the target device using a second receive antenna; generating, using the first RF signal and the second RF signal, a first mixed RF signal indicative of a first distance between the first receive antenna and the target device; and generating, using the third RF signal and the fourth RF signal, a second mixed RF signal indicative of a second distance between the second receive antenna and the target device.

Some embodiments provide for a device comprising: a receive antenna configured to receive a first radio-frequency (RF) signal having a first center frequency; a first transmit antenna configured to transmit a second RF signal having a second center frequency that is a harmonic of the first center frequency; a second transmit antenna configured to transmit a third RF signal having a third center frequency that is a harmonic of the first center frequency and is different from the second center frequency; first circuitry, coupled to the receive antenna and to the first transmit antenna, configured to generate the second RF signal using the first RF signal and provide the second RF signal to the first transmit antenna for transmission; and second circuitry, coupled to the receive antenna and to the second transmit antenna, configured to generate the third RF signal using the first RF signal and provide the third RF signal to the second transmit antenna for transmission.

Some embodiments provide for a device comprising: a transmit antenna configured to transmit, to a target device, a first radio-frequency (RF) signal having a first center frequency; a first receive antenna configured to receive, from the target device, a second RF signal having a second center frequency that is a harmonic of the first center frequency; a second receive antenna configured to receive, from the target device, a third RF signal having a third center frequency that is a harmonic of the first center frequency and is different from the second center frequency; first circuitry configured to obtain, using the first RF signal and the second RF signal, a first mixed RF signal indicative of a first distance between the device and the target device; and second circuitry configured to obtain, using the first and third RF signals, a second mixed RF signal indicative of a second distance between the device and the target device.

Some embodiments provide for a device comprise: a first receive antenna configured to receive a first radio-frequency (RF) signal having a first center frequency; a second receive antenna configured to receive a second RF signal having a second center frequency; a first transmit antenna configured to transmit a third RF signal having a third center frequency different from each of the first and second center frequencies; a second transmit antenna configured to transmit a fourth RF signal having a fourth center frequency different from each of the first, second, and third center frequencies; and circuitry comprising: a frequency mixer configured to generate a fifth RF signal by using the first RF signal and the second RF signal; first circuitry configured to generate the third RF signal using the fifth RF signal; and second circuitry configured to generate the fourth RF signal using the fifth RF signal.

Some embodiments provide for a device comprising: a first transmit antenna configured to transmit, to a target device, a first radio-frequency (RF) signal having a first center frequency; a second transmit antenna configured to transmit, to the target device, a second RF signal having a second center frequency; a first receive antenna configured to receive, from the target device, a third RF signal having a third center frequency different from each of the first and second center frequencies; a second receive antenna configured to receive, from the target device, a fourth RF signal having a fourth center frequency different from each of the first, second, and third center frequencies; first circuitry configured to obtain, using the first RF signal, the second RF signal, and the third RF signal, a first mixed RF signal indicative of a first distance between the device and the target device; and second circuitry configured to obtain, using the first RF signal, the second RF signal, and the fourth RF signal, a second mixed RF signal indicative of a second distance between the device and the target device.

Some embodiments provide for a device comprising: a substrate; an oscillator disposed on the substrate and configured to generate a first radio-frequency (RF) signal having a first center frequency; a dual band antenna mounted on the substrate and configured to receive, from an external device different from the device, a second RF signal having a second center frequency; and a frequency mixer disposed on the dual band antenna and configured to: generate a third RF signal having a third center frequency by mixing the first RF signal generated by the oscillator with the second RF signal received by the dual band antenna; and provide the third RF signal to the dual band antenna for transmission, wherein the dual band antenna is configured to transmit the third RF signal.

Some embodiments provide for a device comprising: a substrate; an oscillator disposed on the substrate and configured to generate radio-frequency (RF) signals having a first center frequency; a dual band microelectromechanical system (MEMS) antenna mounted on the substrate and configured to receive RF signals having a second center frequency; and circuitry configured to: generate RF signals having a third center frequency by mixing the RF signals generated by the oscillator with the RF signals received by the dual band MEMS antenna; and provide the RF signals having the third center frequency to the dual band MEMS antenna for transmission.

Some embodiments provide for a device comprising: a substrate; an oscillator disposed on the substrate; a dual band antenna mounted on the substrate; and circuitry configured to: generate microwave radio-frequency (RF) signals by mixing microwave RF signals generated by the oscillator with microwave RF signals received by the dual band antenna; and provide the generated microwave RF signals to the dual band antenna for transmission.

The foregoing is a non-limiting summary of the invention, which is defined by the attached claims.

BRIEF DESCRIPTION OF DRAWINGS

Various aspects and embodiments will be described with reference to the following figures. It should be appreciated that the figures are not necessarily drawn to scale.

FIG. 7A is a diagram of an illustrative substrate having transmit and receive antennas fabricated thereon, in accordance with some embodiments of the technology described herein.

FIG. 7B is a diagram of an illustrative semiconductor die being prepared for bonding to the substrate of FIG. 7A, in accordance with some embodiments of the technology described herein.

FIG. 7C is a diagram of the illustrative substrate of FIG. 7A after the illustrative semiconductor die of FIG. 7B has been flip-chip bonded to the substrate, in accordance with some embodiments of the technology described herein.

FIG. 9A is a block diagram illustrating components of a target device, in accordance with some embodiments of the technology described herein.

FIG. 9B is a block diagram illustrating components of another type of target device, in accordance with some embodiments of the technology described herein.

FIG. 9E is a block diagram illustrating components of another type target device, in accordance with some embodiments of the technology described herein.

FIG. 9F is a block diagram illustrating components of another type target device, in accordance with some embodiments of the technology described herein.

DETAILED DESCRIPTION

Figure 1A:
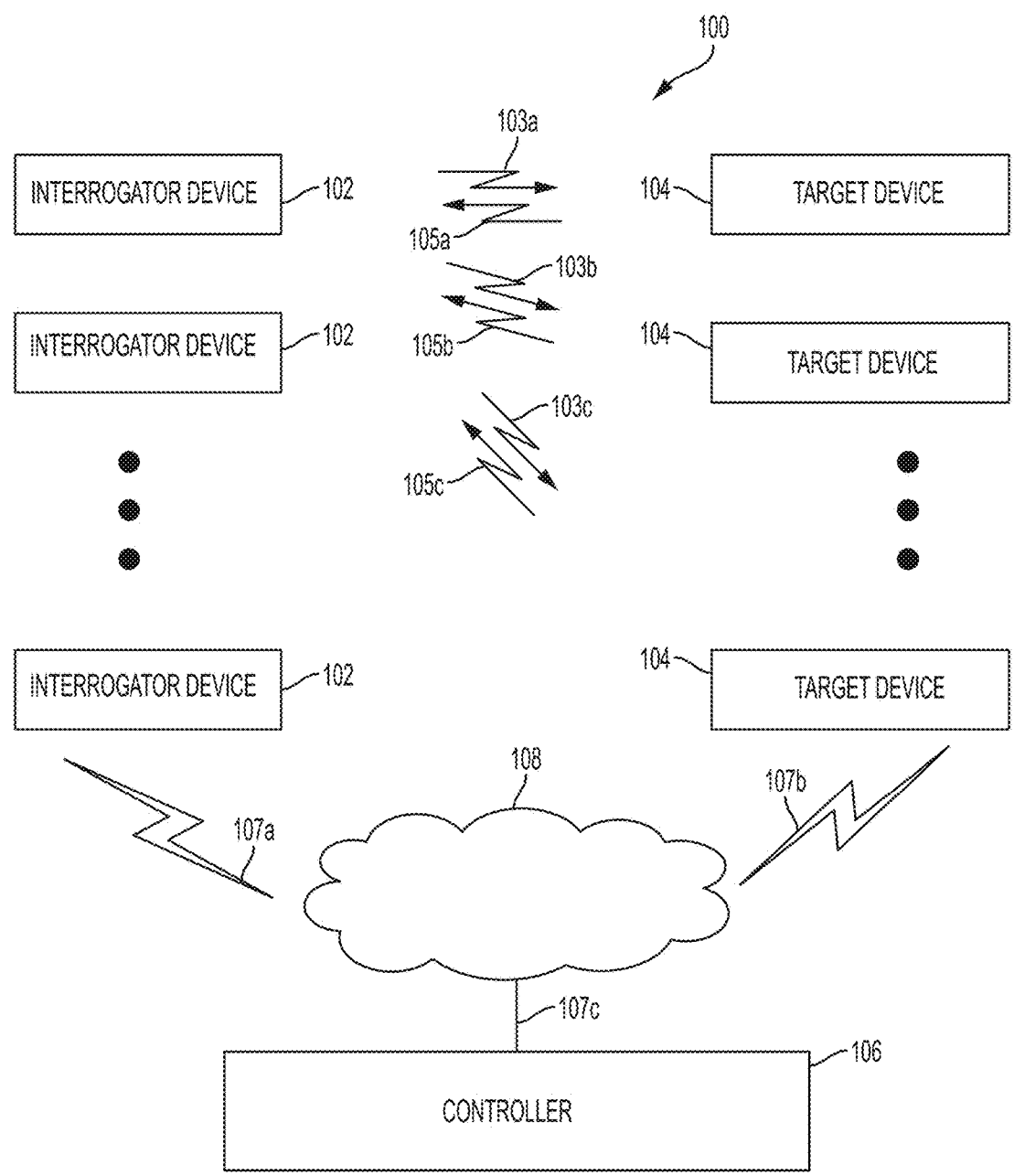
FIG. 1A shows an illustrative system 100 that may be used to implement radio frequency (RF) localization techniques, in accordance with some embodiments of the technology described herein.

Determining the location of an object or target (also referred to herein as localization) has an array of applications in a number of fields. For example, the ability to locate and/or track an object at very small scales (i.e., at high resolutions) facilitates advancement of numerous applications, and has wide spread applicability to a number of different fields. For example, the ability to accurately and precisely track an object or target in real-time has numerous benefits in the gaming industry and, in particular, for interactive video games. Object localization also has many applications in autonomous systems, such as autonomous vehicle navigation, exploration, robotics and human machine interaction. Virtual reality, motion tracking and capture and the like also benefit from the ability to locate and/or track object(s) accurately, robustly and in real-time or near real-time. Details of using localization techniques in a variety of applications are described in U.S. patent application Ser. No. 15/181,930 titled "High-Precision Time of Flight Measurement Systems," filed on Jun. 14, 2016, U.S. patent application Ser. No. 15/181,956 titled "High Precision Motion Tracking with Time of Flight Measurement Systems," filed on Jun. 14, 2016, U.S. patent application Ser. No. 15/181,978 titled "High Precision Subsurface Imaging and Location Mapping with Time of Flight Measurement Systems," filed on Jun. 14, 2016, and U.S. patent Ser. No. 15/181,999 titled "High-Precision Time of Flight Measurement System for Industrial Automation," filed on Jun. 14, 2016, each of which is herein incorporated by reference in its entirety.

Conventional techniques for target localization have substantial drawbacks and are often inadequate for many (or most) of these applications and/or perform unsatisfactorily in all but very limited circumstances or controlled environments. In particular, conventional localization techniques suffer from one or more drawbacks that significantly limit their use and/or applicability, including insufficient accuracy, low signal-to-noise (SNR) ratio, relatively lengthy refresh rates, susceptibility to background clutter, high cost, large size, etc. As a result, conventional localization techniques generally have narrow and limited application. The inventors have developed localization techniques with broad applicability to a range of fields that are suitable for a wide variety of applications.

For many applications, high localization accuracy (resolution) is an important capability and is a limiting factor for many conventional localization techniques. The inventors have developed localization techniques with the ability to resolve the location of a target in the millimeter and sub-millimeter range, referred to herein generally as micro-localization. According to some embodiments, a micro-localization system comprises an interrogator configured to transmit a radio frequency (RF) signal (e.g., a microwave or millimeter wave RF signal) and a target configured to, in response to receiving the RF signal, transmit an RF signal to be received by the interrogator. The RF signal received from the target by the interrogator is used to determine the distance between the interrogator and the target.

FIG. 1A illustrates an exemplary micro-localization system 100, in accordance with some embodiments. Micro-localization system 100 comprises a plurality of interrogator devices 102, one or more of which are configured to transmit an RF signal 103 (e.g., RF signals 103*a*, 103*b*, 103*c*, etc.). System 100 also comprises one or more target devices 104 configured to receive RF signals 103 and, in response, transmit RF signals 105 (e.g., RF signals 105*a*, 105*b* and 105*c*, etc.). Interrogator devices 102 are configured to receive RF signals 105 that are then used to determine distances between respective interrogator and target devices. The computed distances may be used to determine the location of one or more target devices 104, a number of techniques of which are described in further detail below. It should be appreciated that while multiple target devices 104 are illustrated in FIG. 1A, a single target device may be utilized. More generally, it should be appreciated that any number of interrogator devices 102 and target devices 104 may be used, as the aspects of the technology described herein are not limited in this respect.

Micro-localization system 100 may also include a controller 106 configured to communicate with interrogator devices 102 and target devices 104 via communication channel 108, which may include a network, device-to-device communication channels, and/or any other suitable means of communication. Controller 106 may be configured to coordinate the transmission and/or reception of RF signals 103 and 105 between desired interrogator and target devices via communication channels 107*a*, 107*b* and 108, which may be a single communication channel or include multiple communication channels. Controller 106 may also be configured to determine the location of one or more target devices 104 from information received from interrogator devices 102. As discussed in further detail below, controller 106 may be implemented as a standalone controller or may be implemented in full or in part by one or more interrogator devices 102 and/or target devices 104. Different exemplary configurations and implementations for micro-localization system 100 are described in further detail below, but are not limited to the configurations discussed herein.

Resolving the location of a target with a high degree of accuracy depends in part on receiving the RF signals transmitted by the target with high fidelity and, in part, on the ability to distinguish the RF signals transmitted by a target device from RF signals transmitted by an interrogator device, background clutter, and/or noise. The inventors have developed techniques for improving the signal-to-noise ratio of the signals received by the interrogator and target devices to facilitate micro-localization of one or more target devices. As one example, the inventors recognized that by configuring the interrogator and target devices to transmit at different frequencies, localization performance could be improved. According to some embodiments, one or more interrogator devices transmit first RF signals (e.g., RF signals 103) having a first center frequency and, in response to receiving the first RF signals, one or more target devices transmit second RF signals (e.g., RF signals 105) having a second center frequency different from the first center frequency. In this manner, receive antennas on the one or more interrogator devices can be configured to respond to RF signals about the second center frequency, improving the ability of the interrogator devices to receive RF signals from target devices in cluttered and/or noisy environments.

The inventors further recognized that relatively simple and/or cost effective circuitry could be implemented at the target device to transform RF signals having a first center frequency received from an interrogator device to RF signals having a second center frequency different from the first center frequency for transmission. According to some embodiments, the second center frequency is harmonically related to the first center frequency. For example, in system 100 illustrated in FIG. 1A, a target device 104 may be configured to transform RF signals 103 and transmit RF signals 105 at a harmonic of the center frequency of the received RF signal 103. According to other embodiments, a target device transforms RF signals having a first center frequency received from an interrogator device to RF signals having second center frequency that is different from, but not harmonically related to the first center frequency. In other embodiments, a target device is configured to generate RF signals at a second center frequency different from the first center frequency, either harmonically or not harmonically related, rather than transforming RF signals received from an interrogator device. Exemplary techniques for transmitting RF signals, from interrogator and target devices, having different respective center frequencies are discussed in further detail below.

The inventors have further recognized that changing the polarization of RF signals transmitted by interrogator and target devices, respectively, may be used to improve SNR and allow interrogator devices to receive RF signals transmitted by target devices with improved fidelity, facilitating micro-localization even in cluttered and/or noisy environments. According to some embodiments, one or more interrogator devices are configured to transmit first RF signals circularly polarized in a first rotational direction (e.g., clockwise) and, in response to receiving the first RF signals, one or more target devices are configured to transmit second RF signals circularly polarized in a second rotational direction different from the first rotational direction (e.g., counter-clockwise). A target device may be configured to transform the polarization of received RF signals or may be configured to generate RF signals circularly polarized in the second rotation direction, as aspects of the technology described herein are not limited in this respect. Exemplary techniques for transmitting RF signals, from interrogator and target devices, circularly polarized in different respective rotational directions are discussed in further detail below.

Many conventional localization techniques achieve desired performance characteristics by using expensive electronic components, which are often large, relatively complex and/or consume relatively significant amounts of power. As a result, such conventional techniques do not provide a general-purpose localization solution capable of being employed in a wide range of applications. To address this drawback, the inventors have developed a chip-scale micro-localization system in which interrogator and target devices are fabricated as individual packaged or partially packaged devices capable of being integrated in virtually any system for use in a wide variety of applications. The inventors have developed designs for the components of a micro-localization system (e.g., interrogator and target devices) that allow for their fabrication on a silicon die and/or on or within the device package, facilitating the production of chip-scale components of a micro-localization system that can be inexpensively produced at large volume and integrated into virtually any system for which micro-localization is desired.

As discussed above, many conventional localization techniques suffer from low SNR and, as a result, are limited in the range in which the localization techniques can operate and/or may exhibit lengthy refresh times (e.g., the interval of time between successive computations of the location of a target) due, at least in part, to the need to repeatedly interrogate the target to build up enough signal to adequately determine the distance to the target. The inventors have developed techniques to improve SNR that substantially increase the range at which micro-localization can be performed (i.e., increase the distance between interrogator and target devices at which the system can micro-locate the target device). Referring again to the exemplary micro-localization system 100 illustrated in FIG. 1A, an interrogator device 102 may be configured to transmit first RF signals and receive second RF signals transmitted by one or more target devices in response. Accordingly, an interrogator device may comprise a transmit antenna for transmitting the first RF signals and a receive antenna for receiving second RF signals. Any RF signals generated for transmission by and/or transmitted by the interrogator's transmit antenna that are also detected by the interrogator's receive antenna interfere with the ability of the receive antenna to detect RF signals being transmitted by one or more target devices. For example, any portion of an RF signal generated by an interrogator for transmission that is picked up by the interrogator's receive antenna operates as noise that decreases the SNR (or as interference decreasing the SINR, which is the signal to interference plus noise ratio), effectively drowning out the RF signals being transmitted by a target device, and reduces the range at which the interrogator can determine the location of the target device.

To increase the SNR, the inventors have developed a number of techniques to reduce the amount and/or impact of signal detection by the receive antenna of RF signals generated by interrogator device for transmission by and/or transmitted by the transmit antenna (or by the transmit antenna of a proximately located interrogator or target devices). As discussed above, transmitting and receiving at different center frequencies facilitate signal differentiation, but also reduces interference between transmit and receive antennas. However, receive antennas remain susceptible to detection of transmitted signals, for example, harmonics that are transmitted from the transmit antenna. The inventors have further recognized that transmitting and receiving at different circular polarizations, as discussed above, further reduces interference between transmit and receive channels. The inventors have further recognized that differentially coupling a receive antenna and/or a transmit antenna to transmit/receive circuitry of the interrogator device reduces the amount of interference between the transmit and receive channels. Similar differential coupling can be implemented at the target device for the same purpose. The inventors have further appreciated that, for example, using chip-scale technology, the substrate of an interrogator or target device (e.g., one or more layers within or on the substrate of the device package) may include a frequency selective surface to reduce interference (e.g., to reduce harmonic coupling) between transmit and receive antennas and/or the substrate may be fabricated or treated with an absorbent coating that absorbs RF signals from the transmit antenna to reduce interference. One or any combination of these techniques may be used to reduce interference and increase SNR. According to some embodiments, techniques for increasing SNR described herein facilitate micro-localization at a distance of up to approximately 20-40 (e.g., 30) meters. The inventors have developed numerous techniques that provide for a robust and relatively inexpensive micro-localization system capable of being employed in a wide variety of applications. According to some embodiments, a micro-localization system using techniques described herein are capable of resolving the location of a target device with accuracy in the millimeter or sub-millimeter range in virtually any environment. In addition, using the techniques described herein, location of a target can be determined in milliseconds, a millisecond, or less, facilitating real-time tracking of targets that are rapidly moving. Techniques developed by the inventors, including chip-scale fabrication of micro-localization components, facilitate a general-purpose micro-localization system that can be manufactured at relatively low cost and high volume and that can be conveniently integrated in a variety of application level systems. These and other techniques are discussed in further detail below in connection exemplary micro-localization systems, in accordance with some embodiments.

It should be appreciated that the techniques introduced above and discussed in greater detail below may be implemented in any of numerous ways, as the techniques are not limited to any particular manner of implementation. Examples of details of implementation are provided herein solely for illustrative purposes. Furthermore, the techniques disclosed herein may be used individually or in any suitable combination, as aspects of the technology described herein are not limited to the use of any particular technique or combination of techniques.

Figure 1B:
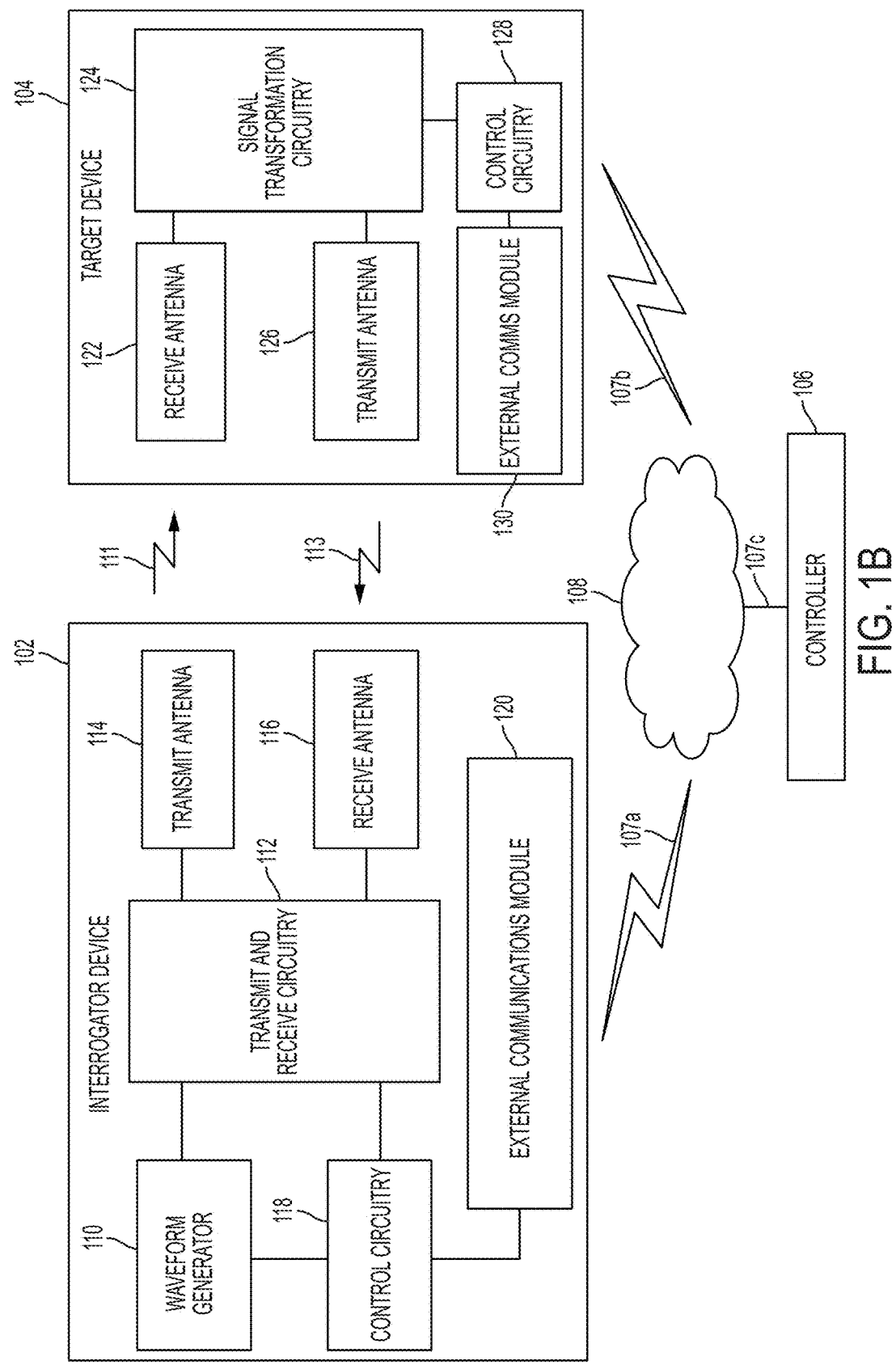
FIG. 1B shows illustrative components of an interrogator device and a target device, which are part of the illustrative system 100 shown in FIG. 1A, in accordance with some embodiments of the technology described herein.

FIG. 1B shows illustrative components of an illustrative interrogator device 102 and a illustrative target device 104, which are part of the illustrative system 100 shown in FIG. 1A, in accordance with some embodiments of the technology described herein. As shown in FIG. 1B, illustrative interrogator device 102 includes waveform generator 110, transmit and receive circuitry 112, transmit antenna 114, receive antenna 116, control circuitry 118, and external communications module 120. It should be appreciated that, in some embodiments, an interrogator device may include one or more other components in addition to or instead of the components illustrated in FIG. 1B. Similarly, in some embodiments, a target device may include one or more other components in addition to or instead of the components illustrated in FIG. 1B.

In some embodiments, waveform generator 110 may be configured to generate RF signals to be transmitted by the interrogator 102 using transmit antenna 114. Waveform generator 110 may be configured to generate any suitable type(s) of RF signals. In some embodiments, waveform generator 110 may be configured to generate frequency modulated RF signals, amplitude modulated RF signals, and/or phase modulated RF signals. Non-limiting examples of modulated RF signals, any one or more of which may be generated by waveform generator 110, include linear frequency modulated signals (also termed "chirps"), non-linearly frequency modulated signals, binary phase coded signals, signals modulated using one or more codes (e.g., Barker codes, bi-phase codes, minimum peak sidelobe codes, pseudo-noise (PN) sequence codes, quadri-phase codes, poly-phase codes, Costas codes, Welti codes, complementary (Golay) codes, Huffman codes, variants of Barker codes, Doppler-tolerant pulse compression signals, impulse waveforms, noise waveforms, and non-linear binary phase coded signals. Waveform generator 110 may be configured to generate continuous wave RF signals or pulsed RF signals. Waveform generator 110 may be configured to generate RF signals of any suitable duration (e.g., on the order of microseconds, milliseconds, or seconds).

In some embodiments, waveform generator 110 may be configured to generate microwave and/or millimeter wave RF signals. For example, waveform generator 110 may be configured to generate RF signals having a center frequency in a given range of microwave and/or millimeter frequencies (e.g., 4-6 GHz, 50-70 GHz). It should be appreciated that an RF signal having a particular center frequency is not limited to containing only that particular center frequency (the RF signal may have a non-zero bandwidth). For example, waveform generator 110 may be configured to generate a chirp having a center frequency of 60 GHz whose instantaneous frequency varies from a lower frequency (e.g., 59 GHz) to an upper frequency (e.g., 61 GHz). Thus, the generated chirp has a center frequency of 60 GHz and a bandwidth of 2 GHz and includes frequencies other than its center frequency.

In some embodiments, waveform generator 110 may be configured to generate RF signals using a phase locked loop. Such configurations are described herein including with reference to FIGS. 8B, 8C, 8D, 13A, 13B, and 13C. In some embodiments, the waveform generator may be triggered to generate an RF signal by control circuitry 118 and/or in any other suitable way.

In some embodiments, transmit and receive circuitry 112 may be configured to provide RF signals generated by waveform generator 110 to transmit antenna 114. Additionally, transmit and receive circuitry 112 may be configured to obtain and process RF signals received by receive antenna 116. In some embodiments, transmit and receive circuitry 112 may be configured to: (1) provide a first RF signal to the transmit antenna 114 for transmission to a target device (e.g., RF signal 111); (2) obtain a responsive second RF signal received by the receive antenna 116 (e.g., RF signal 113) and generated by the target device in response to the transmitted first RF signal; and (3) process the received second RF signal by mixing it (e.g., using a frequency mixer) with a transformed version of the first RF signal. Such processing and associated and other architectures of the transmit and receive circuitry 112 are described herein including with reference to FIGS. 8A-8D and 11A-11B. The transmit and receive circuitry 112 may be configured to provided processed RF signals to control circuitry 118, which may (with or without performing further processing the RF signals obtained from circuitry 112) provide the RF signals to external communications module 120.

In some embodiments, each of transmit antenna 114 and receive antenna 116 may be a patch antenna, a planar spiral antenna, an antenna comprising a first linearly polarized antenna and a second linearly polarized antenna orthogonally disposed to the first linearly polarized antenna, a MEMS antenna, a dipole antenna, or any other suitable type of antenna configured to transmit or receive RF signals. Each of transmit antenna 114 and receive antenna 116 may be directional or isotropic (omnidirectional). Transmit antenna 114 and receive antenna 116 may the same type or different types of antennas.

In some embodiments, transmit antenna 114 may be configured to radiate RF signals circularly polarized in one rotational direction (e.g., clockwise) and the receive antenna 116 may be configured to receive RF signals circularly polarized in another rotational direction (e.g., counter-clockwise). In some embodiments, transmit antenna 114 may be configured to radiate RF signals having a first center frequency (e.g., RF signal 111 transmitted to target device 104) and the receive antenna may be configured to receive RF signals having a second center frequency different from (e.g., a harmonic of) the first center frequency (e.g., RF signal 113 received from target device 104 and generated by target device 104 in response to receiving the RF signal 111).

In some embodiments, transmit antenna 114 and receive antenna 116 are physically separate antennas. In other embodiments, however, the interrogator 102 may include a dual mode antenna configured to operate as a transmit antenna in one mode and as a receive antenna in another mode.

In some embodiments, control circuitry 118 may be configured to trigger the waveform generator 110 to generate an RF signal for transmission by the transmit antenna 114. The control circuitry 118 may trigger the waveform generator in response to a command to do so received by external communications interface 120 and/or based on logic part of control circuitry 118.

In some embodiments, control circuitry 118 may be configured to receive RF signals from transmit and receive circuitry 112 and forward the received RF signals to external communications interface 120 for sending to controller 106. In some embodiments, control circuitry 118 may be configured to process the RF signals received from transmit and receive circuitry 112 and forward the processed RF signals to external communications interface 120. Control circuitry 118 may perform any of numerous types of processing on the received RF signals including, but not limited to, converting the received RF signals to from analog to digital (e.g., by sampling using an ADC), performing a Fourier transform to obtain a time-domain waveform, estimating a time of flight between the interrogator and the target device from the time-domain waveform, and determining an estimate of distance between the interrogator 102 and the target device that the interrogator 102 interrogated. The control circuitry 118 may be implemented in any suitable way and, for example, may be implemented as an application specific integrated circuit (ASIC), a field programmable gate array (FPGA), a combination of logic circuits, a microcontroller, or a microprocessor.

External communications module 120 may be of any suitable type and may be configured to communicate according to any suitable wireless protocol(s) including, for example, a Bluetooth communication protocol, an IEEE 802.15.4-based communication protocol (e.g., a "ZigBee" protocol), and/or an IEEE 802.11-based communication protocol (e.g., a "WiFi" protocol).

As shown in FIG. 1B, target device 104 includes receive antenna 122, signal transformation circuitry 124, transmit antenna 126, control circuitry 128, and external communications module 130.

In some embodiments, each of receive antenna 122 and transmit antenna 126 may be a patch antenna, a planar spiral antenna, an antenna comprising a first linearly polarized antenna and a second linearly polarized antenna orthogonally disposed to the first linearly polarized antenna, a MEMS antenna, a dipole antenna, or any other suitable type of antenna configured to receive or transmit RF signals. Each of receive antenna 122 and transmit antenna 126 may be directional or isotropic. Receive antenna 122 and transmit antenna 126 may the same type or different types of antennas. In some embodiments, receive antenna 122 and transmit antenna 126 may be separate antennas. In other embodiments, a target device may include a dual mode antenna operating as a receive antenna in one mode and as a transmit antenna the other mode.

In some embodiments, receive antenna 122 may be configured to receive RF signals circularly polarized in one rotational direction (e.g., clockwise) and the transmit antenna 126 may be configured to transmit RF signals circularly polarized in another rotational direction (e.g., counter-clockwise).

In some embodiments, receive antenna 122 may be configured to receive RF signals having a first center frequency. The received RF signals may be transformed by signal transformation circuitry 124 to obtained transformed RF signals having a second center frequency different from (e.g., a harmonic of) the first center frequency. Such processing and associated and other architectures of the signal transformation circuitry 124 are described herein including with reference to FIGS. 9A-9H, 10, 11A-B, and 12A-B. The transformed RF signals having the second center frequency may be transmitted by transmit antenna 126.

In some embodiments, each of the transmit and/or the receive antennas on an interrogator may be directional antennas. This may be useful in applications where some information is known about the region of space in which the target device is located (e.g., the target device is located in front of the interrogator, to the front left of the interrogator, etc.). Even if the target device is attached to a moving object (e.g., an arm of an industrial robot, a game controller), the movement of the target device may be constrained so that the target device is always within a certain region of space relative to the interrogator so that using directional antennas to focus on that region of space increases the sensitivity of the interrogator to signals generated by the target device. In turn, this increases the distance between the interrogator and target device at which the micro-localization system may operate with high accuracy. However, it should be appreciated that in some embodiments, the antennas on an interrogator may be isotropic (omnidirectional), as aspects of the technology describe herein are not limited in this respect.

In some embodiments, each of the transmit and/or the receive antennas on the target device may be isotropic so that the target device may be configured to receive signals from and/or provide RF signals to an interrogator located in any location relative to the target device. This is advantageous because, in some applications of micro-localization, the target device may be moving and its relative orientation to one or more interrogators may not be known in advance. However, in some embodiments, the antennas on a target device may be directional (anisotropic), as aspects of the technology describe herein are not limited in this respect.

In some embodiments, control circuitry 128 may be configured to turn the target device 104 on or off (e.g., by powering off one or more components in signal transformation circuitry 124) in response to a command to do so received via external communications interface 130. The control circuitry 128 may be implemented in any suitable way and, for example, may be implemented as an application specific integrated circuit (ASIC), a field programmable gate array (FPGA), a combination of logic circuits, a microcontroller, or a microprocessor. External communications module 130 may be of any suitable type including any of the types described herein with reference to external communications module 120.

As discussed above with reference to FIG. 1A, multiple interrogator devices may be utilized in order to determine a location of a target device. In some embodiments, each of the interrogator devices may be configured to transmit an RF signal to a target device, receive a responsive RF signal from the target device (the responsive signal may have a different polarization and/or a different center frequency from the signal that was transmitted), and process the transmitted RF signal together with the received RF signal to obtain an RF signal indicative of the distance between the interrogator device and the target device. The RF signals indicative of the distances between the interrogator devices and the target device may be processed (e.g., by the interrogators or another processor) to obtain estimates of the distances between the target device and each of the interrogators. In turn, the estimated distances may be used to determine the location of the target device in 3D space.

Figure 15:
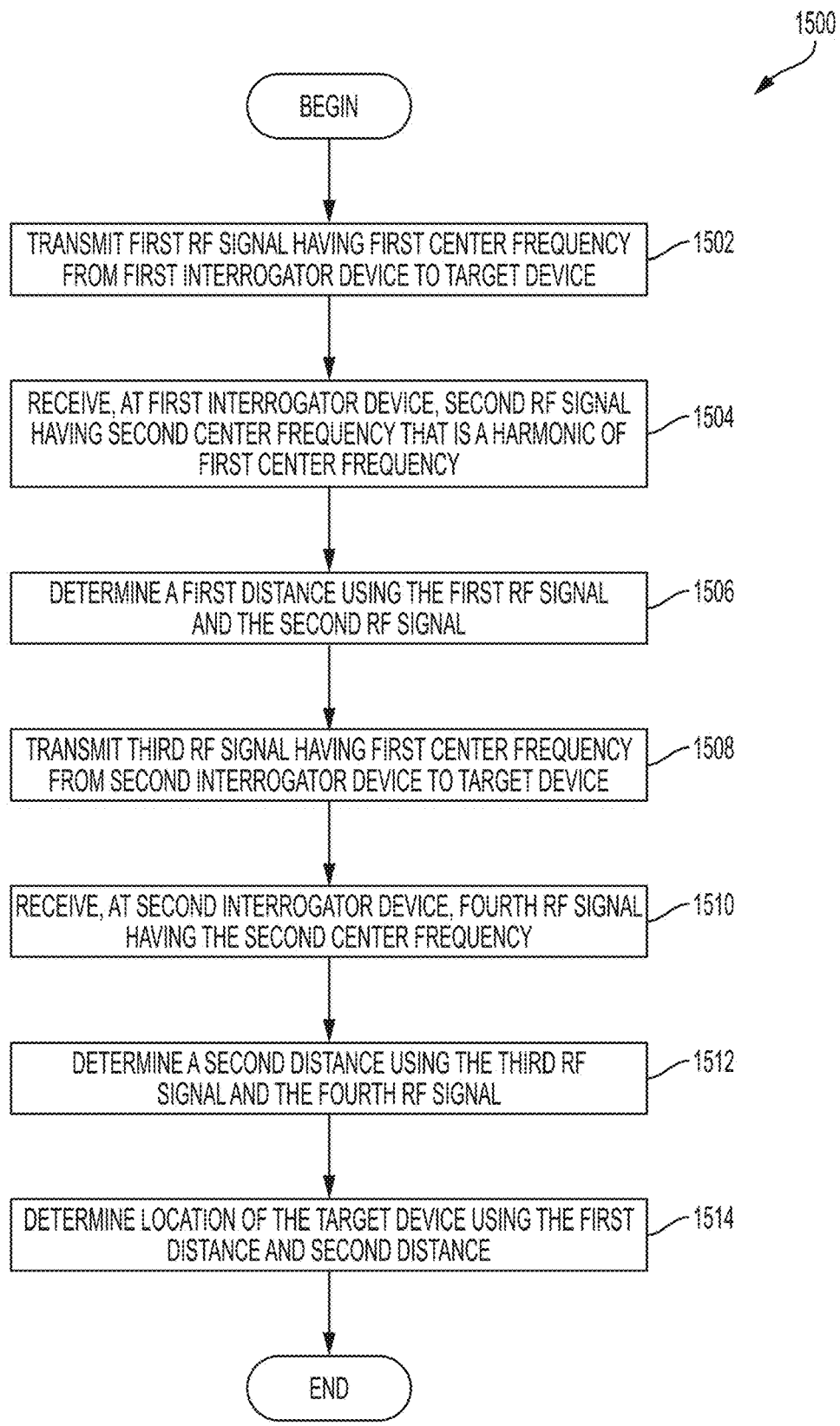
FIG. 15 is a flowchart of an illustrative process for determining the location of a target device using measurements made by at least two interrogator devices, in accordance with some embodiments of the technology described herein.

FIG. 15 is a flowchart of an illustrative process 1500 for determining the location of a target device using measurements made by at least two interrogator devices, in accordance with some embodiments of the technology described herein. Process 1500 may be executed by any suitable localization system described herein including, for example, system 100 described with reference to FIG. 1A or system 200 described with reference to FIG. 2.

Process 1502 begins at act 1502, where a first interrogator device transmits a first RF signal having a first center frequency to a target device. For example, an interrogator device 102 of system 100 may send RF signal 103a to target device 104. The RF signal may be of any suitable type and, for example, may be a linear frequency modulated RF signal or any other suitable type of RF signal including any of the types of signals described herein. The first RF signal transmitted at act 1502 may have any suitable center frequency. For example, the center frequency may be any frequency in the range of 50-70 GHz (e.g., 60 GHz) or any frequency in the range of 4-6 GHz (e.g., 5 GHz). The first RF signal transmitted at act 1502 may be circularly polarized in the clockwise or counterclockwise direction. Circular polarization is described further herein including with reference to FIGS. 4A and 4B.

At act 1504, the first interrogator device that, at act 1502, transmitted an RF signal to a target device, may receive a responsive second RF signal from the target device. For example, the interrogator device 102 of system 100 may receive second RF signal 105a from target device 104. The responsive second RF signal may be a transformed version of the transmitted first RF signal. The target device may generate the responsive RF signal by receiving and transforming the transmitted RF signal according to any of the techniques described herein.

In some embodiments, the frequency content of the responsive second RF signal received at act 1504 may be different from that of the transmitted RF signal transmitted at act 1502. For example, when the transmitted RF signal has a first center frequency, the responsive RF signal may have a second center frequency different from the first center frequency. For example, the second center frequency may be a harmonic of the first center frequency (e.g., the second center frequency may be an integer multiple of, such as twice as, the first center frequency). As one example, if the center frequency of the transmitted first RF signal were 60 GHz, then the center frequency of the responsive second RF signal may be 120 GHz, 180 GHz, or 240 GHz. In some embodiments, the polarization of the responsive second RF signal may be different from the polarization of the transmitted first RF signal. For example, when the transmitted first RF signal is circularly polarized in a clockwise direction, the received second RF signal may be circularly polarized in a counter-clockwise direction. Alternatively, when the transmitted first RF signal is circularly polarized in a counter-clockwise direction, the received second RF signal may be circularly polarized in a clockwise direction.

At act 1506, an estimate of the distance between the first interrogator and the target device may be determined by using the first RF signal transmitted at act 1502 and the second RF signal received at act 1504. This may be done in any suitable way. For example, in some embodiments, the first and second RF signals may be mixed (e.g., using a frequency mixer onboard the first interrogator device) to obtain a mixed RF signal. The mixed RF signal may be indicative of the time of flight and, consequently, the distance between the first interrogator and the target device. The mixed RF signal may be sampled (e.g., using an ADC) and a Fourier transform (e.g., an inverse discrete Fourier transform) may be applied to the samples to obtain a time-domain waveform. The time-domain waveform may be processed to identify the time of flight of an RF signal between the first interrogator and the target device. In some embodiments, the time-domain waveform may be processed to identify the time of flight by identifying a first time when a responsive RF signal generated by the target device is detected by the interrogator. This may be done in any suitable way. For example, the time-domain waveform may include multiple separated "peaks" (e.g., multiple Gaussian-like bumps each having a respective peak above the noise floor) and the location of the first such peak may indicate the first time when the responsive RF signal generated by the target is detected by the interrogator. This first time represents an estimate of the time of flight between the interrogator and target device. In turn, the estimate of the time of flight between the interrogator and the target device may be converted to an estimate of the distance between the interrogator and the target device.

Accordingly, in some embodiments: (1) an interrogator may transmit an RF signal to a target device and receive, from the target device, a responsive RF signal; (2) a version of the transmitted RF signal may be mixed with the received RF signal to obtain a mixed RF signal; (3) the mixed RF signal may be sampled using an ADC to obtain a sampled signal; (4) the sampled signal may be transformed by an inverse discrete Fourier transform to obtain a time-domain waveform[1]; (5) the time-domain waveform may be processed to identify the time of flight between the interrogator and the target device; and (6) the time of flight may be converted to an estimate of the distance between the interrogator and the target device.

[1] The steps of mixing a received RF signal with a version of the transmitted RF signal and subsequently applying a Fourier transform constitute steps of pulse compression processing. Thus, the device(s) performing these steps may be said to perform pulse compression.

It should be appreciated that while all of these acts 1-6 may be performed on a single device (e.g., the interrogator), this is not a limitation of aspects of the technology described herein. For example, in some embodiments, an interrogator may not include an ADC, and steps 3-6 may be performed by one or more devices external to an interrogator. Even in embodiments where the interrogator includes an ADC, the acts 4-6 may be performed by one or more device (e.g., a processor) external to the interrogator.

At act 1508, where a second interrogator device (different from the first interrogator device) transmits a third RF signal having the first center frequency to the target device (the same target device to which the first RF signal was transmitted and from which the second RF signal was received). The third RF signal may be of any suitable type and, for example, may be a linear frequency modulated RF signal or any other suitable type of RF signal including any of the types of signals described herein. The third RF signal may have the same center frequency as the first RF signal and may be circularly polarized in the same direction as the first RF signal.

At act 1510, the second interrogator device that, at act 1508, transmitted the third RF signal to the target device, may receive a responsive fourth RF signal from the target device. The responsive fourth RF signal may be a transformed version of the transmitted third RF signal. The target device may generate the responsive fourth RF signal by receiving and transforming the transmitted third RF signal according to any of the techniques described herein. In some embodiments, the frequency content of the responsive fourth RF signal received at act 1510 may be different from that of the transmitted third RF signal transmitted at act 1508. For example, when the transmitted third RF signal has a first center frequency (e.g., the same center frequency as the first RF signal), the responsive fourth RF signal may have a second center frequency that is different from and is a harmonic of the first center frequency (e.g., the same center frequency as the second RF signal). In some embodiments, the polarization of the responsive RF fourth signal may be different from the polarization of the transmitted third RF signal. For example, when the third transmitted RF signal is circularly polarized in a clockwise direction, the received fourth RF signal may be circularly polarized in a counter-clockwise direction.

At act 1512, an estimate of the distance between the second interrogator and the target device may be determined by using the third RF signal transmitted at act 1508 and the fourth RF signal received at act 1510. This may be done in any suitable way including in any of the ways described above with reference to act 1506.

At act 1514, the location of the target device may be determined using the distance between the first interrogator and the target device obtained at act 1506, the distance between the second interrogator and the target device obtained at act 1512, and known locations of the first and second interrogators. This determination may be made in any suitable way and, for example, may be made using any of numerous types of geometric methods, least-squares methods, and/or in any of the ways described in U.S. patent application Ser. No. 15/181,930 titled "High-Precision Time of Flight Measurement Systems," filed on Jun. 14, 2016, U.S. patent application Ser. No. 15/181,956 titled "High Precision Motion Tracking with Time of Flight Measurement Systems," filed on Jun. 14, 2016, U.S. patent application Ser. No. 15/181,978 titled "High Precision Subsurface Imaging and Location Mapping with Time of Flight Measurement Systems," filed on Jun. 14, 2016, and U.S. patent Ser. No. 15/181,999 titled "High-Precision Time of Flight Measurement System for Industrial Automation," filed on Jun. 14, 2016, each of which is herein incorporated by reference in its entirety.

It should be appreciated that process 1500 is illustrative and that there are variations. For example, in some embodiments, more than two interrogators may be used to interrogate a single target device. In such embodiments, estimates of distances between the target device and each of the three or more interrogators may be used to obtain the 2D location of the target devices (e.g. to specify a 2D plane containing the 3D target devices). When distances between at least three interrogator devices and a target device are available, then the 3D location of the target device may be determined.

Figure 2:
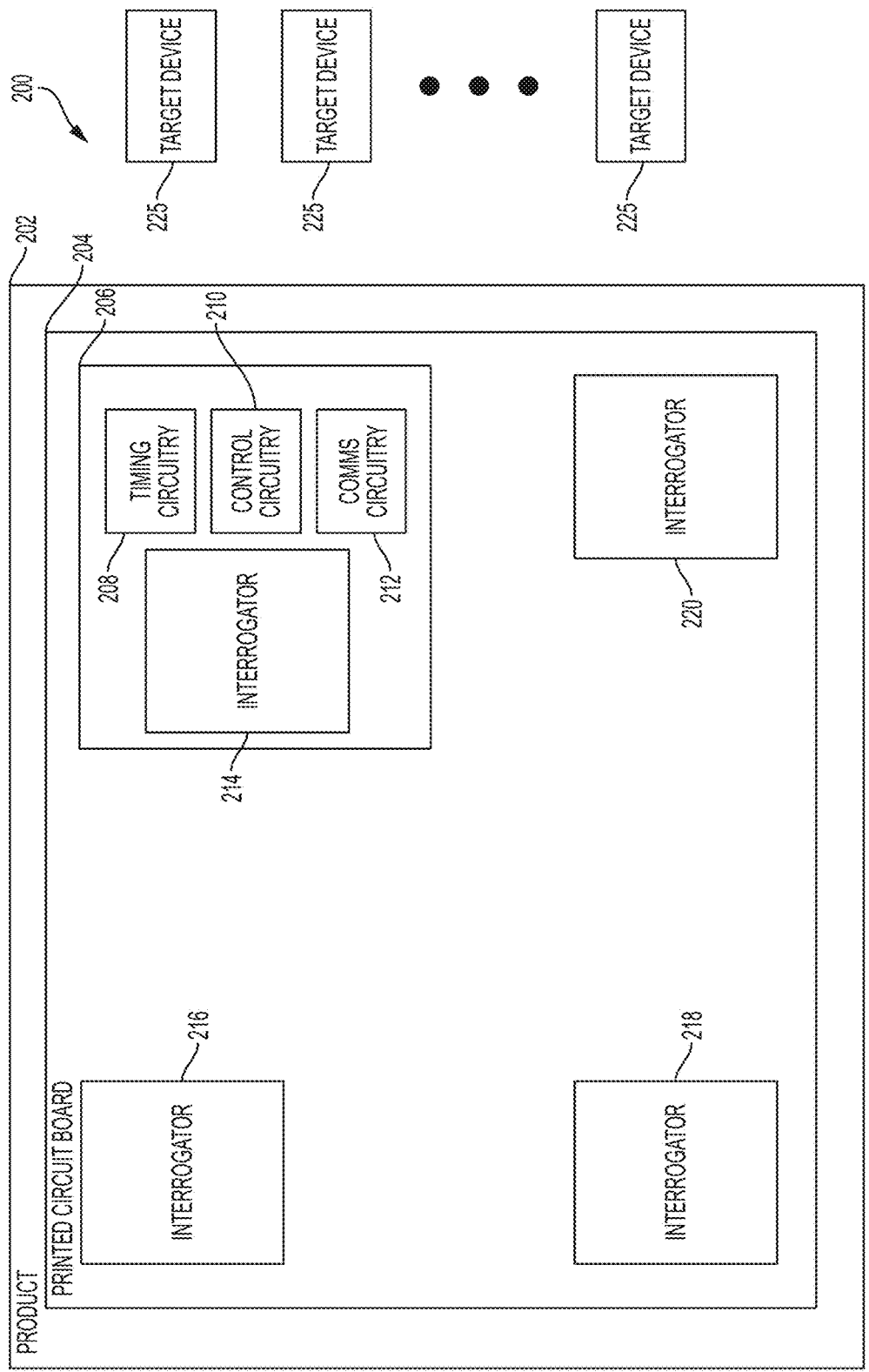
FIG. 2 shows another illustrative system that may be used to implement RF localization techniques, in accordance with some embodiments of the technology described herein.

FIG. 2 shows an illustrative system 200 that may be used to implement RF localization techniques, in accordance with some embodiments of the technology described herein. The illustrative system 200 comprises a plurality of interrogators, which are part of a product 202. The interrogators may be used to obtain estimates of distance to one or more of the target devices 225. In turn, these distance estimates (e.g., together with the known locations of the interrogators on PCB 204 relative to one another) may be used to estimate the location(s) of the target device(s) 225.

As shown in FIG. 2, product 202 comprises a printed circuit board 204. Master interrogator module 206 having interrogator 214 is disposed on PCB 204 along with interrogators 216, 218, and 220, which may be called "slave" interrogators. Master interrogator module 206 further comprises timing circuitry 208, control circuitry 210, and communications circuitry 212.

The product 202 may be any product (e.g., any consumer or commercial product) having a circuit board onto which one or multiple interrogator devices may be mounted. The circuit board may be rigid or flexible. For example, the product 202 may be a computer (e.g., a desktop, a laptop, a tablet, a personal digital assistant, etc.) and the PCB 204 may be a motherboard in the computer. As another example, product 202 may be a smartphone and the PCB 204 may be a rigid board or a flex circuit within the smartphone. As another example, product 202 may be a camera (e.g., video camera, a camera for taking still shots, a digital camera, etc.) and the PCB 204 may be a circuit board within the camera. As another example, the product 202 may be a gaming system and the PCB 204 may be a circuit board within the gaming system. As another example, the PCB 204 may comprise a flexible circuit ribbon having one or more interrogators disposed thereon, which ribbon may be within product 202, affixed to the side of product 202 (e.g., on the side of a gaming system), or affixed near the product 202 (e.g., affixed on a wall in a room containing the product).

Although there are four interrogators shown as part of product 202, in other embodiments, any other suitable number of interrogators may be used (e.g., one, two, three, five, six, seven, eight, nine, ten, etc.), as aspects of the technology described herein are not limited in this respect. Each of interrogators 214, 216, 218, and 220 may be of any suitable type described herein. In some embodiments, the interrogators 214, 216, 218, and 220 may be the same type of interrogator. In other embodiments, at least two of these interrogators may be of different types. For example, in some embodiments, the interrogator 214 may be configured to transmit RF signals to a target device 225 and receive RF signals from the target device, whereas the interrogators 216, 218, and 220 may be receive-only interrogators configured to receive RF signals from the target device 225, but which are not capable of transmitting RF signals to target device 225 (e.g., because these interrogators may not include transmit circuitry for generating RF signals for transmission by a transmit antenna and/or the transmission antenna). It should also be appreciated that each of target devices 225 may be of any suitable type(s) described herein, as aspects of the technology described herein are not limited in this respect.

In some embodiments, the master interrogator module 206 module may be configured to manage operation of the interrogators 214, 216, 218, and 220, and/or of target device(s) 225. Module 206 may be configured to manage each of interrogators 214, 216, 218, and 220 by controlling (e.g., via wires on product PCB 204 and/or wirelessly) when each of these interrogators is to transmit RF signals to one or more of target devices 225 and receive RF signals from the target device(s) 225. Additionally, module 206 may be configured to control (e.g., using one or more wireless links maintained by communications circuitry 212) which of the target devices 225 are on and which of the target devices 225 are off. In this way, the master interrogator module 206 may select particular target device(s) 225 to be interrogated, determine when the particular target device(s) 225 are to be interrogated, and/or determine which of the interrogators onboard PCB 204 are to be used for interrogating the target device(s) 225.

In some embodiments, the master interrogator module 206 may control the interrogators 214, 216, 218 and 220 to operate according to a schedule specifying an order for operating the interrogators in a one-at-a-time manner. For example, the master interrogator module 206 may control the interrogators to operate in accordance with a round-robin schedule, whereby the master interrogator controls each of the interrogators onboard PCB 204 to transmit an RF signal to a target device (or multiple target devices) and receive responsive RF signals waveform in a one-at-a-time manner. As one example, master interrogator module 206 may: (1) wirelessly communicate with a specific target device 225 to turn it on; (2) trigger interrogator 214 to transmit an RF signal (e.g., a linear frequency modulated chirp) to the specific target device and receive a responsive RF signal from the specific target device; (3) after interrogator 214 completes transmitting, trigger interrogator 216 to transmit an RF signal to the specific target device and receive a responsive RF signal from the specific target device; (4) after interrogator 216 completes transmitting, trigger interrogator 218 to transmit an RF signal to the specific target device and receive a responsive RF signal from the specific target device; and (5) after interrogator 218 completes transmitting, trigger interrogator 220 to transmit an RF signal to the target device and receive a responsive RF signal from the target device. When operating according to a round-robin schedule, if each of the interrogators transmits a 1 ms chirp, then it takes 4 ms to collect data by using all four interrogators.

In some embodiments, the master interrogator module 206 may control the interrogators 214, 216, 218, and 220 to operate according to a staggered trigger schedule. When operated in this manner, the interrogators don't start transmitting simultaneously because the transmission start times are staggered. However, the interrogators do transmit concurrently rather than in a one-at-a-time manner as is the case with a round-robin schedule. As one example, master interrogator module 206 may: (1) wirelessly communicate with a specific target device 225 to turn it on; (2) trigger interrogator 214 to transmit an RF signal (e.g., a linear frequency modulated chirp) to the specific target device and receive a responsive RF signal from the specific target device; (3) after interrogator 214 has started and before it has completed transmitting, trigger interrogator 216 to transmit an RF signal to the specific target device and receive a responsive RF signal from the specific target device; (4) after interrogator 216 has started and before it has completes transmitting, trigger interrogator 218 to transmit an RF signal to the specific target device and receive a responsive RF signal from the specific target device; and (5) after interrogator 218 has started and before it completes transmitting, trigger interrogator 220 to transmit an RF signal to the target device and receive a responsive RF signal from the target device. For example, when each interrogator transmits a 1 ms chirp and the transmission start times are staggered by 10 µs (or e.g., any other value in the range of 1-200 µs), all four interrogators complete their respective transmissions after 1.04 ms, which is substantially faster than the 4 ms needed for transmission in a round-robin implementation.

In some embodiments, only one of the interrogators (e.g., the interrogator 214 on module 206) may interrogate a target device by transmitting RF signals to the target device, while all the interrogator devices (including the transmitting interrogator) may "listen" by receiving RF signals generated by the target device in response to receiving RF signals from the transmitting interrogator. So that each of the interrogators may correlate the RF signals received from the target device with the RF signal transmitted by the transmitting interrogator, the master interrogator module 206 may control the interrogators 214, 216, 218, and 220 to operate in a phase coherent manner. In some embodiments, phase coherence among the interrogators may be achieved by providing each of the interrogators with a common reference signal (e.g., a clock, a fixed-frequency signal generated by a reference oscillator, or a direct digitally synthesized reference signal). Aspects of operating multiple interrogators in a phase-coherent manner are further described herein including with reference to FIGS. 14A-D and 17. Phase coherent operation of multiple transmitters may result in the fastest time for obtaining measurements (as compared to the round robin or staggered start schemes described above). For example, when the transmitting interrogator transmits a 1 ms chirp, all four interrogators may receive the responsive RF signals within 1 ms.

In some embodiments, the timing circuitry 208 may be configured to provide a clock reference for one or more components of system 200. For example, the timing circuitry 208 may be configured to provide a clock reference to control circuitry 210 (which, as described below, may be a microprocessor). As another example, the timing circuitry 208 may be configured to provide a clock reference to interrogator 214 (e.g., to a phased lock loop part of interrogator 214). In some embodiments, the timing circuitry 208 may comprise a crystal oscillator (e.g., a temperature-controlled crystal oscillator).

In some embodiments, the control circuitry 210 may be configured to manage operation of the interrogators 214, 216, 218, and 220 in accordance with any of the schemes described herein. For example, the control circuitry 210 may be configured to manage the interrogators 214, 216, 218, and 220 to operate in accordance with a round-robin schedule, a staggered start schedule, or in a phase coherent manner. In embodiments where the interrogators are operated phase coherently with one another, the control circuitry 210 may be configured to generate a common reference signal (e.g., a clock, a fixed-frequency signal generated by a reference oscillator, or a direct digitally synthesized reference signal), which common reference signal may then be provided to the interrogator via one or more wires on the PCB 204. Additionally, the control circuitry 210 may be configured to control, using communications circuitry 212, the target device(s) 225 (e.g., by controlling which target devices are on or off at particular times).

In some embodiments, each of the interrogators onboard PCB 204 may obtain respective information indicative of the distance between the interrogator and a target device, and provide it to control circuitry 210 for processing in furtherance of determining a location of the target device. Non-limiting examples of such information, that may be obtained by an interrogator, include an analog mixed RF signal (obtained by mixing a version an RF signal used to interrogate the target device with a responsive RF signal transmitted by the target device), a sampled version of the analog mixed RF signal, a time-domain waveform obtained by applying a transform (e.g., an inverse discrete Fourier transform) to the sampled version of the analog mixed signal, an estimate of the time of flight between the interrogator and the target device (e.g., obtained from the time-domain waveform), or an estimate of the distance between the interrogator and the target device. Control circuitry 210 may obtain such information from each of the interrogators and process the obtained information in order to: (1) obtain estimates of distance between each of the interrogators and the target device (to the extent that such estimates are not already provided by the individual interrogators themselves); and (2) determine the target device's location (e.g., the location in 3D coordinates) based on the distance estimates.

The control circuitry 210 may obtain any of the above-described information from the interrogators onboard PCB 204 in any suitable way. For example, in some embodiments, information may be transmitted across the PCB 204 using a low-bandwidth analog signal (e.g., using a single-ended analog line, a shielded line, or a different line pair). As another example, in some embodiments, information may be transmitted across the PCB 204 using digital lines (e.g., when the interrogators have built-in analog-to-digital converters). In some embodiments, each of the interrogators may include double-buffered random access memory (RAM). The double buffered RAM on an interrogator may be read out (to provide data to the control circuitry 210), while the interrogator is acquiring its next waveform. As such, using double-buffered RAM would enable the system 200 to operate at a high rate. The control circuitry 210 may be implemented in any suitable way and, for example, may be implemented as an application specific integrated circuit (ASIC), a field programmable gate array (FPGA), a combination of logic circuits, a microcontroller, or a microprocessor.

In some embodiments, some of the processing performed by control circuitry 210 may instead be performed on another processor onboard PCB 204. For example, the product 202 may include a microprocessor (e.g., a smartphone, a game system, a laptop may each include a microprocessor) and this microprocessor may be used to perform some processing in furtherance of determining the location of a target device instead of having that same processing be performed by the control circuitry 210. For example, in some embodiments, a microprocessor onboard product 202 may process distances between a target device 225 and each of the interrogators 214, 216, 218, and 220 to obtain an estimate of the location of the target device 225. Though it should be appreciated that the microprocessor onboard product 202 may be configured to perform any other processing in furtherance of determining the location of the target device, as aspects of the technology described herein are not limited in this respect.

As discussed above, the inventors have recognized that harmonic coupling between the transmit antenna and the receive antenna on an interrogator device may degrade its performance. In some embodiments, for example, an interrogator may be configured to transmit, to a target device, RF signals having a first center frequency, and receive, from the target device, RF signals having a second center frequency that is a harmonic of the first center frequency. While generating RF signals having a first center frequency, the interrogator may also generate nuisance RF signals having the second center frequency, for example, because of non-linear circuitry components in the signal generation and transmission chain (e.g., amplifiers, frequency multipliers, etc.). These nuisance RF signals may be detected by the interrogator's receive antenna (when this occurs the transmit and receive antennas may be said to be harmonically coupled) and interfere with the ability of the interrogator's receive antenna to detect RF signals transmitted by the target device. As a result, the interrogator may not be able to detect RF signals emitted by the target device unless the target device is physically close to the interrogator (e.g., within 3 meters or less). Consequently, reducing harmonic coupling may facilitate detecting RF signals from a target device at greater distances (e.g., 20-40 meters). Reducing harmonic coupling on the transmit and receive antennas of a target device may also improve the performance of the overall system.

Figure 3:
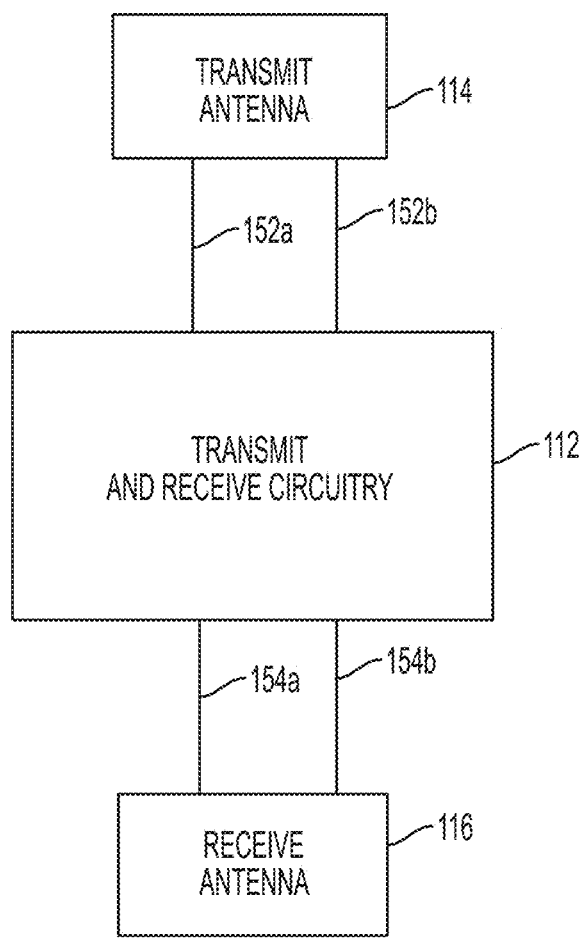
FIG. 3 is a block diagram illustrating components of an interrogator device, in accordance with some embodiments of the technology described herein.

One of the techniques, developed by the inventors, for reducing harmonic coupling between the transmit antenna and the receive antenna on an interrogator device includes differentially feeding one or both of the transmit and receive antennas to differential transmit and/or receive circuitry on the interrogator device. For example, FIG. 3 shows an illustrative embodiment of interrogator device 102, in which transmit antenna 114 is differentially coupled to transmit and receive circuitry 112 via transmission lines 152a and 152b. Additionally, receive antenna 116 is differentially coupled to transmit and receive circuitry 112 via transmission lines 154a and 154b. Although in the embodiment of FIG. 3, both antennas are differentially coupled to the transmit and receive circuitry 112, in other embodiments, only one of the two antennas (either the transmit or the receive antenna) may be coupled to the transmit and receive circuitry. Similarly, in embodiments where a target device has a transmit and a receive antenna, one or both of the transmit and the receive antennas may be differentially coupled to the circuitry on the target device.

In some embodiments, the interrogator's receive antenna may be configured to receive RF signals having a center frequency that is at an even-order harmonic of the center frequency of the RF signals transmitted by the interrogator's transmit (e.g., twice the center frequency of the transmitted RF signals, four times the center frequency of the transmitted RF signals, etc.). The inventors have recognized that using differential transmission lines from the receive antenna to feed differential receive circuitry will also attenuate any common mode interference from the transmitter. The inventors have also recognized that providing RF signals to the transmit antenna (e.g., antenna 112) using differential amplifiers in concert with differential transmission lines (e.g., lines 152a and 152b) will cause the even-order harmonics present in the RF signals to cancel, thereby reducing or eliminating the detection by the interrogator's receive antenna (e.g., antenna 114) of RF signals generated on the interrogator and having frequencies at the even-order harmonics. This reduction in interference increases the distance at which the interrogator's receive antenna can detect RF signals transmitted by a target device.

As an illustrative example, in some embodiments, the transmit antenna 114 may be configured to transmit RF signals having a center frequency at 61.25 GHz and the receive antenna 116 may be configured to receive RF signals having a center frequency of 122.5 GHz. By differentially signaling the transmit antenna 114 (i.e., by providing RF signals from transmit and receive circuitry 112 to transmit antenna 114 via differential transmission lines 152a and 152b), the amount of RF signals generated by the interrogator and having a center frequency of 122.5 GHz may be reduced or eliminated, thereby reducing or eliminating the detection of such signals by the receive antenna 116.

Additionally, differentially signaling the transmit antenna 114 and/or the receive antenna 116 reduces the sensitivity of the antenna(s) to external noise sources and/or common-mode signals, which may cancel out at least partially or fully, when differential transmission lines are used. Accordingly, in some embodiments, at least one (e.g., all) antennas on an interrogator may be differentially coupled to other circuitry (e.g., circuitry integrated with semiconductor die, which is mounted) on the interrogator. Similarly, in some embodiments, at least one (e.g., all) antennas on a target device may be differentially coupled to circuitry (e.g., circuitry integrated with semiconductor die, which is mounted) on the target device.

Another technique developed by the inventors for reducing the amount of harmonic coupling between the transmit and receive antennas involves using transmit and receive antennas that are polarized differently from one another. In addition to decreasing harmonic coupling, the manner in which the transmit and/or receive antennas are polarized may be used to effect of background clutter on the received RF signals. Accordingly, in some embodiments, an interrogator's transmit antenna may be configured to transmit RF signals having a first type of polarization and its receive antenna may be configured to receive RF signals having a second type of polarization that is different from the first type of polarization. In such embodiments, a target device may include a receive antenna configured to receive, from the interrogator, RF signals having the first type of polarization and a transmit antenna configured to transmit RF signals having the second type of polarization.

For example, in some embodiments, the transmit antenna on an interrogator may be configured to transmit, to a target device, RF signals circularly polarized in a first rotational direction and the receive antenna on the interrogator may be configured to receive, from the target device, RF signals circularly polarized in a second rotational direction different from the first rotational direction. Complementarily, the receive antenna on the target device may be configured to receive, from the interrogator, RF signals circularly polarized in the first rotational direction, and the transmit antenna on the target device may be configured to transmit RF signals circularly polarized in the second rotational direction.

Figure 4A:
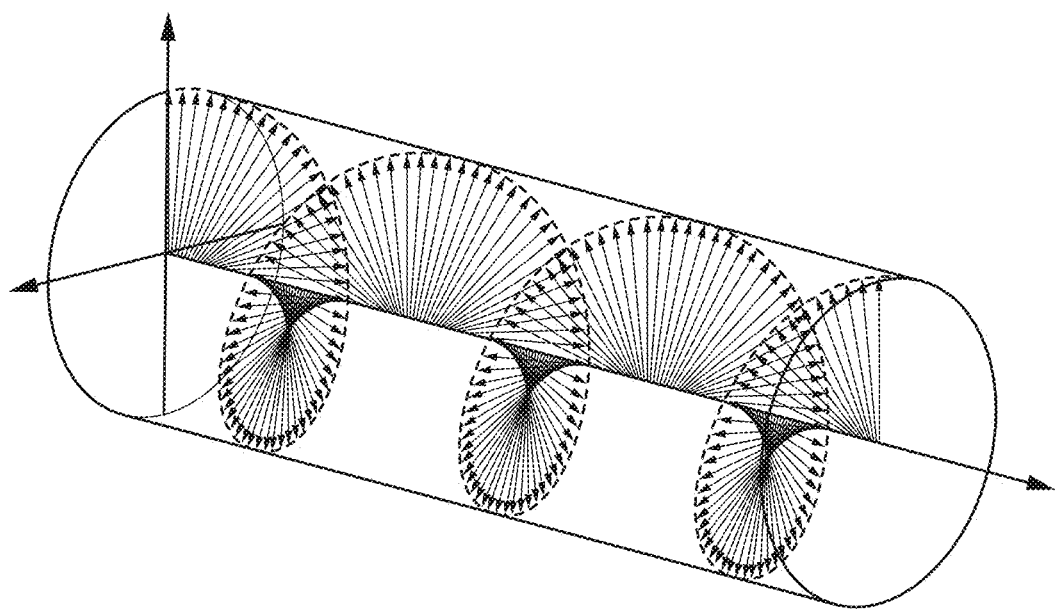
FIGS. 4A and 4B illustrate left- and right-handed circular polarization, respectively.
Figure 4B:
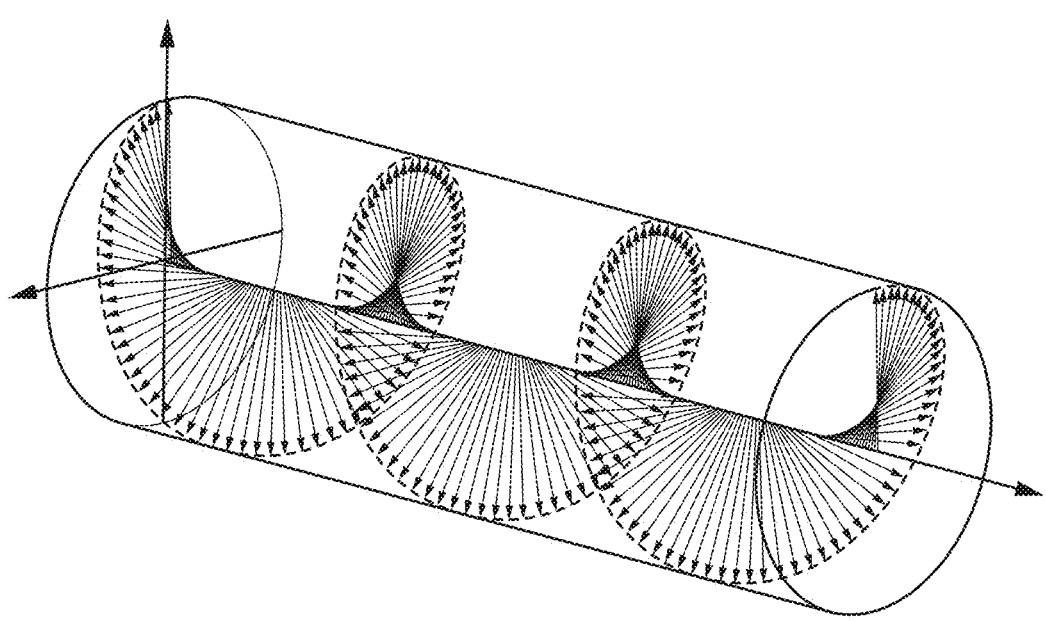

Circularly polarized RF signals may be referred to as having right-handed circular polarization (RHCP) or left-handed circular polarization (LHCP) depending on the direction in which the electric field rotates from the perspective of the source.[2] Accordingly, a circularly polarized RF signal has right-handed circular polarization when, upon pointing the right thumb away from the source in the same direction that the circularly polarized signal is propagating, the electric filed rotates in the direction of the curled fingers of the right hand. Right-handed circular polarization may also be referred to as "clockwise" circular polarization. Right-handed circular polarization is illustrated in FIG. 4B, which shows how the direction of the electric field rotates along the direction of propagation for an electromagnetic signal having RHCP (the source may be considered to be at the origin where the three depicted axes intersect). On the other hand, a circularly polarized RF signal has left-handed circular polarization when, upon pointing the left thumb away from the source in the same direction that the circularly polarized signal is propagating, the electric filed rotates in the direction of the curled fingers of the left hand. Left-handed circular polarization may also be referred to as "counter-clockwise" circular polarization. Left-handed circular polarization is illustrated in FIG. 4A, which shows how the direction of the electric field rotates along the direction of propagation for an electromagnetic signal having LHCP. As may be appreciated from the foregoing, RF signals having right-handed (or clockwise) circular polarization and RF signals having left-handed (or counter-clockwise) circular polarization are circularly polarized in different and opposing directions.

[2] Although it is possible to define right- and left-handedness from the perspective of the target rather than the source, we do not adopt this convention here.

Continuing the above example, in some embodiments, the transmit antenna of an interrogator device may be configured to transmit, to a target device, RF signals having right-handed circular polarization (hereinafter, "RHCP" RF signals) and the receive antenna of the interrogator device may be configured to receive, from the target device, RF signals having left-handed circular polarization (hereinafter, "LHCP" RF signals). Complementarily, the receive antenna of the target device may be configured to receive, from the interrogator device, RHCP RF signals and the transmit antenna of the target device may be configured to transmit LHCP RF signals. In other embodiments, the configuration may be reversed so that the transmit antenna of an interrogator device may be configured to transmit, to a target device, LHCP RF signals and the receive antenna of the interrogator device may be configured to receive, from the target device, RHCP RF signals. Complementarily, the receive antenna of the target device may be configured to receive, from the interrogator device, LHCP RF signals and the transmit antenna of the target device may be configured to transmit RHCP RF signals.

Figure 16:
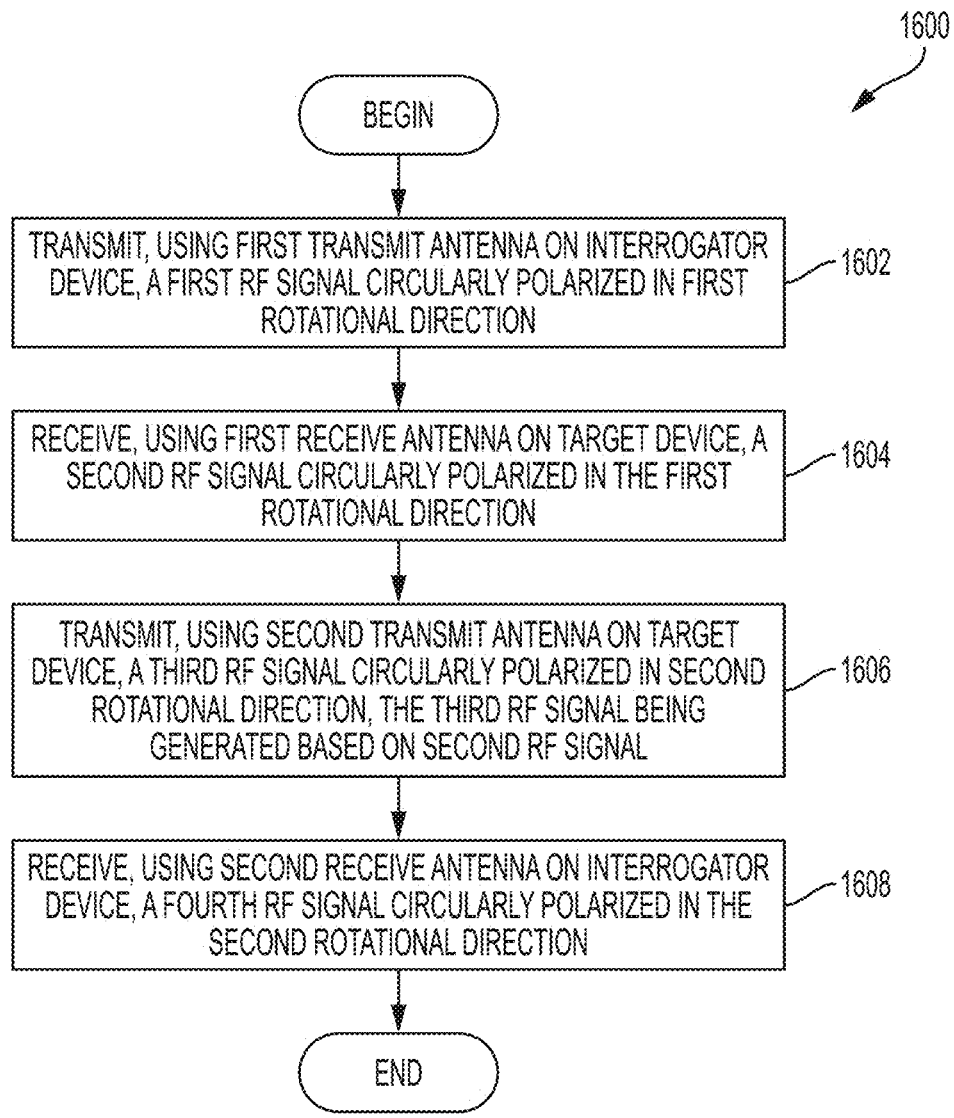
FIG. 16 is a flowchart of an illustrative process for making distance measurements using an interrogator device configured to transmit RF signals circularly polarized in one rotational direction and receive RF signals circularly polarized in another rotational direction, in accordance with some embodiments of the technology described herein.

FIG. 16 is a flowchart of an illustrative process 1600 for making distance measurements using an interrogator device configured to transmit, to at least one target device, RF signals circularly polarized in one rotational direction and receive, from the at least one target device, RF signals circularly polarized in another rotational direction, in accordance with some embodiments of the technology described herein. The process 1600 may be performed by any suitable type of interrogator device described herein that has transmit and receive antennas configured to transmit and receive RF signals having using different polarizations and any suitable type of target device described herein that has transmit and receive antennas configured to receive and transmit RF signals having different polarizations.

Process 1600 begins at act 1602, where a transmit antenna on an interrogator device, transmits, to a target device, a first RF signal circularly polarized in a first rotational direction. In some embodiments, the first RF signal may be an RHCP RF signal (having clockwise circular polarization). In other embodiments, however, the first RF signal may be a LHCP RF signal (having counter-clockwise circular polarization).

The interrogator's transmit antenna may be any suitable type of antenna configured to transmit circularly polarized signals. The transmit antenna may be directional or isotropic. In some embodiments, the transmit antenna may be a circularly polarized antenna fabricated on a substrate. For example, the circularly polarized antenna may be a patch antenna, a planar spiral antenna, an antenna comprising a first linearly polarized antenna and a second linearly polarized antenna disposed orthogonally to the first linearly polarized antenna.

Next, process 1600 proceeds to act 1604, where a receive antenna on the target device receives, from the interrogator a second RF signal circularly polarized in the first rotational direction. The second RF signal received by the target device at act 1604 may correspond to (e.g., may be the received version of) the first RF signal transmitted by the interrogator at act 1602. For example, when the interrogator transmit antenna transmits a first RHCP RF signal at act 1602, the receive antenna on the target device may receive a second RHCP RF signal corresponding to the first RHCP signal at act 1604. As another example, when the interrogator transmit antenna transmits a first LHCP RF signal at act 1602, the receive antenna on the target device may receive a second LHCP RF corresponding to the first LHCP signal at act 1604. Although the first and second RF signals may be the same, they need not be, at least because the first RF signal may be altered (e.g., the amplitude, phase, and/or frequency of the RF signal may be altered) as it propagates from the interrogator to the target device.

The target device receive antenna may be any suitable type of antenna configured to receive circularly polarized signals. It may be directional or isotropic. In some embodiments, the receive antenna may be a circularly polarized antenna fabricated on a substrate (e.g., a patch antenna, a planar spiral antenna, an antenna comprising a first linearly polarized antenna and a second linearly polarized antenna disposed orthogonally to the first linearly polarized antenna).

Next, process 1600 proceeds to act 1606, where a transmit antenna on the target device transmits, to the interrogator, a third RF signal circularly polarized in a second rotational direction different from (e.g., opposite of) the first rotational direction. For example, when the receive antenna on the target device is configured to receive RHCP RF signals, the transmit antenna on the target device is configured to transmit LHCP RF signals or vice versa.

In some embodiment, the target device may generate the third RF signal based on the second RF signal. For example, after receiving the second RF signal polarized in the first rotational direction (e.g., clockwise direction) at act 1604, the target device may process the second RF signal (e.g., by passing it through one or more amplifiers, one or more frequency multipliers, mixing the second RF signal with one or more other RF signals, and/or performing any of the processing described herein with respect to any target device), and provide the processed second RF signal to the transmit antenna which is configured to transmit RF signals polarized in the second rotational direction (e.g., counterclockwise direction). In this way, the transmit antenna on the target device is driven by the processed second RF signal to transmit a third RF signal polarized in the second rotational direction.

The target device transmit antenna may be any suitable type of antenna configured to transmit circularly polarized signals. It may be directional or isotropic. The transmit antenna may be a circularly polarized antenna fabricated on a substrate (e.g., a patch antenna, a planar spiral antenna, an antenna comprising a first linearly polarized antenna and a second linearly polarized antenna disposed orthogonally to the first linearly polarized antenna).

Next, process 1600 proceeds to act 1608, where a receive antenna on the interrogator receives a fourth RF signal circularly polarized in the second rotational direction. The fourth RF signal received by the interrogator at act 1608 may correspond to (e.g., may be the received version of) the third RF signal transmitted by the target device at act 1606. For example, when the transmit antenna on the target device transmits a third RHCP RF signal at act 1606, the receive antenna on the interrogator may receive a corresponding fourth RHCP RF signal at act 1608. As another example, when the transmit antenna on the target device transmits a third LHCP RF signal at act 1606, the receive antenna on the target device may receive a corresponding fourth LHCP RF signal at act 1608. Although the third and fourth RF signals may be the same, they need not be, at least because the third RF signal may be altered (e.g., the amplitude, phase, and/or frequency of the third RF signal may be altered) as it propagates from the target device to the interrogator.

The interrogator receive antenna may be any suitable type of antenna configured to receive circularly polarized signals. The receive antenna may be directional or isotropic. The receive antenna may be a circularly polarized antenna fabricated on a substrate (e.g., a patch antenna, a planar spiral antenna, an antenna comprising a first linearly polarized antenna and a second linearly polarized antenna disposed orthogonally to the first linearly polarized antenna).

After the fourth RF signal is received by the interrogator, the fourth RF signal may be processed in any suitable way in furtherance of determining a distance between the interrogator and the target device. For example, the fourth RF signal may be processed by the circuitry in the interrogator in accordance with any of the ways described herein including with reference to FIGS. 8A-8D and 11A-11B. In some embodiments, for example, the fourth RF signal may be mixed with a frequency-multiplied version of first RF signal to produce a mixed RF signal, which mixed RF signal may be used to determine the distance between the interrogator and the target device. It should be appreciated, however, that the fourth RF signal is not limited to being used solely for determining the distance between the interrogator and the target device and may be used for any other suitable purpose, as aspects of the technology described herein are not limited in this respect.

As discussed above, the inventors recognized the benefits of developing relatively low cost, small footprint micro-localization components afforded by chip-scale technologies. Unlike conventional designs that are typically too complex for chip-scale production, the designs developed by the inventors facilitate the ability to manufacture components of a micro-localization system using semiconductor fabrication processes. According to some embodiments, interrogator devices and target devices are manufactured as chip-scale products, some examples of which are described in further detail below.

Figure 5A:
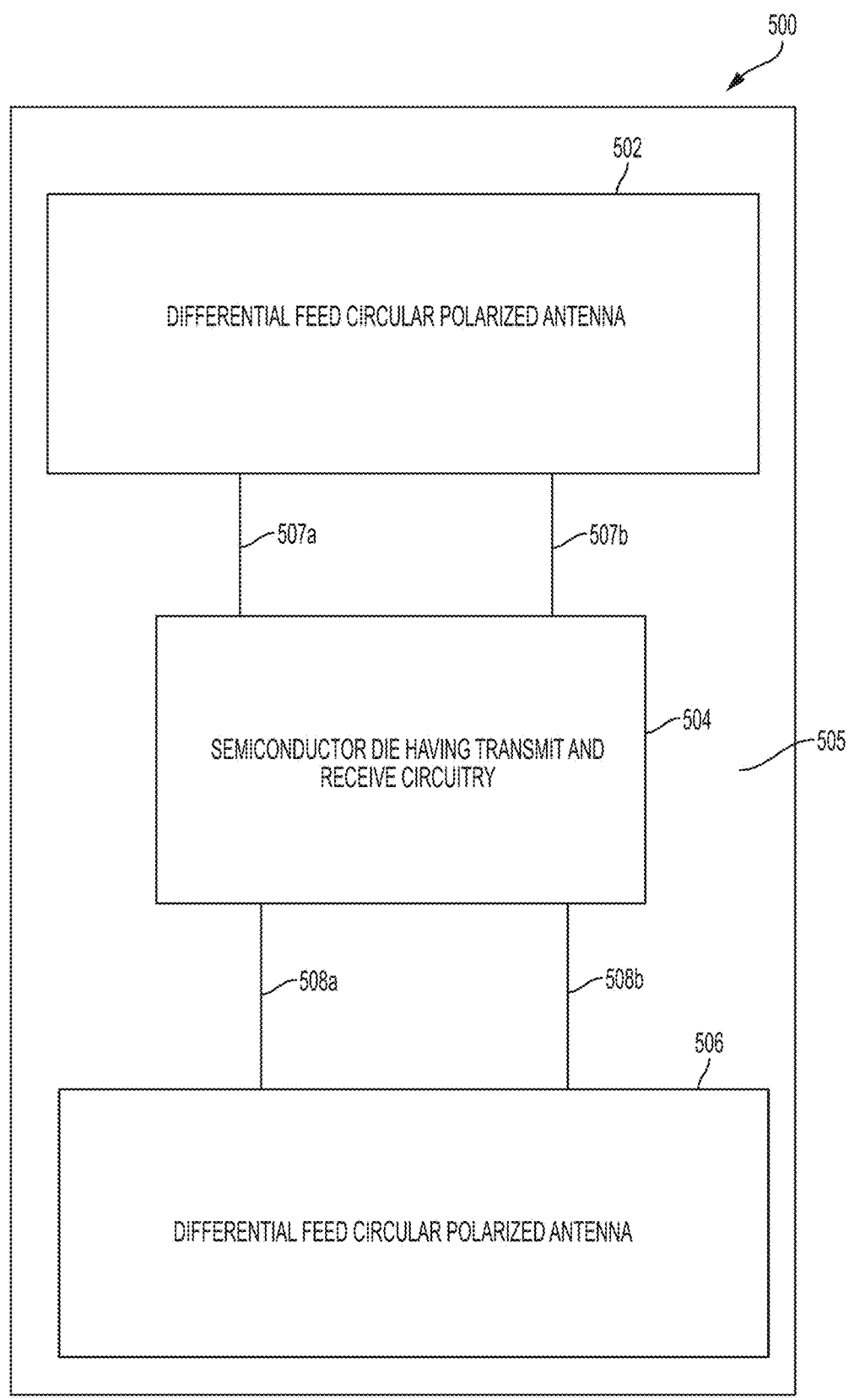
FIG. 5A is a block diagram illustrating components of an interrogator device, in accordance with some embodiments of the technology described herein.

FIG. 5A is a block diagram of an illustrative embodiment of an interrogator device 500 that may be used as part of process 1600 (e.g., to perform acts 1602 and 1608 of process 1600). Interrogator device 500 is not limited to being used as part of process 1600 and may be used in any other suitable way, including as part of any other process described herein, as aspects of the technology described herein are not limited in this respect.

As shown in FIG. 5A, interrogator 500 comprises a substrate 505 having a differential feed circular polarized transmit antenna 502 and a differential feed circular polarized receive antenna 506 disposed thereon. The interrogator 500 further comprises semiconductor die 504 having transmit and receive circuitry integrated thereon. The transmit and receive circuitry integrated with the semiconductor die 504 is differentially coupled to antenna 502 via lines 507a and 507b. The transmit and receive circuitry on the semiconductor die is also differentially coupled to antenna 506 via lines 508a and 508b.

In some embodiments, the substrate 505 may provide a means for implementing low-cost RF transmit and/or receive antennas (e.g., antennas 502 and 506) located near a semiconductor die (e.g., die 504) having circuitry for providing RF signals for transmission by the transmit RF antenna and circuitry for obtaining and processing RF signals received by the receive antenna. The substrate 505 may comprise a printed circuit board (PCB) and/or be manufactured from any suitable printed circuit board materials or other materials capable of supporting propagation of RF signals in a desired range of frequencies. For example, substrate 505 may be manufactured from materials that support propagation of microwave and/or millimeter wave RF signals. As one illustrative example, substrate 505 may be manufactured from materials that support propagation of microwave signals having frequencies in the range of 0.5-20 GHz, 4-6 GHz, 8-12 GHz, 50-70 GHz, 100-140 GHz, 50 GHz-240 GHz, and/or any suitable frequency range within the union combination of such ranges.

In some embodiments, the substrate 505 may include one or more layers and/or coatings for reducing the harmonic coupling between the transmit and receive antennas on the substrate. For example, the substrate 505 may include a frequency selective surface (FSS) configured to reduce harmonic coupling between the transmit antenna 502 and the receive antenna 506. The FSS may be manufactured as one or more layers within and/or on top of the substrate 505. The FSS may be of any suitable type and, for example, may comprise a periodic array of (e.g., metallic) elements on a dielectric substrate.

In some embodiments, the FSS may attenuate undesired RF signals traveling across the substrate 505 between the two antennas 502 and 506. The FSS may attenuate undesired RF signals by blocking their propagation across the substrate and reflecting them back toward the transmit antenna. For example, the FSS may attenuate RF signals, traveling across substrate 505 from transmit antenna 502 to receive antenna 506, having a center frequency at a harmonic (e.g., 122.5 GHz) of the center frequency (e.g., 61.25 GHz) of signals being transmitted by antenna 502. Additionally or alternatively, the FSS may attenuate coupling RF signals traveling between the differential lines 507a and 507b, between the differential lines 508a and 508b, and/or between ports of the die 508.

Accordingly, in some embodiments, the FSS on substrate 505 may be tuned to blocking RF signals having a particular frequency or set of frequencies. For example, the FSS may be tuned to block RF signals having frequencies (e.g., 122.5 GHz) that the receive antenna 506 is configured to receive from one or more target devices. Additionally or alternatively, the FSS may be tuned to block RF signals having frequencies (e.g., 61.25 GHz) that the transmit antenna 502 is configured to transmit (e.g., to prevent the transmitter from potentially saturating the low-noise amplifier configured to amplify signals received by the receive antenna 506).

In addition to or instead of using a frequency-selective surface, in some embodiments, the substrate 505 may be coated with an absorbent coating configured to reduce harmonic coupling between the transmit antenna 502 and the receive antenna 506. The absorbent coating may be configured to absorb any incident microwaves and dissipate them as heat energy. Any suitable absorbent coating may be used. For example, the absorbent coating may comprise carbon material such as, for example, resistive card or sheet stock material or carbon impregnated foam.

Figure 6A:
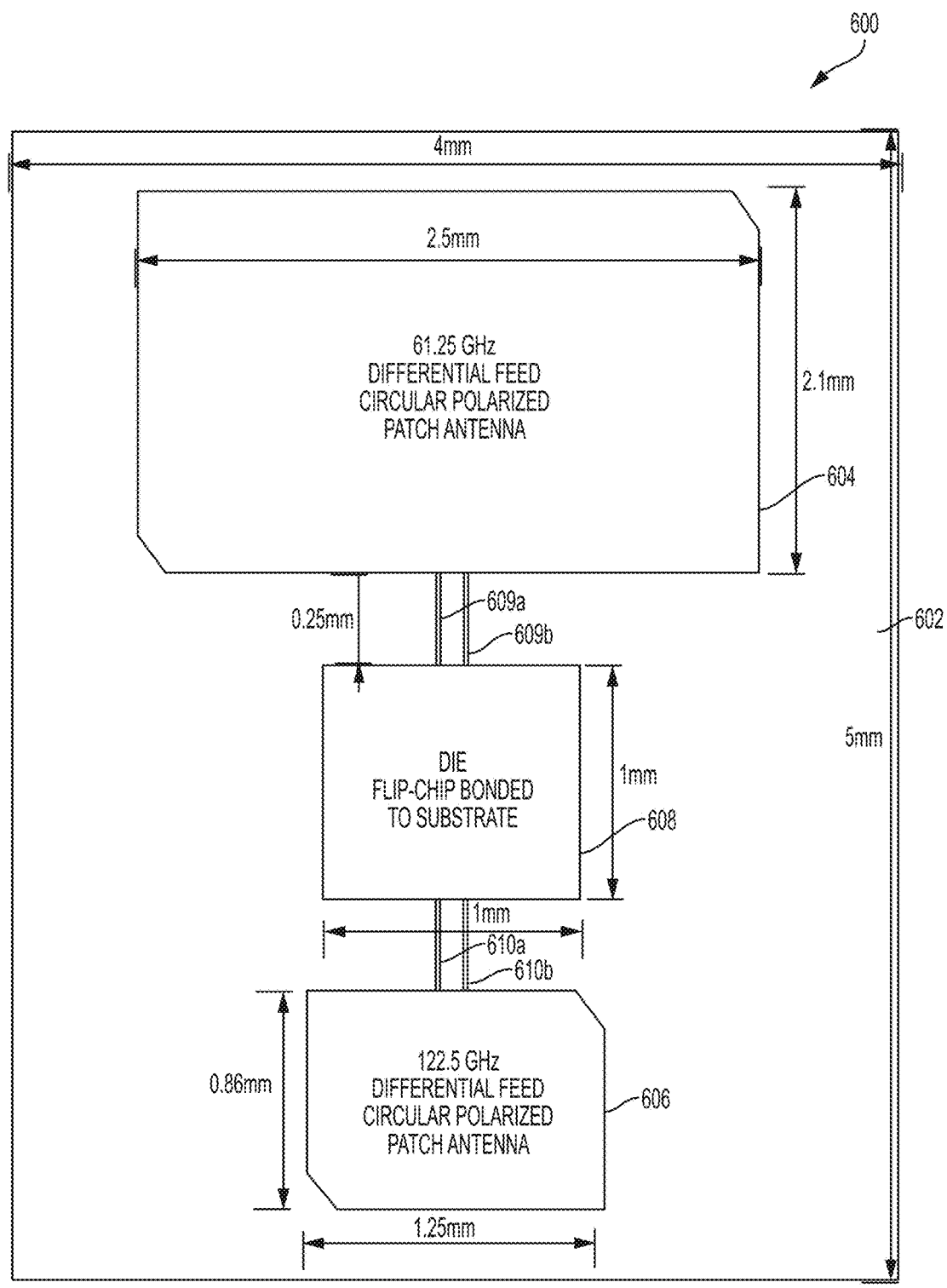
FIG. 6A is a block diagram illustrating components of an interrogator device, in accordance with some embodiments of the technology described herein.

In some embodiments, each of differential feed circular polarized antennas 502 and 506 may be fabricated on the substrate 505. For example, substrate 505 may comprise one or more conductive layers and each of antennas 502 and 506 may be fabricated on the substrate 502 at least in part by patterning the conductive layer(s). Each of antennas 502 and 506 may be a planar spiral antenna, a patch antenna (e.g., a truncated patch antenna as shown in FIG. 6A), an antenna comprising two linearly polarized antenna disposed perpendicularly to one another, a MEMS antenna, a dipole antenna, or any other suitable type of antenna.

In some embodiments, the antennas 502 and 506 may be directional antennas having a higher power aperture than isotropic antennas, which may allow the antennas to focus the transmission and/or receipt of RF signals to/from a particular direction (e.g., in a direction where one or more target devices of interest may be located). In some embodiments, however, one or both of antennas 502 and 506 may be isotropic antennas, as aspects of the technology described herein are not limited in this respect.

In some embodiments, antenna 502 may be configured to transmit RF signals circularly polarized in a first rotational direction (e.g., clockwise) and the antenna 506 may be configured to receive RF signals circularly polarized RF in a second rotational direction different from the first rotational direction (e.g., counter-clockwise). In other embodiments, however, each of antenna 502 and 506 may be configured to transmit and receive RF signals circularly polarized in the same rotational direction. For example, both antennas 502 and 506 may be configured to receive and transmit RF signals having clockwise circular polarization. As another example, both antennas 502 and 506 may be configured to receive and transmit RF signals having counter-clockwise circular polarization.

In some embodiments, antenna 502 may be configured to transmit RF signals having a first center frequency and the antenna 506 may be configured to receive RF signals having a second center frequency different from the first center frequency. For example, the second center frequency may be greater than a harmonic of the first center frequency (e.g., a first harmonic of the first center frequency, which is twice the first frequency). As one illustrative example, the antenna 502 may be configured to transmit RF signals having a first center frequency in the range of 50-70 GHz (e.g., 61.25 GHz), and the antenna 506 may be configured to receive RF signals having a second center frequency in the range of 100-140 GHz (e.g., 122.5 GHz). As another illustrative example, the antenna 502 may be configured to transmit RF signals having a first center frequency in a range of 4-6 GHz (e.g., 5 GHz), and the antenna 506 may be configured to receive RF signals having a second center frequency in a range of 8-10 GHz. In some embodiments, antenna 502 may be a different size from antenna 506. For example, antenna 502 may have a larger area than antenna 506 in embodiments where the antenna 506 is configured to receive RF signals having a center frequency (e.g., 122.5 GHz) greater than the center frequency of the signals transmitted by antenna 502 (e.g., 61.25 GHz).

The semiconductor die 504 may be a silicon die, for instance from a bulk silicon wafer or silicon-on-insulator (SOI) wafer. In some embodiments, the semiconductor die 504 may be a single crystal silicon die. In some embodiments, the semiconductor die 504 may be a CMOS die, a BiCMOS die, a GaAs die, a GaN die, or may be formed of any other suitable semiconductor material. In some embodiments, the semiconductor die 504 may be flip-chip bonded to substrate 505. In other embodiments, the semiconductor die 504 may be wire bonded to the substrate 505 or mounted on substrate 505 in any other suitable way.

In some embodiments, the interrogator 500 may comprise circuitry integrated with semiconductor die 504 and configured to provide RF signals to the transmit antenna 502 and receive RF signals from the receive antenna 506. The circuitry may comprise circuitry used for generating RF signals to transmit via antenna 502 (e.g., a waveform generator, one or more amplifiers, etc.), circuitry for performing phase coherent processing of received RF waveforms (e.g., circuitry to multiply the frequencies in a copy of the transmitted RF signal to the frequencies in a received RF signal, a frequency mixer for mixing a transformed version of the transmitted RF signal and the received RF signals), and/or any other suitable circuitry, numerous examples of which are provided herein including with reference to FIGS. 8A-8D and 11A-11B.

In the illustrated embodiment, the circuitry integrated with die 504 is differentially coupled to antenna 502 via lines 508a and 508b. The circuitry may generate a first signal and a second signal out of phase (e.g., 180 degrees out of phase) with the first signal, and concurrently provide the first and second signals to the antenna 502 via lines 508a and 508b, respectively. In turn, antenna 502 may be configured to transmit a signal based on a difference between the first and second signals. Additionally, the circuitry integrated with die 504 is differentially coupled to antenna 506 via lines 509a and 509b. The antenna 506 is configured to receive an RF signal and transmit it through the differential pair of lines 509a and 509b.

Figure 5B:
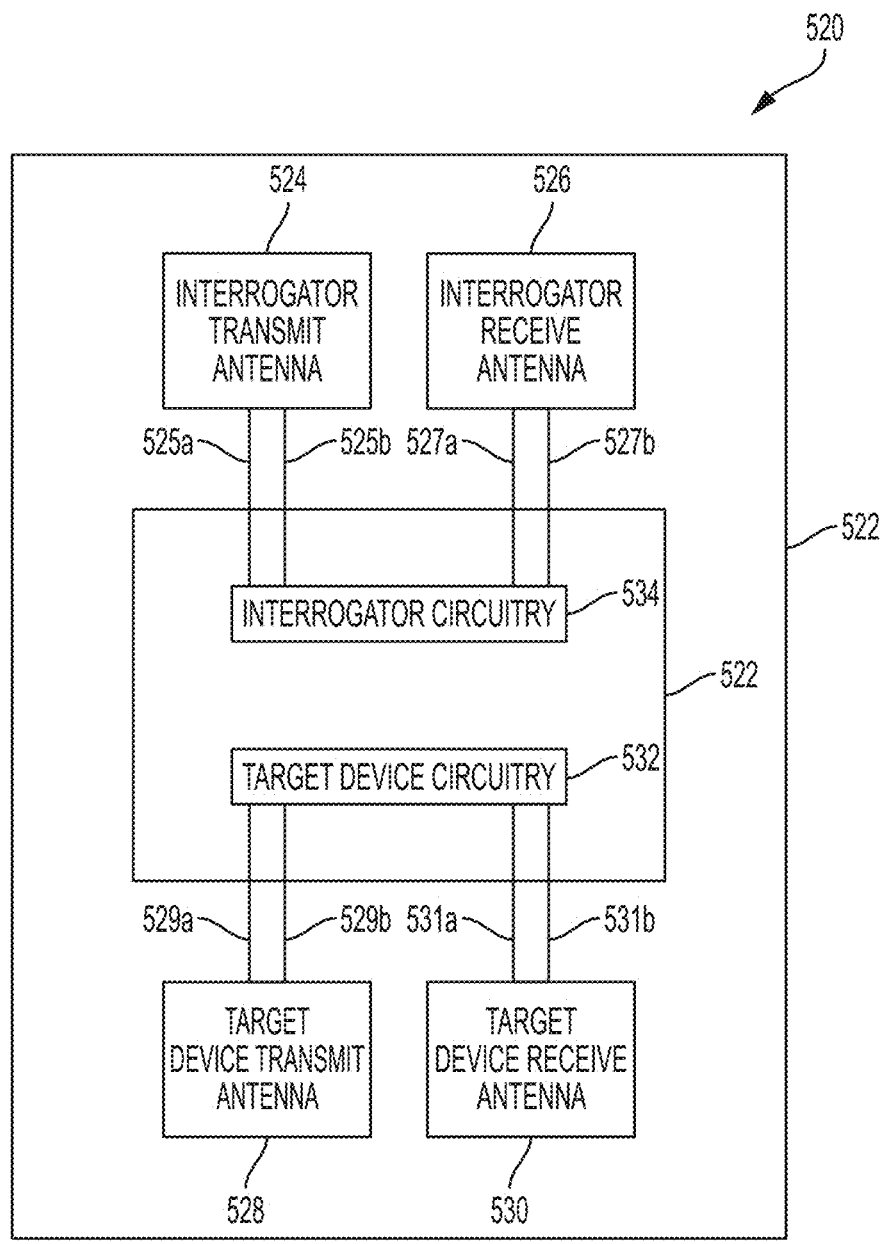
FIG. 5B is a block diagram illustrating components of an example dual-mode localization device configured to operate as an interrogator or as a transponder.

FIG. 5B is a block diagram illustrating components of an example dual-mode localization device 520 configured to operate as an interrogator or as a transponder. Dual-mode localization device 520 comprises a substrate 522 having four antennas disposed thereon. These antennas include interrogator transmit antenna 524, interrogator receive antenna 526, target device transmit antenna 528, and target device receive antenna 530. The localization device 520 further comprises a semiconductor die 532 mounted on substrate 522. The semiconductor die 532 has interrogator circuitry 534 and target device circuitry 536 integrated thereon.

As shown in FIG. 5B, interrogator transmit antenna 524 is differentially coupled to interrogator circuitry 534 via transmission lines 525a and 525b, and interrogator receive antenna is differentially coupled to interrogator circuitry 534 via transmission lines 527a and 527b. Target device transmit antenna 528 is differentially coupled to target device circuitry 536 via transmission lines 529a and 529b. Target device receive antenna 530 is differentially coupled to target device circuitry 536 via transmission lines 531a and 531b. Though in the illustrative embodiment of FIG. 5B each of the antennas 524, 526, 528, and 530 is differentially coupled to circuitry on the semiconductor die 532, in other embodiments one or more of these antennas may not be differentially coupled to the circuitry.

Substrate 522 may be of any suitable type described herein including with reference to substrate 505 of FIG. 5A and, for example, may comprise a printed circuit board (PCB) and/or be manufactured from any suitable printed circuit board materials or other materials capable of supporting propagation of RF signals in a desired range of frequencies. In some embodiments, the substrate 522 may include a frequency selective surface and/or absorbent coating to reduce harmonic coupling among the antennas in device 522 (e.g., reduce harmonic coupling between the interrogator transmit antenna 524 and the interrogator receive antenna 526 and/or reduce harmonic coupling between the target device transmit antenna 528 and the target device receive antenna 530).

In some embodiments, each of antennas 524, 526, 528, and 530 may be fabricated on substrate 522. For example, substrate 522 may comprise one or more conductive layers and each of the antennas 524, 526, 528, and 530 may be fabricated on the substrate 522 at least in part by patterning the conductive layer(s). Each of antennas 524, 526, 528, and 530 may be a planar spiral antenna, a patch antenna, an antenna comprising two linearly polarized antenna disposed perpendicularly to one another, a MEMS antenna, a dipole antenna, or any other type of antenna.

Antennas may be patterned on the substrate 522 in any suitable manner to produce a conductive pattern, for example, using any one or combination of various subtractive, additive and/or semi-additive processes. Subtractive processes selectively remove conductive material (e.g., copper) from a conductive layer of the substrate leaving a desired conductive pattern using, for example, any of various lithographic processes including, but not limited to, chemical etching, photoengraving, etc. Such processes are typically performed by providing a resist material in the desired pattern (often referred to as a mask) and introducing the conductive layer to the corresponding etchant to remove the conductive material in locations not treated with the resist material. Another subtractive process involves milling away unwanted portions of the conductive layer leaving the desired conductive pattern.

Additive processes may also be used and may involve electroplating the desired conductive pattern on the substrate or "printing" the pattern using a conductive ink. For example, electroplating may involve exposing photosensitive film masked in a desired pattern. The exposed pattern may then be introduced to a chemical bath to allow the pattern to be capable of metal ion bonding and then plated with a conductor (e.g., with copper) that bonds with the pattern sensitized in the chemical bath to form the desired conductive pattern. Additive processes have the advantage that less conductive material is needed to form the desired conductive pattern than subtractive techniques. Other processes combine both subtractive and additive techniques to form the desired conductive pattern. It should be appreciated that any suitable fabrication process may be used to pattern desired antennas on substrate 522, as the aspects are not limited in this respect. Indeed, the subtractive processes described herein, additive processes described herein, and/or any other suitable process may be used alone or in any combination to fabricate the desired conductive pattern for the antennas (e.g., antennas 524, 526, 528, and 530, antennas 502 and 506 described with reference to FIG. 5A, antennas 114 and 116 described with reference to FIG. 1B, and/or any other antennas described herein).

In some embodiments, interrogator transmit antenna 524 may be configured to transmit RF signals circularly polarized in a first rotational direction (e.g., clockwise) and the interrogator receive antenna 526 may be configured to receive RF signals circularly polarized RF in a second rotational direction different from the first rotational direction (e.g., counter-clockwise). Additionally, in some embodiments, the target device receive antenna 528 may be configured to receive RF signal circularly polarized in the first rotational direction and the target device transmit antenna 530 may be configured to transmit RF signals circularly polarized in the second rotational direction. Accordingly, in some embodiments, the interrogator transmit antenna 524 and the target device receive antenna 530 may be configured to transmit/receive RF signals circularly polarized in the same direction. Likewise, target device transmit antenna 528 and interrogator receive antenna 526 may be configured to transmit/receive RF signals circularly polarized in the same direction.

In some embodiments, when dual mode device 520 is operating as an interrogator (in an "interrogator mode"), the interrogator transmit antenna 524 may be configured to transmit RF signals having a first center frequency and the interrogator receive antenna 526 may be configured to receive RF signals having a second center frequency different from (e.g., a harmonic of) the first center frequency. Examples of such first and second center frequencies are provided herein. When dual mode device 520 is operating as a target device (in a "target device mode"), the target device receive antenna 530 may be configured to receive RF signals having the first center frequency and the target device transmit antenna 528 may be configured to transmit RF signals having the second center frequency. Accordingly, in some embodiments, the interrogator transmit antenna 524 and the target device receive antenna 530 may be configured to transmit/receive RF signals having the same center frequency (e.g., 60 GHz). Likewise, target device transmit antenna 528 and interrogator receive antenna 526 may be configured to transmit/receive RF signals having the same center frequency.

The semiconductor die 532 may be a silicon die, for instance from a bulk silicon wafer or silicon-on-insulator (SOI) wafer. In some embodiments, the semiconductor die 532 may be a single crystal silicon die. In some embodiments, the semiconductor die 532 may be a CMOS die, a BiCMOS die, a GaAs die, a GaN die, or may be formed of any other suitable semiconductor material. In some embodiments, the semiconductor die 532 may be flip-chip bonded to substrate 522. In other embodiments, the semiconductor die 532 may be wire bonded to the substrate 522 or mounted on substrate 522 in any other suitable way.

In some embodiments, interrogator circuitry 534 may be configured to provide RF signals to the interrogator transmit antenna 524 and receive RF signals from the interrogator receive antenna 526. Interrogator circuitry 534 may be implemented in any suitable way described herein including in any of the ways described with reference to FIGS. 8A-8D and 11A-11B. In some embodiments, target device circuitry 536 may be configured to receive RF signals from the target device receive antenna 530 and to provide RF signals to the target device transmit antenna 528. Target device circuitry 536 may be implemented in any suitable way describe herein including in any of the ways described herein with reference to FIGS. 9A-9H, 10, and 11A-11B.

FIG. 6A is a block diagram illustrating components of an example interrogator device 600, in accordance with some embodiments of the technology described herein. The interrogator device 600 is illustrated along with dimensions of some of the components thereon to provide a sense of scale of the device and the components. It should be appreciated that these dimensions are illustrative of the example embodiment of FIG. 6A, but do not limit the dimensions of the interrogator device and/or its components in other embodiments.

As shown in FIG. 6A, interrogator 600 comprises a substrate 602 having a differentially feed circular polarized transmit antenna 604 and a differential feed circular polarized receive antenna 606 disposed thereon. The interrogator 600 further comprises semiconductor die 608 having transmit and receive circuitry integrated thereon. The transmit and receive circuitry integrated with the semiconductor die 608 is differentially coupled to antenna 602 via lines 609a and 609b. The transmit and receive circuitry on the semiconductor die is also differentially coupled to antenna 606 via lines 610a and 610b.

Substrate 602 may be of any suitable type described herein including with reference to substrate 505 of FIG. 5A and, for example, may comprise a printed circuit board (PCB) and/or be manufactured from any suitable printed circuit board materials or other materials capable of supporting propagation of RF signals in a desired range of frequencies. In some embodiments, the substrate 602 may include a frequency selective surface and/or absorbent coating to reduce harmonic coupling between the transmit antenna 604 and the receive antenna 606. Examples of frequency selective surfaces and absorbent coatings are described herein. In the illustrative embodiment of FIG. 6A, the substrate 602 may be 4 mm×5 mm.

In the illustrative embodiment of FIG. 6A, transmit antenna 604 is a patch antenna configured to transmit circularly polarized RF signals having a center frequency of 61.25 GHz. The RF signals may be circularly polarized clockwise or counter-clockwise. Although the antennas 604 and 606 are patch antennas in the illustrative embodiment of FIG. 6A, in other embodiments, each of the antennas 604 and 606 may be of any other suitable type including any of the types described herein. Additionally, although the antennas 604 and 606 transmit/receive RF signals at 61.25 GHz/122.5 GHz in the illustrative embodiment of FIG. 6A, these antennas may be configured to transmit/receive at any other suitable (e.g., millimeter wave and/or microwave) frequencies $f_0/kf_0$, where the transmit antenna 604 is configured to transmit RF signals having a center frequency of $f_0$ and the receive antenna 606 is configured to receive RF signals having a center frequency of $kf_0$, which is a harmonic of $f_0$. In the illustrative embodiment of FIG. 6A, the transmit antenna 604 is a 2.5 mm×2.1 mm patch antenna and the receive antenna is a 1.25 mm by 0.86 mm patch antenna.

In some embodiments, each of antennas 604 and 606 may be fabricated on substrate 602. For example, substrate 602 may comprise one or more conductive layers and each of antennas 604 and 606 may be fabricated on the substrate 602 at least in part by patterning the conductive layer(s). In some embodiments, antenna 604 may be configured to transmit RF signals circularly polarized in a first rotational direction (e.g., clockwise) and the antenna 606 may be configured to receive RF signals circularly polarized RF in a second rotational direction different from the first rotational direction (e.g., counter-clockwise). In other embodiments, however, each of antennas 604 and 606 may be configured to transmit and receive RF signals circularly polarized in the same rotational direction.

In some embodiments, the semiconductor die 608 may be a silicon die, for instance from a bulk silicon wafer or silicon-on-insulator (SOI) wafer. In some embodiments, the die 608 may be a single crystal silicon die. In some embodiments, the die 608 may be a CMOS die, a BiCMOS die, a GaAs die, a GaN die, or may be formed of any other suitable semiconductor material. In the illustrated embodiment, the die 608 is flip-chip bonded to substrate 602. In other embodiments, the die 608 may be wire bonded to the substrate 602 or mounted on substrate 602 in any other suitable way. In the illustrative embodiment of FIG. 6A, the semiconductor die 608 may be 1 mm by 1 mm.

In some embodiments, the interrogator 600 may comprise circuitry integrated with semiconductor die 608 and configured to provide RF signals to the transmit antenna 604 and receive RF signals from the receive antenna 606. The circuitry may comprise circuitry used for generating RF signals to transmit via antenna 604 (e.g., a waveform generator, one or more amplifiers, etc.), circuitry for performing phase coherent processing of received RF waveforms (e.g., circuitry to multiply the frequencies in a copy of the transmitted RF signal to the frequencies in a received RF signal, a frequency mixer for mixing a transformed version of the transmitted RF signal and the received RF signals), and/or any other suitable circuitry, numerous examples of which are provided herein including with reference to FIGS. 8A-8D and 11A-11B.

In the illustrated embodiment, the circuitry integrated with die 608 is differentially coupled to antenna 604 via lines 609a and 609b. The circuitry may generate a first signal and a second signal out of phase (e.g., 180 degrees out of phase) with the first signal, and concurrently provide the first and second signals to the antenna 604 via lines 609a and 609b, respectively. In turn, antenna 604 may be configured to transmit a signal based on a difference between the first and second signals. Additionally, the circuitry integrated with die 608 is differentially coupled to antenna 606 via lines 610a and 610b. The antenna 606 is configured to receive an RF signal and transmit it through the differential pair of lines 610a and 610b.

Figure 6B:
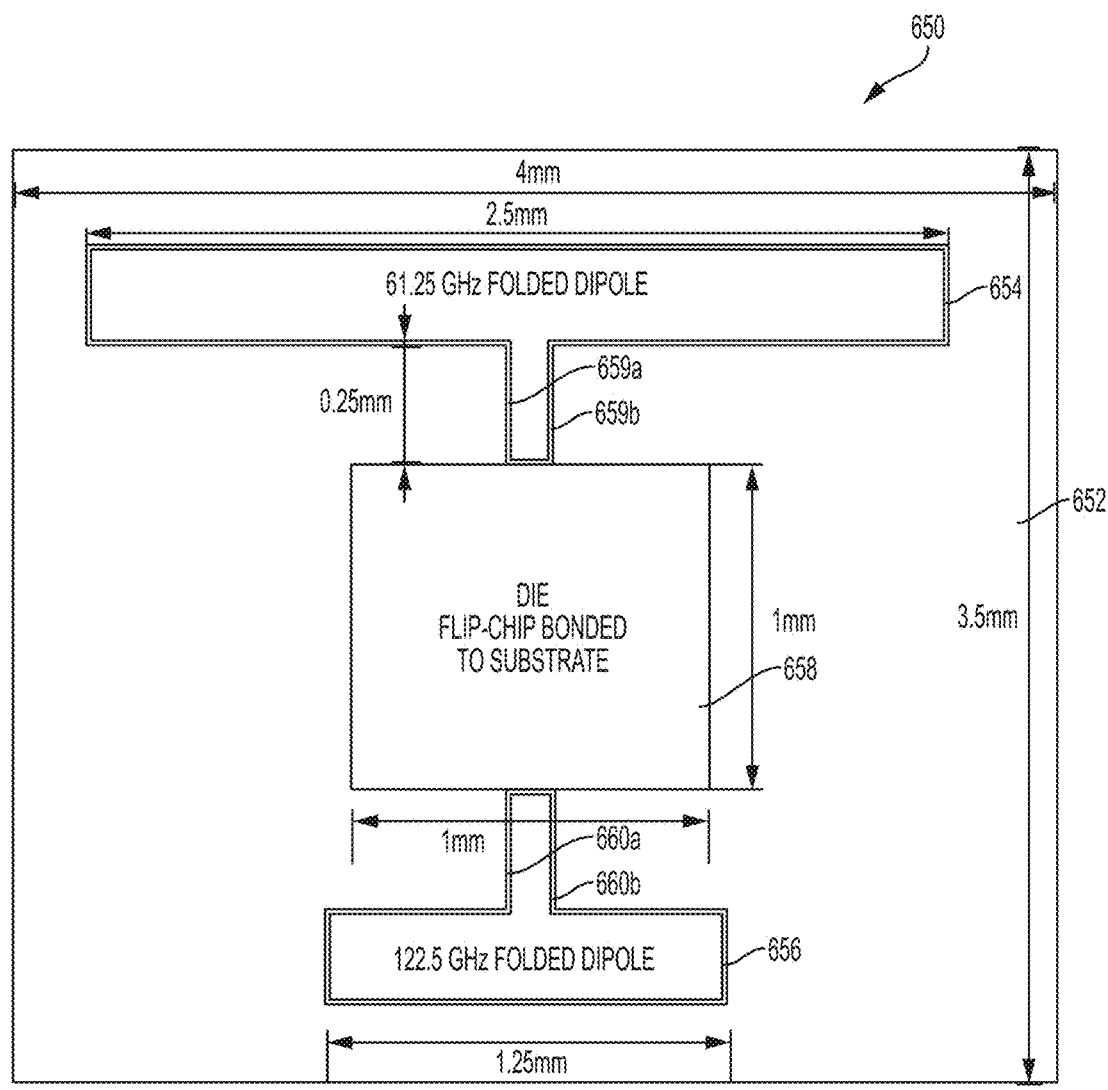
FIG. 6B is a block diagram illustrating components of an target device, in accordance with some embodiments of the technology described herein.

FIG. 6B is a block diagram illustrating components of an example target device 650, in accordance with some embodiments of the technology described herein. The target device 650 is illustrated along with dimensions of some of the components thereon to provide a sense of scale of the device and the components. It should be appreciated that these dimensions are illustrative of the example embodiment of FIG. 6B, but do not limit the dimensions of the interrogator device and/or its components in other embodiments.

As shown in FIG. 6B, target device 650 comprises a substrate 652 having a receive antenna 654 and transmit antenna 656 disposed thereon. The target device 650 further comprises a semiconductor die 658 having signal transformation circuitry integrated thereon. The signal transformation circuitry integrated with the semiconductor die 658 is differentially coupled to antenna receive 654 via lines 659a and 659b. The signal transformation circuitry on the semiconductor die 658 is differentially coupled to transmit antenna 656 via lines 660a and 660b.

Substrate 652 may be of any suitable type described herein including with reference to substrate 505 of FIG. 5A and, for example, may comprise a printed circuit board (PCB) and/or be manufactured from any suitable printed circuit board materials or other materials capable of supporting propagation of RF signals in a desired range of frequencies. In some embodiments, the substrate 652 may include a frequency selective surface and/or absorbent coating to reduce harmonic coupling between the receive antenna 654 and the transmit antenna 656. Examples of frequency selective surfaces and absorbent coatings are described herein. In the illustrative embodiment of FIG. 6B, the substrate 652 may be 4 mm×3.5 mm.

In the illustrative embodiment of FIG. 6B, receive antenna 654 is a folded dipole antenna configured to receive (e.g., from interrogator 600) RF signals having a center frequency of 61.25 GHz. The RF signals may be circularly polarized clockwise or counter-clockwise, in some embodiments. Although the antennas 654 and 656 are folded dipole antennas in the illustrative embodiment of FIG. 6B, in other embodiments, each of the antennas 654 and 656 may be of any other suitable type including any of the types described herein. Additionally, although the antennas 654 and 656 receive/transmit RF signals at 61.25 GHz/122.5 GHz in the illustrative embodiment of FIG. 6B, these antennas may be configured to receive/transmit at any other suitable (e.g., millimeter wave and/or microwave) frequencies $f_0/kf_0$, where the receive antenna 654 is configured to receive RF signals having a center frequency of $f_0$ and the transmit antenna 656 is configured to transmit RF signals having a center frequency of $kf_0$, which is a harmonic of $f_0$. In the illustrative embodiment of FIG. 6B, the receive antenna 654 is a 2.5 mm wide folded dipole antenna and the transmit antenna 656 is a 1.25 mm wide folded dipole antenna.

In some embodiments, each of antennas 654 and 656 may be fabricated on substrate 652. For example, substrate 652 may comprise one or more conductive layers and each of antennas 654 and 656 may be fabricated on the substrate 652 at least in part by patterning the conductive layer(s). In some embodiments, antenna 654 may be configured to receive RF signals circularly polarized in a first rotational direction (e.g., clockwise) and the antenna 656 may be configured to transmit RF signals circularly polarized RF in a second rotational direction different from the first rotational direction (e.g., counter-clockwise). In other embodiments, however, each of antennas 654 and 656 may be configured to transmit and receive RF signals circularly polarized in the same rotational direction.

In some embodiments, the semiconductor die 658 may be a silicon die, for instance from a bulk silicon wafer or silicon-on-insulator (SOI) wafer. In some embodiments, the die 658 may be a single crystal silicon die. In some embodiments, the die 658 may be a CMOS die, a BiCMOS die, a GaAs die, a GaN die, or may be formed of any other suitable semiconductor material. In the illustrated embodiment, the die 658 is flip-chip bonded to substrate 602. In other embodiments, the die 658 may be wire bonded to the substrate 652 or mounted on substrate 652 in any other suitable way. In the illustrative embodiment of FIG. 6B, the semiconductor die 658 may be 1 mm by 1 mm.

In some embodiments, the target device 650 may comprise signal transformation circuitry integrated with semiconductor die 658 and configured to receive RF signals from receive antenna 654, transform the received RF signals to obtain transformed RF signals, and provide the transformed RF signals to transmit antenna 656. The signal transformation circuitry may be configured to transform the received RF signals by changing the frequencies in the received RF signals in any suitable way including in any of the ways described herein including with reference to FIGS. 9A-9H, 10, 11A, and 11B. For example, the signal transformation circuitry may be configured to transform the received RF signals by passing the received RF signals through one or more frequency multipliers so that received RF signals having a first center frequency are transformed into RF signals having a second center frequency that is a harmonic of the center frequency. To this end, the signal transformation circuitry may comprise one or more frequency multipliers, one or more amplifiers, and/or any other suitable components. Various examples of signal transformation circuitry are provided herein including with reference to FIGS. 9A-9H, 10, 11A, and 11B.

In the illustrated embodiment, the signal transformation circuitry integrated with die 658 is differentially coupled to receive antenna 654 via lines 659a and 659b. The antenna 654 is configured to receive an RF signal and transmit it, via differential signaling, through the differential pair of lines 659a and 659b. The signal transformation circuitry may process the received RF signals and generate corresponding transformed RF signals, which are provided, using differential signaling via differential lines 660a and 660b. The circuitry may generate a first signal and a second signal out of phase (e.g., 180 degrees out of phase) with the first signal, and concurrently provide the first and second signals to the antenna 654 via lines 659a and 659b, respectively. In turn, antenna 656 may be configured to transmit a signal based on a difference between the first and second signals.

As described above, in some embodiments, an interrogator device may comprise a substrate having one or more antennas fabricated thereon, a semiconductor die flip-chip bonded to the substrate, and circuitry integrated with the semiconductor die and coupled to the antenna(s) fabricated on the substrate. Similarly, a target device may comprise a substrate having one or more antennas fabricated thereon, a semiconductor die flip-chip bonded to the substrate, and circuitry integrated with the semiconductor die and coupled to the antenna(s) fabricated on the substrate. Aspects of techniques for manufacturing such interrogator and target devices are described with reference to FIGS. 7A-7F below, which describe aspects of techniques for generating a packaged device having a substrate, a semiconductor die, and encapsulation. The packaged device is described generically with respect to FIGS. 7A-7F, but may be an interrogator device or a target device, in some embodiments.

FIG. 7A is a diagram of an illustrative substrate 700 having a transmit antenna 704 and a receive antenna 706 fabricated thereon. Substrate 700 further includes bond pads 708, which are configured to be mated with semiconductor, die bumps, as described below with reference to FIG. 7B and FIG. 7C. The substrate 700 further comprises second level connections 710 to facilitate connecting the device to any suitable other system (e.g., the printed circuit board 204 of product 202 shown in FIG. 2 or the system level or mother board of any other suitable system). Second level connections 710 may be a ball grid array (BGA) to facilitate surface mounting the device to the next level of interconnection. Second level connections 710 may also be through-hole pins, gull-wing connections or any other suitable second level connections.

It should be appreciated that although only four bond pads 708 (lands) are shown in FIG. 7, that is for clarity of presentation and not by way of limitation, as substrate 700 may comprise any suitable number of bond pads 708. For example, substrate 700 may comprise anywhere between 10 and 150 bond pads. As one illustrative example, when substrate 700 is used to implement an interrogator device, the substrate 700 may include 10-35 (e.g., 25) bond pads. As another illustrative example, when substrate 700 is used to implement a target device, the substrate 700 may include 50-75 (e.g., 64) bond pads. As yet another illustrative example, when substrate 700 is used implement a combined interrogator and target device, the substrate 700 may include 60-110 bond pads.

Substrate 700 may comprise a printed circuit board (PCB) and/or be manufactured from any suitable printed circuit board materials or other materials capable of supporting propagation of RF signals in a desired range of frequencies. For example, substrate 700 may be manufactured from materials that support propagation of microwave and/or millimeter wave RF signals. As one illustrative example, substrate 700 may be manufactured from materials that support propagation of microwave signals having frequencies in the range of 0.5-20 GHz, 4-6 GHz, 8-12 GHz, 50-70 GHz, 100-140 GHz, 50 GHz-240 GHz, and/or any suitable frequency range within the union combination of such ranges.

In some embodiments, the substrate 700 may include one or more layers and/or coatings for reducing the harmonic coupling between the transmit and receive antennas on the substrate. For example, the substrate 700 may include a frequency selective surface (FSS) and/or an absorbent coating, examples of which are provided herein. In some embodiments, the substrate 700 may include multiple layers, including one or more layers having connections mapping the BGA pins 710 to the semiconductor die bond pads 708.

In some embodiments, the substrate 700 may include any suitable circuitry (e.g., impedance matching circuitry, filtering circuitry) and transmission lines (e.g., transmission lines 712) for transmitting RF signals between the semiconductor die to be coupled to the substrate via bond pads 708 and antennas 704 and 706. In some embodiments, the substrate 700 may contain one or more additional circuits, chips, and/or other components of any kind as part of interrogator device or a target device, as substrate 700 is not limited to including only the components illustrated in FIG. 7A.

In some embodiments, each of antennas 704 and 706 may be fabricated on substrate 700. For example, substrate 700 may comprise one or more conductive layers and each of antennas 704 and 706 may be fabricated on the substrate 700 at least in part by patterning the conductive layer(s). In some embodiments, antenna 704 may be configured to transmit RF signals circularly polarized in a first rotational direction (e.g., clockwise) and the antenna 706 may be configured to receive RF signals circularly polarized RF in a second rotational direction different from the first rotational direction (e.g., counter-clockwise). In other embodiments, however, each of antennas 704 and 706 may be configured to transmit and receive RF signals circularly polarized in the same rotational direction.

Each of antennas 704 and 706 may be a patch antenna, a planar spiral antenna, an antenna comprising a first linearly polarized antenna and a second linearly polarized antenna disposed orthogonally to the first linearly polarized antenna, a folded dipole antenna, a MEMS antenna, or any other suitable type of antenna. In some embodiments, antennas 704 and 706 may be configured to transmit/receive at any suitable (e.g., millimeter wave and/or microwave) radio frequencies $f_0/kf_0$, where the transmit antenna 704 may be configured to transmit RF signals having a center frequency of $f_0$ and the receive antenna 706 may be configured to receive RF signals having a center frequency of $kf_0$, which is a harmonic of $f_0$.

FIG. 7B is a diagram of an illustrative semiconductor die 722 being prepared for bonding to the substrate of FIG. 7A, in accordance with some embodiments of the technology described herein. The semiconductor die 722 may be a silicon die, for instance from a bulk silicon wafer or silicon-on-insulator (SOI) wafer. In some embodiments, the die 722 may be a single crystal silicon die. In some embodiments, the die 722 may be a CMOS die, a BiCMOS die, a GaAs die, a GaN die, or may be formed of any other suitable semiconductor material. The semiconductor die 722 may have any of numerous types of circuitry integrated therewith, numerous examples of such circuitry are provided herein.

In some embodiments, the semiconductor die may be flip-chip bonded to substrate 700. To this end, as shown in FIG. 7B, the chip die 722 may include multiple bond pads 724 (e.g., the bond pads 724 may correspond to the plurality of bond pads 708 on substrate 700). As with bond pads or lands 708, while only four bond pads 724 are illustrated for clarity, any number of bonds pads may be present to provide the necessary first level connections from the semiconductor die to substrate 700. In addition, it should be appreciated that the bond pads are not drawn to scale, but are depicted schematically for illustration. Each of bond pads 724 may be "bumped" with metal (e.g., copper) bumps 726. The bumps 726 may be topped with solder tined tops 728 resulting in overall structure 720. When the structure 720 is flipped onto the substrate 700, it may be bonded to the substrate by a suitable surface mount technology such as a solder reflow process resulting in the (unencapsulated) device 730 shown in FIG. 7C.

In general, wire bonding the semiconductor die to the substrate provides a more economical solution. However, while wire bonding may be used in some embodiments, wire bonds are generally unsuitable for micro-localization systems operating in the GHz range. The inventors have developed interrogator and target devices requiring relatively small numbers of bond pads, facilitating relatively inexpensive and simple flip-chip bonding fabrication processes to be utilized.

Figure 7D:
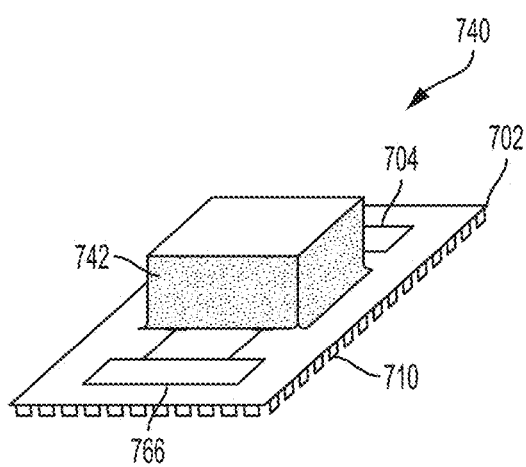
FIG. 7D is an illustration of one way in which the device of FIG. 7C may be encapsulated, in accordance with some embodiments of the technology described herein.
Figure 7E:
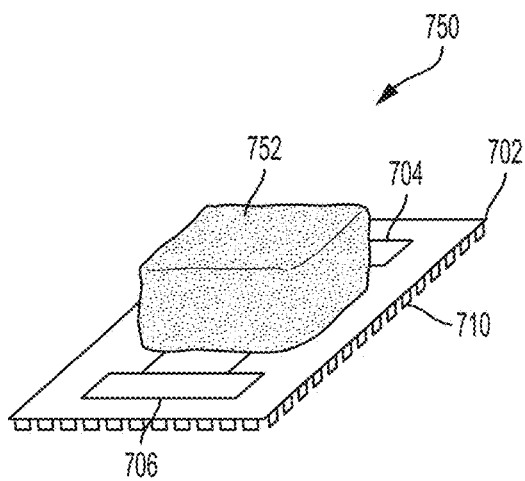
FIG. 7E is an illustration of another way in which the device of FIG. 7C may be encapsulated, in accordance with some embodiments of the technology described herein.
Figure 7F:
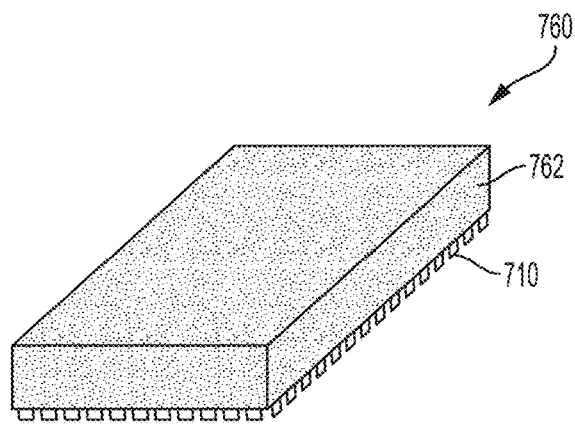
FIG. 7F is an illustration of another way in which the device of FIG. 7C may be encapsulated, in accordance with some embodiments of the technology described herein.

The unencapsulated device 730 shown in FIG. 7C may be encapsulated to protect the semiconductor die 722, for example, from moisture, oxidation, and/or any other environmental contaminants. For example, as shown in FIG. 7D, the device 730 may be encapsulated by applying a coating 742 around the outside edges of the die 722 to obtain encapsulated device 740. As another example, shown in FIG. 7E, the semiconductor die 722 may be encapsulated with a blob of encapsulation 752 to obtain encapsulated device 750. As another example, shown in FIG. 7F, the die 722 and the substrate 700 may be both encapsulated with encapsulation 762 to obtain encapsulated device 760. The encapsulation may be made of a material capable of supporting propagation of microwave and/or millimeter wave RF signals (e.g., because the encapsulation covers antennas 704 and 706). In some embodiments, the encapsulation 762 may be considered as a part of antenna 704 and/or antenna 706, acting like as a dielectric lens in some instances or an impedance match to freespace in other instances.

Other packaging and interconnect techniques may be utilized as well, including ceramic or plastic covers, laminate (PCB) technologies, or any other suitable packaging or interconnect solutions that suitably protect the device from the environment and/or physical damage and that allow for suitable first level connections between the semiconductor die and the antenna and package (e.g., substrate 700) and allow for suitable second level connections between the packaged device and the next level of interconnection (e.g., the system level board of a product into which the micro-localization components are integrated such as, for example, product 200).

Figure 8A:
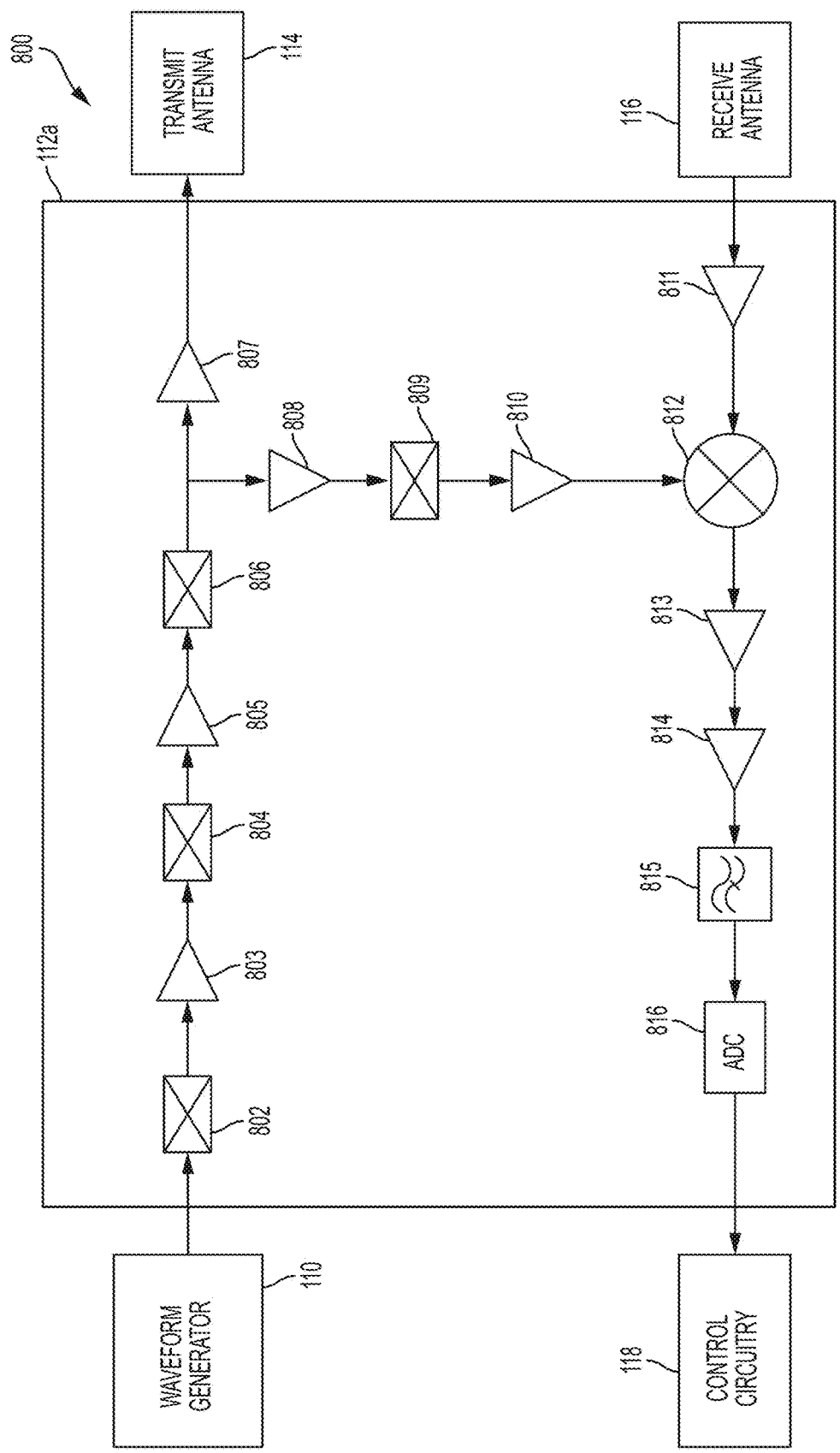
FIG. 8A is a block diagram illustrating components of transmit and receive circuitry part of an interrogator device, in accordance with some embodiments of the technology described herein.

FIG. 8A is a block diagram illustrating components of an interrogator device 800, in accordance with some embodiments of the technology described herein. In the illustrative embodiment of FIG. 8A, interrogator device 800 includes waveform generator 110, transmit and receive circuitry 112a, transmit antenna 114, receive antenna 116, and control circuitry 118. Transmit and receive circuitry 112a includes frequency multipliers 802, 804, 806, and 809, amplifiers 803, 805, 807, 808, 810, 811, 813, and 814, frequency mixer 812, filter 815, and analog-to-digital converter (ADC) 816. Each of the above-identified components of transmit and receive circuitry 112a may be of any suitable type, as aspects of the technology described herein are not limited in this respect.

As shown in FIG. 8A, RF signals generated by waveform generator 110 are processed in a series of three stages prior to being transmitted by transmit antenna 114. In each stage, input RF signals are provided to a frequency multiplier circuit to obtain output signals having frequencies at a harmonic of the frequencies of the input signals (e.g., each frequency multiplier may be a frequency doubler) and the output signals are amplified at least in part to compensate for any loss induced by the nonlinear processing in the frequency multiplier circuit. For example, as shown in FIG. 8A, in the first stage of processing, RF signals generated by waveform generator 110 are provided to frequency multiplier 802 and the RF signals output by frequency multiplier 802 are amplified by amplifier 803. In the second stage of processing, RF signals output by amplifier 803 are provided to frequency multiplier 804 and the RF signals output by the frequency multiplier 804 are amplified by amplifier 805. In the third stage of processing, RF signals output by amplifier 805 are provided to frequency multiplier 806 and the RF signals output by the frequency multiplier 806 are amplified by amplifier 807. The RF signals amplified by amplifier 807 are provided to amplifier transmit antenna 114.

In some embodiments, each of the frequency multipliers 802, 804, and 806 may be a frequency doubler generating output signals whose frequency is twice that of the input signals. In such embodiments, RF signals generated by the waveform generator as having a center frequency of $f_0$ (e.g., 7.5 GHz) are transformed, through operation of frequency multipliers 802, 804, and 806, to have a center frequency of $8f_0$ (e.g., 60 GHz). Although in the illustrated embodiment three frequency doublers are used to increase the frequencies in the RF signals generated by waveform generator 110 by a factor of 8, it should be appreciated that interrogator devices described herein are limited neither by the number of frequency multipliers in the signal path between waveform generator 110 and transmit antenna 114 nor by the multiplication factor induced by each of the frequency multipliers in the signal path. For example, to achieve an "8×" multiplication factor, interrogator 800 may be implemented with two frequency multipliers (instead of three frequency multipliers as shown in FIG. 8A) one of which increases the frequencies of input RF signals by a factor of four, and the other by a factor of two. As another example, interrogator 800 may be implemented with a single frequency multiplier circuit configured to increase the frequencies of input RF signals by a factor of eight.

Figure 8B:
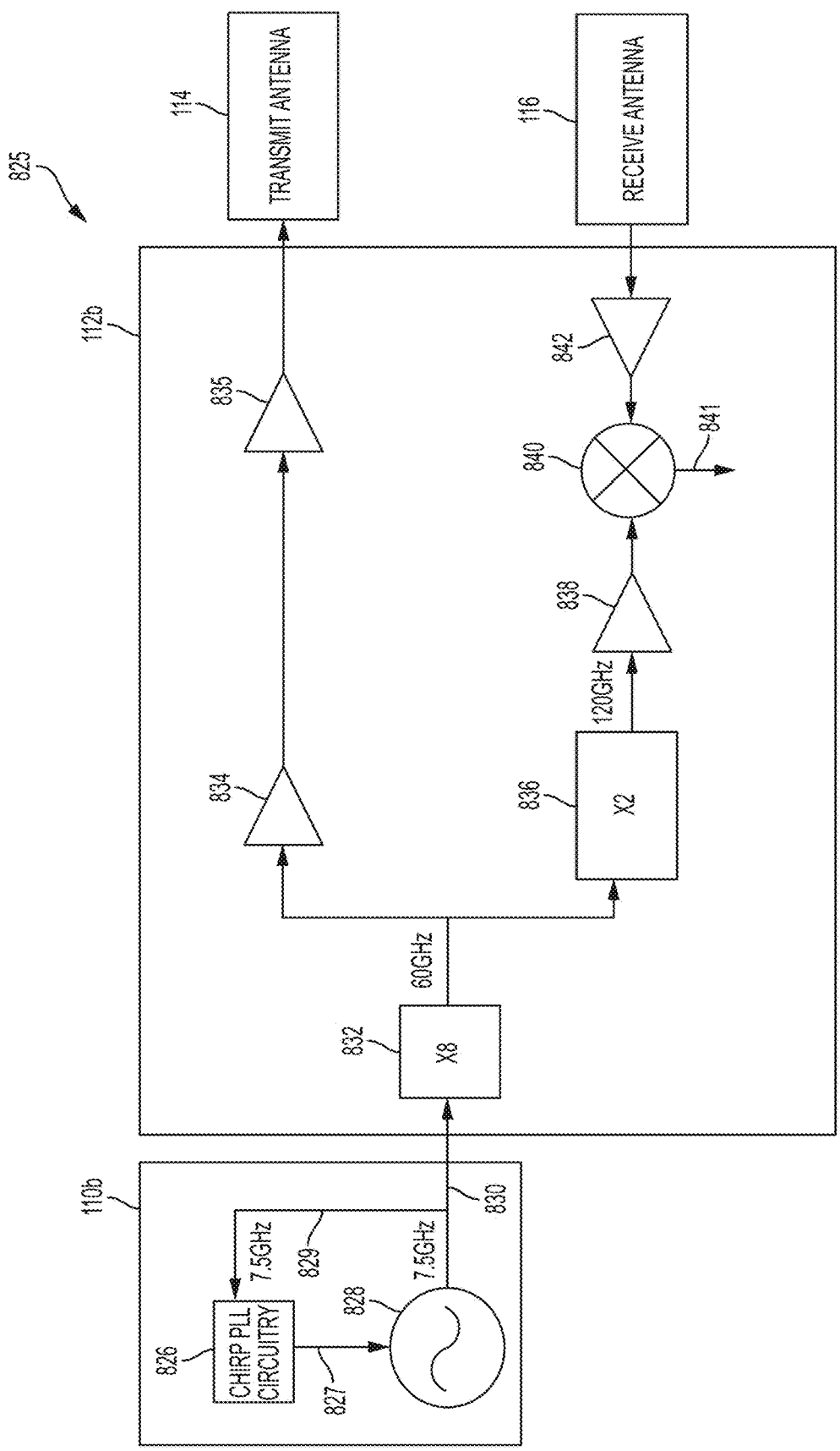
FIG. 8B is a block diagram illustrating components of transmit and receive circuitry part of another interrogator device, in accordance with some embodiments of the technology described herein.

It should also be appreciated that interrogator devices described herein are not limited by the multiplication factor induced to the RF signals generated by the waveform generator 110 by the circuitry in the transmit signal chain between waveform generator 110 and transmit antenna 114. For example, in embodiments where the waveform generator 110 is configured to generate RF signals having a center frequency of $f_0$ and the transmit antenna is configured to transmit RF signals having a center frequency of $kf_0$ (where k is an integer such as, for example, 2, 4, 8, 16, or 32), the circuitry in the transmit signal chain between waveform generator 110 and transmit antenna 114 may be configured to increase the frequency of the RF signals generated by waveform generator by a factor of k. As one example, the circuitry in the transmit signal chain between waveform generator 110 and transmit antenna 114 may be configured to increase the frequency of the RF signals generated by waveform generator by a factor of 8 when waveform generator 110 generates having RF signals having a center frequency of 7.5 GHz and transmit antenna 114 transmits at 60 GHz as shown in FIGS. 8A and 8B. As yet another example, the circuitry in the transmit signal chain between waveform generator 110 and transmit antenna 114 may be configured to increase the frequency of the RF signals generated by waveform generator by a factor of 4 when waveform generator 110 generates having RF signals having a center frequency of 15 GHz and transmit antenna 114 transmits at 60 GHz. As yet another example, the circuitry in the transmit signal chain between waveform generator 110 and transmit antenna 114 may be configured to increase the frequency of the RF signals generated by waveform generator by a factor of 2 when waveform generator 110 generates having RF signals having a center frequency of 30 GHz and transmit antenna 114 transmits at 60 GHz.

In some embodiments, transmit antenna 114 may be configured to transmit RF signals having a first center frequency and the receive antenna 116 may be configured to receive RF signals having a second center frequency different from the first center frequency. For example, the second center frequency may be a harmonic of the first frequency such that the transmit antenna 114 is configured to transmit RF signals having a center frequency of $f_0$ and the receive antenna 116 is configured to receive RF signals having a center frequency of $2f_0$ (or any other suitable harmonic of $f_0$. As one example, the transmit antenna 114 may be configured to transmit RF signals having a center frequency in the range of 4-6 GHz (e.g., 5 GHz) or in the range of 50-70 GHz (e.g., 60 GHz) and the receive antenna 116 may be configured to receive RF signal having a center frequency in the range of 8-12 GHz (e.g., 10 GHz) or in the range of 100-140 GHz (e.g., 120 GHz).

In some embodiments, transmit antenna 114 may be configured to transmit RF signals having one type of polarization and the receive antenna 116 may be configured to receive RF signals having a different type of polarization. As discussed herein, such a configuration may be advantageous in that it serves to reduce the effects of multipath on the signals received by the interrogator device 800 in communication with a target device (e.g., any target device described herein including with reference to FIGS. 9A-9H). For example, the transmit antenna 114 may be configured to transmit RF signals circularly polarized in a first rotational direction and the receive antenna 116 may be configured to receive RF signals circularly polarized in a second rotational directly different (e.g., opposite) from the first rotational direction. As one example, the transmit antenna 114 may be configured to transmit RF signals circularly polarized in a clockwise (or counter-clockwise) direction and the receive antenna 116 may be configured to receive RF signals circularly polarized in the counter-clockwise (or clockwise) direction. Each of transmit antenna 114 and receive antenna 116 may be any suitable type of antenna, examples of which are provided herein. In some embodiments, one or both of transmit antenna 114 and receive antenna 116 may be differentially coupled to transmit and receive circuitry 112a.

As shown in FIG. 8A, RF signals received by receive antenna 116 are amplified by amplifier 811 and mixed, by frequency mixer 812, with a transformed version of RF signals transmitted by transmit antenna 114. In the illustrative embodiment of FIG. 8A, the RF signals output by frequency multiplier 806 are both: (1) amplified by amplifier 807 and, subsequently, provided to transmit antenna 114 for transmission; and (2) transformed by signal transformation chain that includes amplifier 808, frequency multiplier 809, and amplifier 810 and, subsequently, provided to frequency mixer 812 for mixing with RF signals received by receive antenna 116 and amplified by amplifier 811. The mixed RF signals output by frequency mixer 812 are amplified by amplifiers 813 and 814, filtered by filter 815, and digitized by ADC 816 prior to be provided to control circuitry 118.

As discussed herein, in some embodiments, the interrogator device 800 may transmit, to a target device, RF signals having a first center frequency $f_0$ and receive, from the target device, RF signals having a second center frequency, which may be a harmonic of the first center frequency (e.g., $2f_0$). In such embodiments, the target device may be configured to transform RF signals it receives from the interrogator device 800 (i.e., RF signals having the first center frequency) to obtain RF signals having the second center frequency. For this purpose, the target device may comprise signal transformation circuitry (e.g., signal transformation circuitry 124a described below with reference to FIG. 9A) for generating RF signals having the second center frequency from received RF signals having the first center frequency.

As also described herein, interrogator device 800 is configured to use the RF signals that it transmits to a target device and the RF signals it receives from the target device in furtherance of determining the distance between the interrogator device and the target device. Accordingly, in some embodiments, the interrogator device 800 may transform the RF signals it transmits to the target device similarly to how the target device may transform the RF signals it receives from the interrogator device before transmitting them back to the interrogator device. In this way, the transmitted RF signals may be transformed by the interrogator device to have the same center frequency as that of the received signals, which allows for the transformed RF signals and the received RF signals to be mixed using a frequency mixer to obtain a mixed RF signal indicative of the distance between the interrogator device and the target device.

For example, as shown in FIG. 8A, the RF signals transmitted, to a target device (e.g., target device 900 described with reference to FIG. 9A), by interrogator device 800 may be transformed by frequency multiplier 809 similarly to how a frequency multiplier in the target device (e.g., frequency multiplier 908) transforms the RF signals it receives from interrogator device 800. As one example, frequency multiplier 809 and frequency multiplier 908 may each be frequency doublers so that the interrogator device 800: (1) transmits, to target device 900, RF signals having a center frequency $f_0$; (2) transforms the RF signals having a center frequency of $f_0$ to transformed RF signals having a center frequency of $2f_0$; and (3) mixes the transformed RF signals having a center frequency of $2f_0$ with RF signals received from the target device 900, which received RF signals also have a center frequency of $2f_0$, due to the processing performed on the target device (e.g., by frequency multiplier 908).

In the illustrative embodiment of FIG. 8A, transmitted RF signals are transformed using frequency multiplier 809 to obtained transformed RF signals having the same center frequency (e.g., $2f_0$) as the RF signals obtained by receive antenna 116. Thus, the RF signals being mixed by frequency mixer 812, and subsequently digitized by ADC 816, have the center frequency of $2f_0$. In other embodiments, instead of transforming transmitted RF signals, the received RF signals may be transformed instead by a frequency divider circuit to obtain transformed RF signals having the same center frequency (e.g., $f_0$) as the transmitted RF signals. In such embodiments, the RF signals being mixed by frequency mixer 812, and subsequently digitized by ADC 816, have the center frequency of $f_0$, which may reduce the cost and/or improve the performance of the frequency mixer 812 and/or ADC 816.

The interrogator device 800 may be manufactured in any of the ways described herein. For example, in some embodiments, the interrogator device 800 may comprise a substrate (e.g., a printed circuit board) having the transmit antenna 114 and the receive antenna 116 fabricated thereon, and a semiconductor die mounted to the substrate, coupled to the transmit and receive antennas, and having transmit and receive circuitry 112a fabricated thereon. In such embodiments, the transmit and receive circuitry 112a may be integrated circuitry monolithically integrated with the semiconductor die. In some embodiments, the semiconductor die may be flip-chip bonded to the substrate. In some embodiments, the substrate may comprise a printed circuit board having at least one conductive layer, and the transmit antenna 114 and the receive antenna 116 may be fabricated on the substrate by patterning the at least one conductive layer. Although, in some embodiments, one or more portions of the interrogator device (e.g., transmit and receive circuitry 112a) may be part of integrated circuitry fabricated on a semiconductor die, in other embodiments, the same portion(s) may be realized as discrete components on the substrate (e.g., as discrete components mounted on a PCB substrate).

It should be appreciated that the embodiment illustrated in FIG. 8A is illustrative and that there are variations. For example, in some embodiments, there may be zero, one, two, three, or any other suitable number of amplifiers of any suitable type between any pair of circuits shown in FIG. 8A. As another example, there may be zero, one, two, three, or any other suitable number of filters of any suitable type between any pair of circuits shown in FIG. 8A. As another example, although in the illustrated embodiment ADC 816 is part of transmit and receive circuitry 112a so that digitized waveforms are output from the transmit and receive circuitry 112a to control circuitry 118, in other embodiments ADC 816 may not be part of transmit and receive circuitry 112a and, instead, may be further downstream in the processing chain. In such embodiments, analog waveforms may be output from the transmit and receive circuitry 112a to control circuitry 118.

As described herein, waveform generator 110 may be configured to generate any RF signals of any suitable type including frequency-modulated waveforms, in some embodiments. For example, waveform generator 110 may be configured to generate linear frequency modulated waveforms (sometimes termed "chirps" herein). In some embodiments, including the embodiments illustrated in FIGS. 8B, 8C, and 8D, waveform generator 100 may be configured to generate chirps using a closed-loop approach relying on a phase-locked loop (PLL) to generate chirps at a desired frequency.

FIG. 8B is a block diagram of an illustrative interrogator device 825 having waveform generator 110b, transmit and receive circuitry 112b, transmit antenna 114, and receive antenna 116. Waveform generator 110b includes a voltage-controlled oscillator 828 and chirp PLL circuitry 826 configured to drive the voltage-controlled oscillator, via voltage signals on line 827, to generate linear frequency modulated (LFM) RF signals having a center frequency of 7.5 GHz. The generated chirps are provided to chirp PLL circuitry 826 via feedback line 829, and also to transmit and receive circuitry 112b via line 830. The chirp PLL circuitry 826, line 827, VCO 828, and feedback line 829 constitute a chirp phase locked loop.

It should be appreciated that chirp PLL circuitry 826 may be configured to generate chirp waveforms in any of numerous ways including, but not limited to, using a direct digital synthesizer in a so-called "swept reference" approach that is discussed in more detail with reference to FIG. 13A, using an auxiliary input such as a step or an impulse to perturb the phase locked loop in a so-called "feedback loop perturbation" approach that is described in more detail with reference to FIG. 13B, and using digital logic to step the frequency of a PLL in a so-called "stepped frequency" approach that is described in more detail with reference to FIG. 13C.

In the embodiment of FIG. 8B, transmit and receive circuitry 112b includes frequency multiplier circuitry 832, frequency multiplier circuitry 836, amplifiers 834, 835, 838, and 842, and frequency mixer 840. RF signals generated by waveform generator 110b are provided to frequency multiplier circuitry 832 via line 830. The frequency multiplier circuitry 832 may be configured to multiply the frequencies in the input RF signals by any suitable factor (e.g., by a factor of 2, 4, 8, 16, etc.). In the illustrative embodiment of FIG. 8B, the frequency multiplier circuitry 832 is configured to multiply the frequencies in the input RF signals by a factor of eight so that, for example, input RF signals having a center frequency of 7.5 GHz are transformed by frequency multiplier circuitry 832 to RF signals having a center frequency of 60 GHz. Frequency multiplier circuitry 832 may be implemented in any suitable way and, for example, may be implemented using a series of any suitable number of frequency multipliers and amplifiers. For instance, frequency multiplier circuitry may be implemented using a series of frequency multipliers and amplifiers 802-806 described with reference to FIG. 8A.

As shown in FIG. 8B, RF signals output by frequency multiplier circuitry 832 are amplified using amplifiers 834 and 835 and, subsequently, provided to transmit antenna 114, which is configured to transmit microwave RF signals having a center frequency of 60 GHz. RF signals output by frequency multiplier circuitry are also provided to frequency multiplier circuitry 836, which further increases the frequencies in the RF signals by a factor of two (e.g., to match a similar transformation that may be performed by a target device on RF signals transmitted by transmit antenna 114 and received at the target device) to obtain RF signals having a center frequency of 120 GHz. The RF signals output by frequency multiplier circuitry 836 are amplified by amplifier 838 and mixed, using frequency mixer 840, with RF signals received from a target device by receive antenna 116 and amplified by amplifier 842 to obtain mixed RF signals output from frequency mixer 840 on line 841. The mixed RF signals output on line 841 may be indicative of the distance between interrogator device 825 and the target device. The mixed signals output on line 841 may be further processed in any suitable way and, for example, may be processed by one or more amplifiers and/or filters prior to being digitized using an ADC (e.g., as is the case for mixed RF signals produced by frequency mixer 812 described with reference to FIG. 8A).

Although in the illustrative embodiment of FIG. 8B the waveform generator 110b is configured to generate chirped waveforms having a center frequency of 7.5 GHz, this is not a limitation of aspects of the technology described herein, as the waveform generator 110 may be configured to generate chirped waveforms having any suitable center frequency.

As described herein, in some embodiments, an interrogator device may comprise a transmit antenna configured to transmit RF signals having a first center frequency $f_0$ and receive RF signals having a second frequency that is a harmonic of the first center frequency such as, for example, $2f_0$. In such embodiments, the waveform generator part in the interrogator device may be configured to generate RF signals having either the first center frequency or the second center frequency. This allows for alternative transmit and receive circuitry designs including the designs shown in FIGS. 8C and 8D.

Figure 8C:
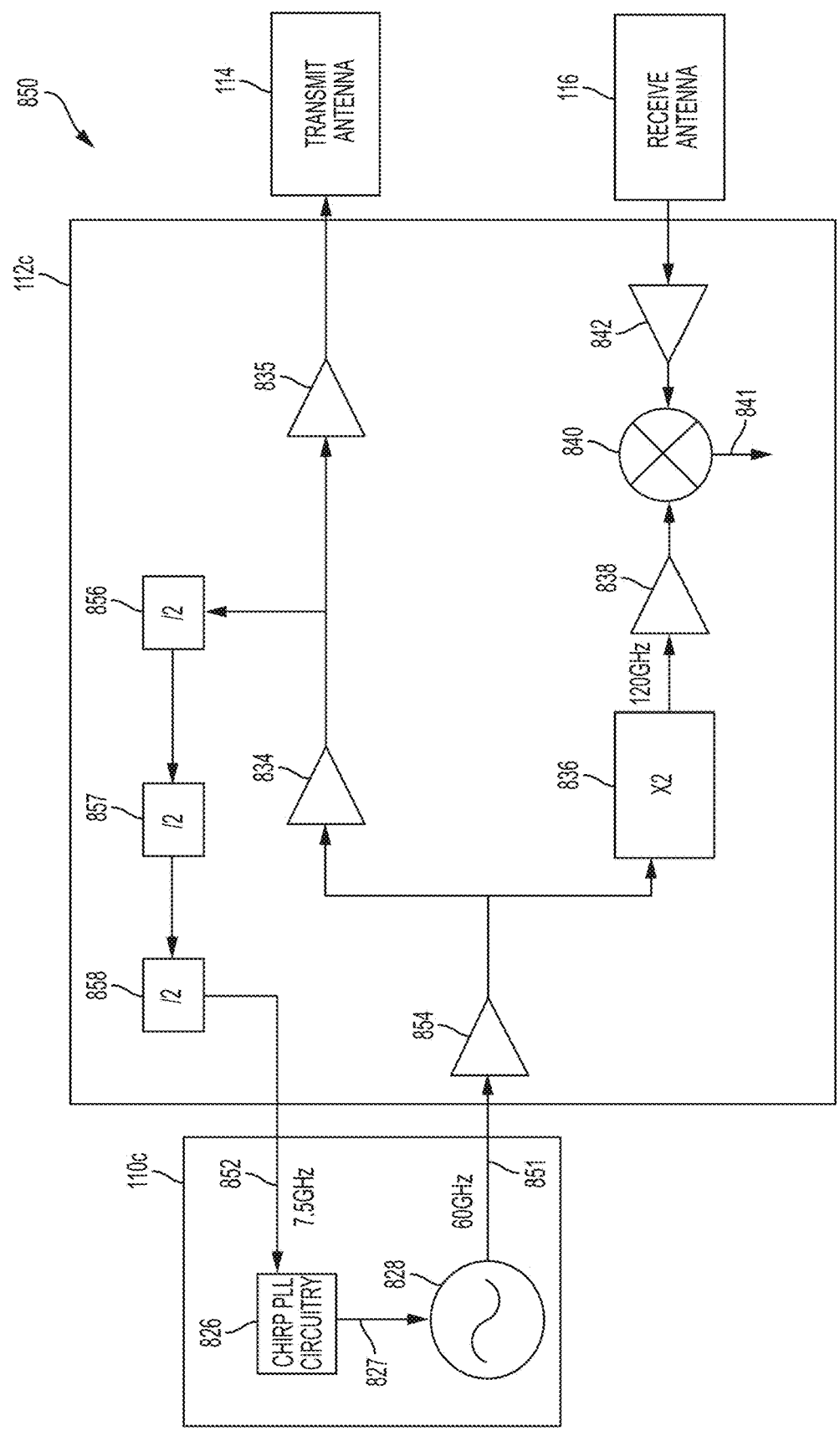
FIG. 8C is a block diagram illustrating components of transmit and receive circuitry part of another interrogator device, in accordance with some embodiments of the technology described herein.

FIG. 8C is a block diagram of an illustrative interrogator device 850 having waveform generator 110c, transmit and receive circuitry 112c, transmit antenna 114, and receive antenna 116. Waveform generator 110c includes a voltage-controlled oscillator 828 and chirp PLL circuitry 826 configured to drive the voltage-controlled oscillator, via voltage signals on line 827, to generate linear frequency modulated (LFM) RF signals having a center frequency of 60 GHz. The generated chirps are provided to transmit and receive circuitry 112c via line 851.

In the embodiment of FIG. 8C, transmit and receive circuitry 112c includes frequency multiplier circuitry 836, amplifiers 854, and 834, 835, 838, and 842, frequency mixer 840, and frequency dividers 856, 857, and 858. Relative to the transmit and receive circuitry 112*b* of FIG. 8B, transmit and receive circuitry 112*c* does not include frequency multiplier 832 because the waveform generator 110*c* generates microwave RF signals having a center frequency of 60 GHz (unlike waveform generator 110*b* that generates microwave RF signals having a center frequency of 7.5 GHz, which needs to be increased by a factor of eight prior to transmission by transmit antenna 14 that is configured to transmit RF signals having a center frequency of 60 GHz). RF signals having a center frequency of 60 GHz and amplified by amplifier 834 not only are provided to amplifier 835 and, subsequently transmit antenna 114, but also to a series of frequency dividers 856, 857, and 858 to provide RF signals having a center frequency of 7.5 GHz, which are provided via line 852 to chirp PLL circuitry 826 thereby providing a feedback loop. Whereas line 829 provided the feedback loop for the chirp PLL in the embodiment of FIG. 8B, the feedback loop in the embodiment of FIG. 8C includes line 851, amplifiers 854 and 834, frequency dividers 856-858 and line 852.

Figure 8D:
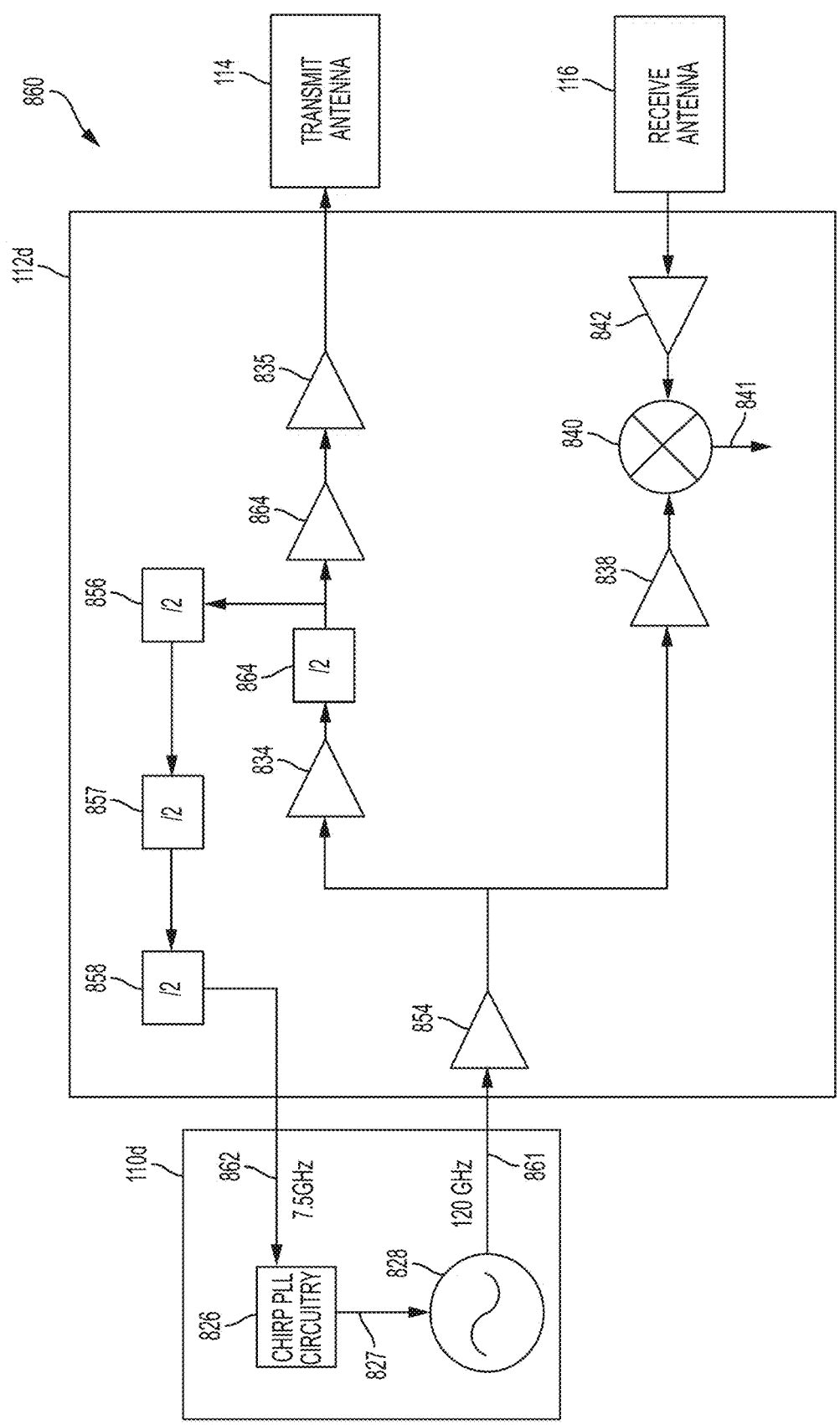
FIG. 8D is a block diagram illustrating components of transmit and receive circuitry part of another interrogator device, in accordance with some embodiments of the technology described herein.

FIG. 8D is a block diagram of an illustrative interrogator device 860 having waveform generator 110*d*, transmit and receive circuitry 112*d*, transmit antenna 114, and receive antenna 116. Waveform generator 110*d* includes a voltage-controlled oscillator 828 and chirp PLL circuitry 826 configured to drive the voltage-controlled oscillator, via voltage signals on line 827, to generate linear frequency modulated (LFM) RF signals having a center frequency of 120 GHz. The generated chirps are provided to transmit and receive circuitry 112*c* via line 861.

In the embodiment of FIG. 8D, transmit and receive circuitry 112*d* includes amplifiers 834, 835, 838, 842, and 866, frequency mixer 840, and frequency dividers 864, and 856, 857, and 858. Relative to the transmit and receive circuitry 112*c* of FIG. 8C, transmit and receive circuitry 112*d* does not include frequency multiplier 836 because the waveform generator 110*d* generates microwave RF signals having a center frequency of 120 GHz (unlike waveform generator 110*c* that generates microwave RF signals having a center frequency of 60 GHz, which needs to be increased by a factor of two prior to being mixed with RF signals received by receive antenna 16 that is configured to transmit RF signals having a center frequency of 120 GHz). RF signals having a center frequency of 120 GHz and amplified by amplifier 834 are provided to frequency divider 864 to obtain RF signals having a center frequency of 60 GHz, which signals are: (1) transmitted by transmit antenna 14 after amplification by amplifiers 866 and 834; and (2) fed back to waveform generator 110*d* via the series of frequency dividers 856, 857, and 858 to provide RF signals having a center frequency of 7.5 GHz, which are provided via line 862 to chirp PLL circuitry 826 thereby providing a feedback loop. Accordingly, in the embodiment of FIG. 8D, the feedback loop includes line 861, amplifiers 854 and 834, frequency dividers 856-858 and 864, and line 862.

As discussed above, in some embodiments, an interrogator device may comprise a waveform generator configured to generate linear frequency modulated (LFM) RF signals (RF chirps). In some embodiments, a waveform generator may be configured to generate RF chirps using a phase locked loop (PLL). Illustrative examples of such a closed loop approach are described below with reference to FIGS. 13A, 13B, and 13C. It should be appreciated, however, that a waveform generator is not limited to using a PLL to generate RF chirps and, for example, may be configured to use an open-loop (non PLL controlled) oscillator to synthesize RF chirps. It should also be appreciated that a waveform generator is not limited to generating RF chirps and may be configured to generate any other suitable RF signals, including any of the RF signals described herein, as aspects of the technology described herein are not limited in this respect.

Figure 13A:
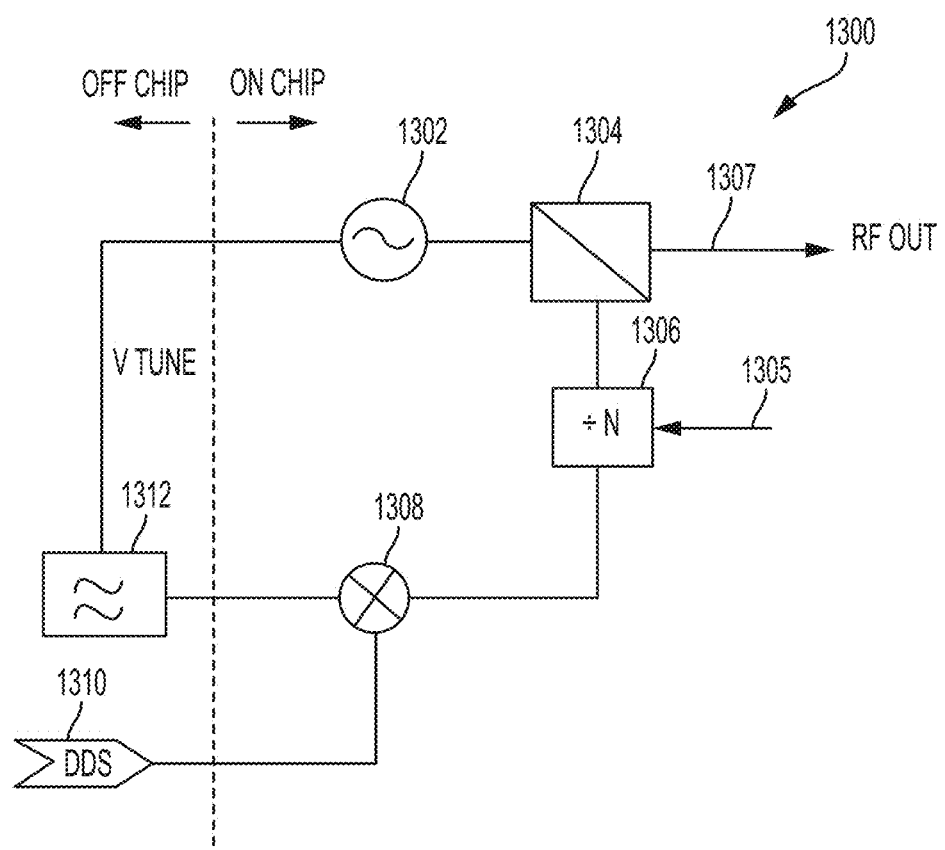
FIG. 13A is a block diagram illustrating waveform generator circuitry configured to generate frequency-modulated waveforms using a phase locked loop, in accordance with some embodiments of the technology described herein.

FIG. 13A is a block diagram illustrating waveform generator circuitry 1300 configured to generate linear frequency modulated waveforms using a phase locked loop, in accordance with some embodiments of the technology described herein. Waveform generator circuitry 1300 may be part of any waveform generator described herein including, by way of example and not limitation, waveform generators 110, 110*b*, 110*c*, and 110*d* described above with reference to FIGS. 8A-D.

The waveform generator circuitry 1300 is configured to generate RF chirps using a direct digital synthesizer 1310 in a so-called "swept reference" approach. As shown in FIG. 13A, waveform generator circuitry 1300 includes a voltage controlled oscillator (VCO) 1302, signal splitter 1304, programmable digital divider 1306 that is programmable by input provided via line 1305, frequency multiplier 1308, direct digital synthesizer 1310, and loop filter 1312. The DDS 1310 operates as a reference oscillator for the resulting phase locked loop.

In some embodiments, the DDS 1310 may be a digital synthesizer that stores (e.g., in a memory part of DDS 1310) values for a digital waveform (e.g., a sinusoid, a chirp, or any other suitable waveform). The DDS 1310 may be configured to "play back" the stored values through a digital to analog converter (DAC). That is, the DDS 1310 may be configured to process the stored values using a DAC, which may be part of the DDS 1310 in some embodiments, and output the resulting analog values. The rate at which the DDS 1310 outputs the stored values for the digital waveform may determine its output frequency. In some embodiments, the DDS 1310 may be chirp-modulated above and below a center reference clock frequency, thereby causing the output of the VCO 1302 to chirp at its carrier frequency. The DDS 1310 may be chirp modulated in any of a variety of ways. For example, in some embodiments, the DDS 1310 may store a fixed-frequency sinusoid and modulate the rate at which it is played back. Modulating the rate of playback linearly over the length of the sinusoid results in a chirp being generated by the DDS 1310. In other embodiments, the DDS 1310 may simply store a chirp and play it back at a fixed playback rate. The output of DDS 1310 is multiplied-up in the PLL thereby providing a chirp at the microwave frequency of interest at the RF Out line 1307.

In some embodiments, waveform generator circuitry 1300 may be generated at least in part on a semiconductor die. For example, as shown in FIG. 13A, oscillator 1302, signal splitter 1304, programmable digital divider 1306, and frequency mixer 1308 may be realized as integrated circuitry fabricated on a semiconductor die part of the interrogator. On the other hand, direct digital synthesizer 1310 and loop filter 1312 may be implemented off the semiconductor die, for example, as discrete components on a substrate. However, in other embodiments, all, none or a different subset of the components of waveform circuitry 1300 may be realized as integrated circuitry fabricated on a semiconductor die part of the interrogator.

Figure 13B:
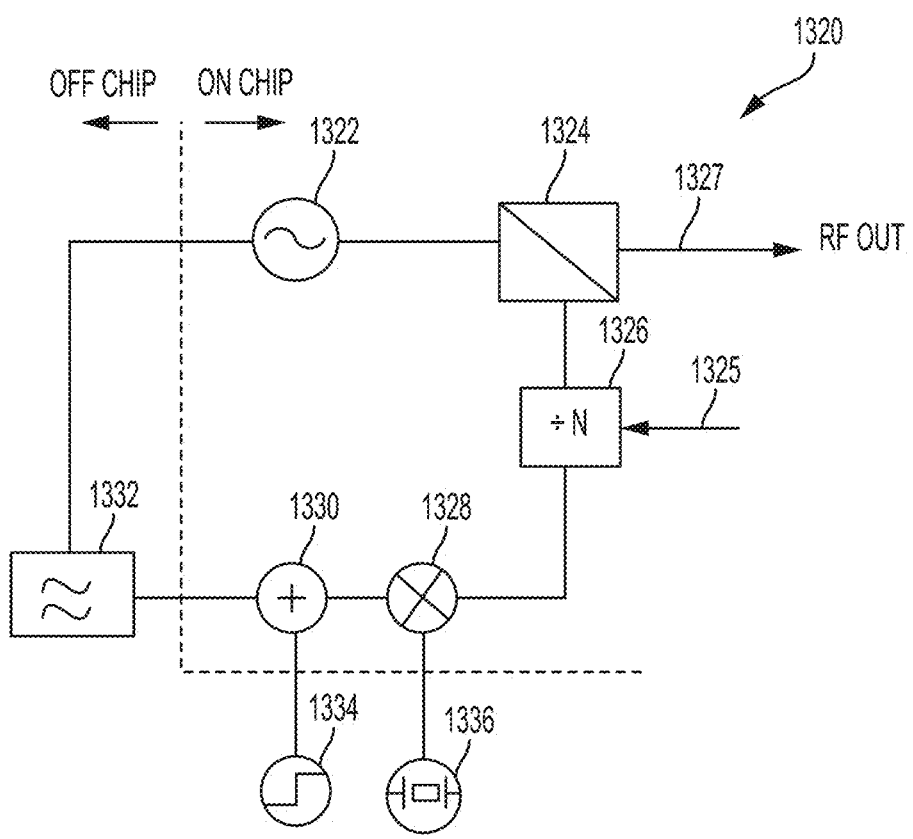
FIG. 13B is a block diagram illustrating another type of waveform generator circuitry configured to generate frequency-modulated waveforms using a phase locked loop, in accordance with some embodiments of the technology described herein.

FIG. 13B is a block diagram illustrating waveform generator circuitry 1320 configured to generate frequency-modulated waveforms using a phase locked loop, in accordance with some embodiments of the technology described herein. Waveform generator circuitry 1320 may be part of any waveform generator described herein including, by way of example and not limitation, waveform generators 110, 110b, 110c, and 110d described above with reference to FIGS. 8A-D.

The waveform generator circuitry 1320 is configured to generate RF chirps using an auxiliary input such as a step or an impulse to perturb the phase locked loop in a so-called "feedback loop perturbation" approach. As shown in FIG. 13B, waveform generator circuitry 1320 includes a voltage controlled oscillator (VCO) 1322, signal splitter 1324, programmable digital divider 1326 that is programmable by input provided via line 1325, frequency multiplier (sometimes termed "phase comparator") 1328, summation block 1330, and loop filter 1332. Additionally, waveform generator circuitry includes a fixed frequency reference oscillator 1336 (e.g., a quartz crystal) and a step/impulse generator 1334. The summation block 1330 is within the PLL so that a step and/or impulse generated by step/impulse generator 1334 may be fed directly into the loop thereby perturbing the loop to sweep up to a desired frequency then correct-back-down to its programmed frequency. This perturbation in the feedback loop would cause an up-then-down chirp, relying on a second order transfer function of the loop filter 1332 so that the output provided on line 1327 is a linear chirp. This feedback loop perturbation technique may be less precise than the PLL techniques described with reference to FIGS. 13A and 13C, but may be cheaper to implement.

In some embodiments, waveform generator circuitry 1320 may be fabricated at least in part on a semiconductor die. For example, as shown in FIG. 13B, oscillator 1322, signal splitter 1324, programmable digital divider 1326, and frequency mixer 1328, and summation block 1330 may be realized as integrated circuitry fabricated on a semiconductor die part of the interrogator. On the other hand, loop filter 1332, step/impulse generator 1334, and fixed-frequency reference oscillator 1336 may be implemented off the semiconductor die, for example, as discrete components on a substrate. However, in other embodiments, all, none or a different subset of the components of waveform circuitry 1320 may be realized as integrated circuitry fabricated on a semiconductor die part of the interrogator.

Figure 13C:
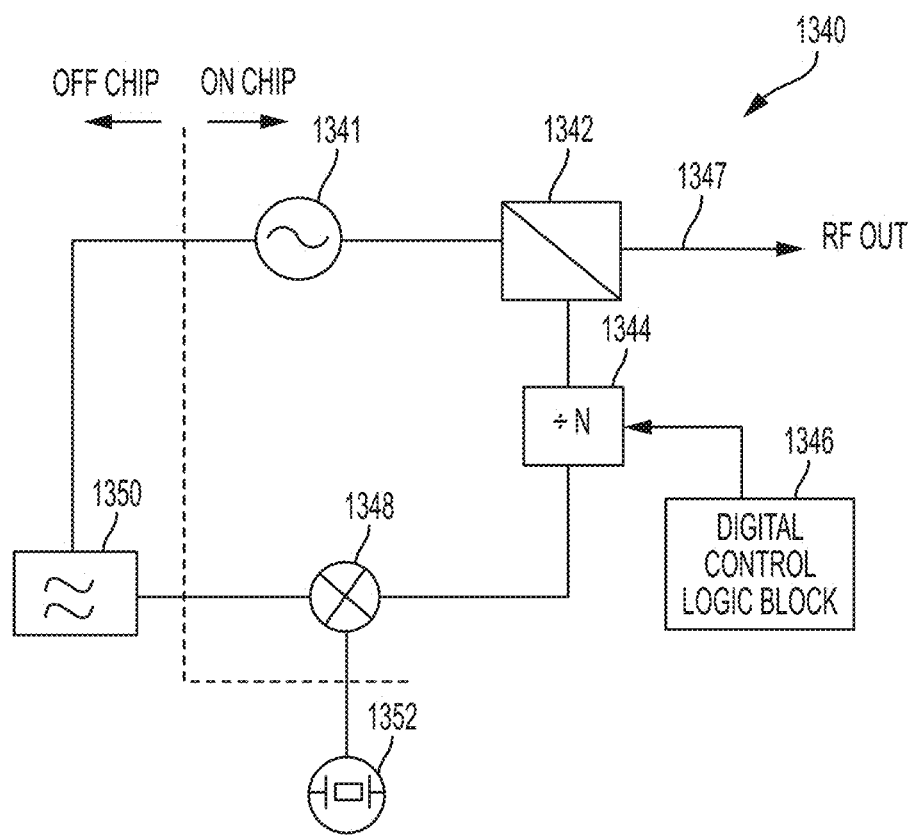
FIG. 13C is a block diagram illustrating another type of waveform generator circuitry configured to generate frequency-modulated waveforms using a phase locked loop, in accordance with some embodiments of the technology described herein.

FIG. 13C is a block diagram illustrating waveform generator circuitry 1340 configured to generate frequency-modulated waveforms using a phase locked loop, in accordance with some embodiments of the technology described herein. Waveform generator circuitry 1340 may be part of any waveform generator described herein including, by way of example and not limitation, waveform generators 110, 110b, 110c, and 110d described above with reference to FIGS. 8A-D.

The waveform generator circuitry 1340 is configured to generate RF chirps using digital logic to step the frequency of a PLL in a so-called "stepped frequency" approach. As shown in FIG. 13C, waveform generator circuitry 1340 includes a voltage controlled oscillator (VCO) 1341, signal splitter 1342, programmable digital divider 1344 that is coupled to digital control logic block 1346, frequency multiplier 1348, fixed-frequency reference oscillator 1352 (e.g., a quartz crystal), and loop filter 1350. The frequency of the PLL in waveform generator circuitry 1340 may be digitally stepped by commands sent to programmable digital divider 1344 from the digital control logic block 1346 (or another device such as a microprocessor or FPGA). These frequency step commands may be linear steps in frequency. The second-order response of loop filter 1350 may smooth over the frequency steps so that the output provided on line 1347 is a smooth linear FM chirp.

In some embodiments, waveform generator circuitry 1340 may be fabricated at least in part on a semiconductor die. For example, as shown in FIG. 13C, oscillator 1341, signal splitter 1342, programmable digital divider 1344, digital control logic block 1346, and frequency mixer 1348 may be realized as integrated circuitry fabricated on a semiconductor die part of the interrogator. On the other hand, loop filter 1350 and fixed-frequency reference oscillator 1352 may be implemented off the semiconductor die, for example, as discrete components on a substrate. However, in other embodiments, all, none or a different subset of the components of waveform circuitry 1340 may be realized as integrated circuitry fabricated on a semiconductor die part of the interrogator. For example, in some embodiments, digital control logic block 1346 may be implemented off chip.

FIG. 9A is a block diagram illustrating components of a target device 900, in accordance with some embodiments of the technology described herein. In the illustrative embodiment of FIG. 9A, target device 900 includes receive antenna 122, signal transformation circuitry 124a, and transmit antenna 126. The output of receive antenna 122 is coupled, via line 902, to an input of signal transformation circuitry 124a. The output of signal transformation circuitry 124a is coupled, via line 914, to transmit antenna 126.

As shown in FIG. 9A, signal transformation circuitry 124a includes amplifier 904, frequency multiplier 908, and amplifier 912. Signals output by receive antenna 122 may be provided to amplifier 904 via line 902. The amplifier 904 amplifies signals received via line 902 and provides the amplified signals to frequency multiplier 908 via line 906. The frequency multiplier 908 generates output signals whose frequency is a multiple of the frequency of the input signals received via line 906 and provides the output signals to amplifier 912 via line 910. The amplifier 912 amplifies signals received via line 910 and provides the amplified signals to the transmit antenna 126 via line 914.

In some embodiments, frequency multiplier 908 may receive input signals having a center frequency of $f_0$ and generate output signals having a center frequency that is an integer multiple of $f_0$. For example, frequency multiplier 908 may receive input signals having a center frequency of $f_0$ and generate output signals having a center frequency of $2f_0$, $3f_0$, $4f_0$, $8f_0$, $10f_0$, or any other suitable integer multiple of $f_0$, as aspects of the technology described herein are not limited in this respect. As one example, in some embodiments, frequency multiplier 908 may receive input signals having a center frequency in a range of 50-70 GHz (e.g., 61.25 GHz) and generate output signals having a center frequency in a range of 100-140 GHz (e.g., 122.5 GHz). As another example, in some embodiments, frequency multiplier 908 may receive input signals having a center frequency in a range of 4-6 GHz (e.g., 5 GHz) and generate output signals having a center frequency of 8-12 GHz (e.g., 10 GHz).

In some embodiments, frequency multiplier 908 may be implemented as a cascade of frequency multipliers, which cascade may include one or more amplifiers, isolators, and/or one or more filters between successive frequency multipliers. For example, in some embodiments, frequency multiplier 908 may be configured to output signals having a center frequency that is four times the center frequency of the input signals provided to frequency multiplier 908. In such an example, frequency multiplier may be implemented as a single "4x" frequency multiplier or a sequence of two "2x" frequency multipliers, each of which is configured to output signals having a center frequency that is double the center frequency of the input signals provided to it. One or more amplifiers and/or filters may be provided between the "2×" frequency multipliers.

In some embodiments, frequency multiplier 908 may include a non-linear circuit. The non-linear circuit may distort input signals provided to frequency multiplier 908 to generate signals having center frequencies that are multiples of the center frequencies of the input signals. Additionally, frequency multiplier 908 may include one or more (e.g., bandpass) filters for selecting a desired center frequency for the output signals (e.g., a desired harmonic frequency) and removing the fundamental and/or one or more other harmonic frequency components from the non-linearly distorted signals.

In some embodiments, the non-linear circuit in a frequency multiplier 908 may be a diode. Frequency multiplier 908 may be any suitable type of diode frequency multiplier. For example, in some embodiments, frequency multiplier 908 may be a Schottky diode, a silicon diode, a varistor-type diode frequency multiplier, a varactor-type frequency multiplier, a step recover diode frequency multiplier, or a PIN diode frequency multiplier, any (e.g., all) of which may or may not be biased with a quiescent bias current.

In the illustrated embodiment of FIG. 9A, each of amplifiers 904 and 912 may be of any suitable type and may be used to induce any suitable amount of gain to the input signals. In some embodiments, the gain of amplifier 904 may be greater than the gain of amplifier 912, and, in some instances, may be significantly greater than the gain of amplifier 912. For example, the gain of amplifier 904 may be at least 10, 20, 30, 40, 50, or 100 times the gain of amplifier 912. Having amplifier 904 induce a greater amount of gain than amplifier 912 provides as much drive power as possible to the frequency multiplier. In addition, less power is needed to induce power gain at lower frequencies (before the signals pass through a frequency multiplier) than to induce the same amount of power gain at higher frequencies (after the signals pass through the frequency multiplier). Thus, inducing a greater amount of gain via amplifier 904, reduces the overall power consumption requirements of the signal transformation circuitry, which is advantageous.

As may be appreciated from FIG. 9A, the inclusion of frequency multiplier 908 in the signal transformation circuitry 124a causes RF signals output to transmit antenna 126, via line 914, to have higher frequencies than the RF signals input from the receive antenna 122, via line 902. Accordingly, in some embodiments, receive antenna 122 may be configured to receive RF signals having a first center frequency and transmit antenna 126 may be configured to transmit RF signals having a second center frequency different from the first center frequency. For example, the second center frequency may be a harmonic of the first frequency. As a specific example, the second center frequency may be twice the first center frequency (e.g., when the frequency multiplier 908 receives input signals having a center frequency of $f_0$ and generates output signals having a center frequency of $2f_0$).

In some embodiments, the receive antenna 122 may be configured to receive RF signals having one type of polarization and the transmit antenna 126 may be configured to transmit RF signals having a different type of polarization. As discussed herein, such a configuration may be advantageous in that it serves to reduce the effects of multipath on the signals received by an interrogator device in communication with target device 900. For example, the receive antenna 122 may be configured to receive RF signals circularly polarized in a first rotational direction and the transmit antenna 126 may be configured to transmit RF signals circularly polarized in a second rotational direction different (e.g., opposite) from the first rotational direction. As a specific example, the receive antenna 122 may be configured to receive RF signals circularly polarized in a clockwise (or counter-clockwise) direction and the transmit antenna 126 may be configured to receive RF signals circularly polarized in the counter-clockwise (or clockwise) direction. Each of receive antenna 122 and transmit antenna 126 may be any suitable type of antenna, examples of which are provided herein.

The target device 900 may be manufactured in any of the ways described herein. For example, in some embodiments, the target device 900 may comprise a substrate (e.g., a printed circuit board) having the receive antenna 122 and transmit antenna 126 fabricated thereon, and a semiconductor die mounted to the substrate, coupled to the receive and transmit antennas, and having signal transformation circuitry 124a fabricated thereon. In such embodiments, signal transformation circuitry 124a may be integrated circuitry monolithically integrated with the semiconductor die. In some embodiments, the semiconductor die may be flip-chip bonded to the substrate. In some embodiments, the substrate may comprise a printed circuit board having at least one conductive layer, and the receive antenna 122 and the transmit antenna 126 may be fabricated on the substrate by patterning the at least one conductive layer. Although, in some embodiments, one or more portions of the target device (e.g., signal transformation circuitry 124a) may be part of integrated circuitry fabricated on a semiconductor die, in other embodiments, the same portion(s) may be realized as discrete components on the substrate (e.g., as discrete components mounted on a PCB substrate).

It should be appreciated that the embodiment illustrated in FIG. 9A is illustrative and that there are variations. For example, although in the illustrated embodiment a single amplifier 904 is shown between receive antenna 122 and frequency multiplier 908, in other embodiments there may be zero, two, three, four, five or more amplifiers between receive antenna 122 and frequency multiplier 908. As another example, although in the illustrated embodiment, a single amplifier 912 is shown between frequency multiplier 908 and transmit antenna 126, in other embodiments there may be zero, two, three, four, five or more amplifiers between frequency multiplier 908 and transmit antenna 126. In some embodiments, the number and gain of the amplifiers in the signal chain from receive antenna 122 to transmit antenna 126 may be determined based on an overall amount of gain desired to induce to the signal and in view of an amount of loss induced by the frequency multiplier 908. For example, in some embodiments, a frequency multiplier (e.g., multiplier 908) may induce a 6 dB-12 dB loss to the power of the signals, and one or multiple amplifiers (e.g., amplifiers 904 and 912) that provide at least 30 dB of gain overall may be introduced into the signal chain between receive antenna 122 and transmit antenna 126.

As another example of a variation of the embodiments shown in FIG. 9A, there may be one or more filters between any pair of circuits along the signal path from receive antenna 122 to transmit antenna 126. As yet another example, in the embodiment of FIG. 9A receive antenna 122 and transmit antenna 126 are each coupled to signal transformation circuitry 124a using single lines 902 and 914, respectively. However, in other embodiments, one or both of receive antenna 122 and transmit antenna 126 may be differentially coupled to signal transformation circuitry 124a. One such embodiment is shown in FIG. 9B, where both antennas are differentially coupled to the signal transformation circuitry.

In the illustrative embodiment of FIG. 9B, target device 915 includes receive antenna 122, signal transformation circuitry 124b, and transmit antenna 126. Receive antenna 122 is differentially coupled, via lines 916a and 916b, to inputs of signal transformation circuitry 124b. Transmit antenna 126 is differentially coupled to signal transformation circuitry 124b, whereby outputs of signal transformation circuitry 124b are provided, via lines 928a and 928b, to transmit antenna 126. Receive antenna 122 may be any suitable type of receive antenna, examples of which are provided herein. Transmit antenna 126 may be any suitable type of transmit antenna, examples of which are provided herein.

As shown in FIG. 9B, signal transformation circuitry 124b includes differential amplifier 918, frequency multiplier 922, and differential amplifier 926. Signals output by receive antenna 122 may be provided to differential amplifier 918 via lines 916a and 916b. The differential amplifier 918 may amplify the difference between signals received via line 916a and 916b, and may provide the resulting amplified signal to frequency multiplier 922 via line 920. The frequency multiplier 922 may generate output signals whose frequency is a multiple of the frequency of the input signals received via line 920, and may provide the output signals to differential amplifier 926 via line 924a. The differential amplifier 912 may receive input signals via line 924a and ground 924b, and may amplify the difference between the received signals and provide the amplified signals to the transmit antenna 126 via lines 928a and 928b.

In the illustrated embodiment of FIG. 9B, frequency multiplier 922 may be of any suitable type including any of the types described with reference to frequency multiplier 908 shown in FIG. 9A. Each of amplifiers 918 and 926 may be of any suitable type and may be used to induce any suitable amount of gain to the input signals.

In the embodiment of FIG. 9A, none of the components in the signal chain from receive antenna 122 to transmit antenna 126 are differentially coupled. On the other hand, in the embodiment of FIG. 9A, multiple components in the signal chain are differentially coupled. It should be appreciated the embodiments of FIGS. 9A and 9B are illustrative examples of ways in which components in the target device signal processing circuitry may be coupled, and that any suitable pairs of consecutive components in the signal processing chain from receive antenna 122 to transmit antenna 126 may be differentially coupled to one another. For example, in some embodiments, none, one, or more than one of the following pairs of components may be differentially coupled: receive antenna 122 and amplifier 918, amplifier 918 and frequency multiplier 922, frequency multiplier 922 and amplifier 926, amplifier 926 and transmit antenna 126. Additionally, to the extent the signal chain between receive antenna 122 and transmit antenna 126 includes one or more other components (e.g., one or more amplifiers and/or filters), none, one, or multiple of these components may be differentially coupled to other components in the signal chain.

The target device 915 may be manufactured in any of the ways described herein including in any of the ways described with reference to target device 900. For example, in some embodiments, the target device 915 may comprise a substrate having the receive antenna 122 and transmit antenna 126 fabricated thereon, and a semiconductor die mounted to the substrate, coupled to the receive and transmit antennas, and having signal transformation circuitry 124b fabricated thereon. In such embodiments, signal transformation circuitry 124b may be integrated circuitry monolithically integrated with the semiconductor die.

Figure 9C:
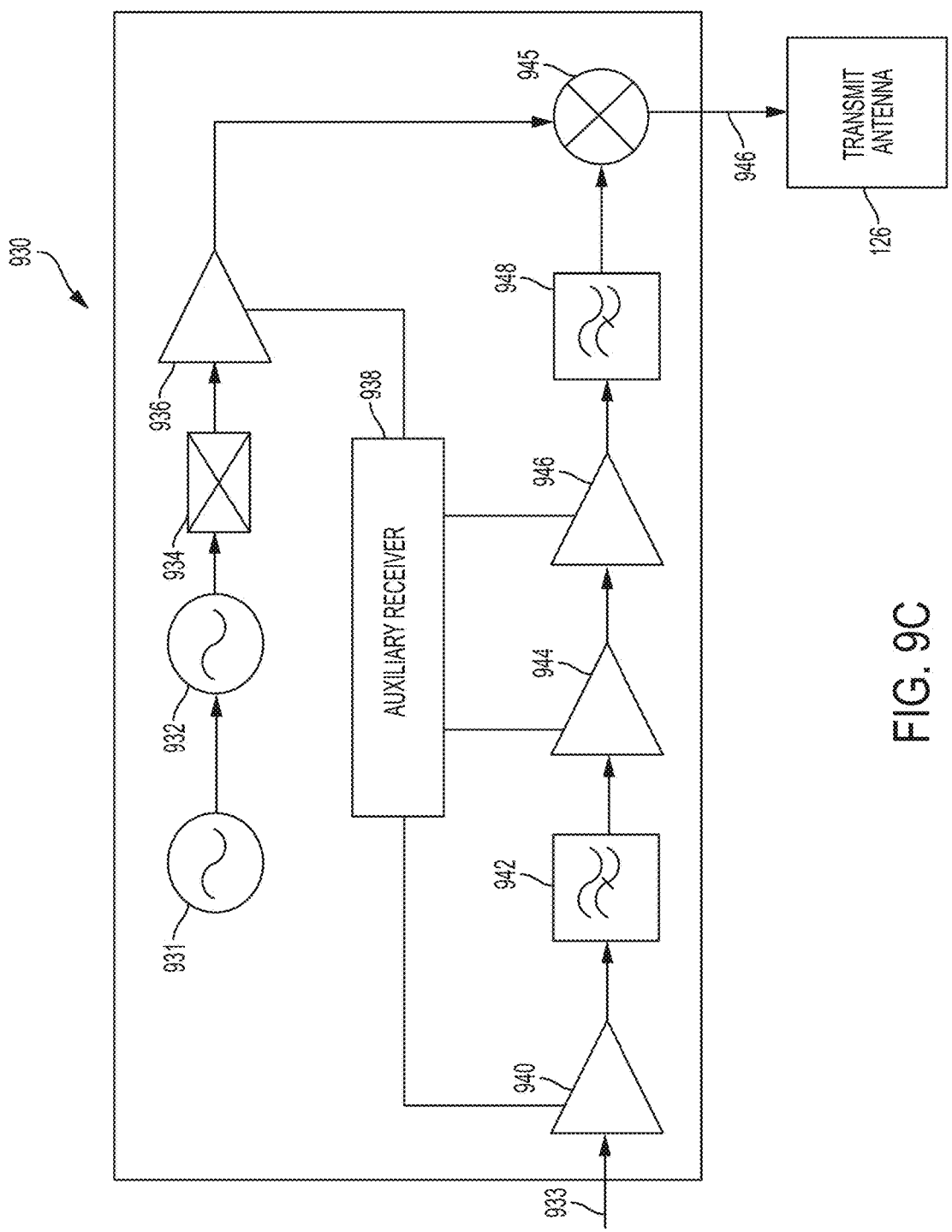
FIG. 9C is a block diagram illustrating components of another type of target device, in accordance with some embodiments of the technology described herein.

FIG. 9C is a block diagram illustrating components of a target device 930, in accordance with some embodiments of the technology described herein. In the illustrative embodiment of FIG. 9C, target device 930 includes receive antenna 122, signal transformation circuitry 124c, and transmit antenna 126. The output of receive antenna 122 is coupled, via line 933, to an input of signal transformation circuitry 124c. The output of signal transformation circuitry 124c is coupled, via line 946, to transmit antenna 126. Receive antenna 122 may be any suitable type of receive antenna, examples of which are provided herein. Transmit antenna 126 may be any suitable type of transmit antenna, examples of which are provided herein.

Signal transformation circuitry 124c may be configured to: (1) transform the frequency content of signals received from receive antenna 122 by mixing the received signals with signals generated, using the target device, using one or more local oscillators; and (2) provide the transformed signals to transmit antenna 126. For example, signals received via receive antenna 122 and having a center frequency of $f_0$ may be mixed with signals generated by a local oscillator part of the signal transformation circuitry 124c and having a center frequency of $f_1$ to generate signals (heterodynes) having a center frequency of $f_0+f_1$. Signal transformation circuitry 124c may be configured to generate signals having any suitable center frequency $f_1$, and for example, may be configured to generate signals having center frequency $f_0$ (or other multiple of $f_0$) such that once they are mixed with signals received by receive antenna 122, the resulting signals will have a frequency of $2f_0$ (or any other multiple of $f_0$). For example, signal transformation circuitry may be configured to generate signals having a center frequency in the range of 50-70 GHz (e.g., 61.25 GHz) that, when mixed with signals received by receive antenna 122 having a center frequency also in the range of 50-70 GHz (e.g., 61.25 GHz), produce signals having a center frequency in the range of 100-140 GHz (e.g., 122.5 GHz).

As shown in FIG. 9C, RF signals output by receive antenna 122 may be provided, via line 933, to amplifier 940, which may amplify the signals and provide the amplified signals to filter 942. Filter 942 may be a high-pass or any other suitable type of filter and may filter signals received from amplifier 940 and provide the filtered signals to amplifiers 944 and 946. Signals amplified by amplifiers 944 and 946 may be filtered by filter 948 and subsequently provided to one of the inputs of frequency mixer 945. The other input of frequency mixer 945 receives signals generated by the signal chain that begins with signals generated by local oscillator 932. The signals output by local oscillator 932 may be provided to frequency multiplier 934 and subsequently to amplifier 936. Signals amplified by amplifier 936 are provided to frequency mixer 945.

In some embodiments, a single local oscillator 932 (of any suitable type) may be used to generate signals for mixing with signals obtained via receive antenna 122. In other embodiments, multiple oscillators may be used to generate such signals. For example, in some embodiments, including the embodiment illustrated in FIG. 9C, increased stability in the signal generated by local oscillator 932 may be obtained by coupling local oscillator 932 to a controlled local oscillator 931. Controlled local oscillator 931 may be an oven-controlled oscillator, a temperature-controlled oscillator, and/or any other suitable type of controlled oscillator. In such embodiments, local oscillator 932 may comprise a phase-locked loop having output of the controlled oscillator 931 as the reference signal such that the phases of signals produced by local oscillator 932 are synchronized with the phases of signals produced by controlled local oscillator 931. The frequency of signals produced by local oscillator 932 may be a multiple of the frequency of signals produced by controlled local oscillator 931.

In the illustrated embodiment of FIG. 9C, each of amplifiers 936, 940, 944, 946 may be of any suitable type and may be used to induce any suitable amount of gain to the input signals. Frequency multiplier 934 may be of any suitable type including any of the types described with reference to frequency multiplier 908 with reference to FIG. 9A. Each of filters 942 and 948 may be of any suitable type (e.g., high-pass, low-pass, and band-pass). Frequency mixer 945 may be of any suitable type and may be implemented using one or more non-linear elements such as by using one or more diodes.

In some embodiments, target device 930 may have multiple modes including an "awake" mode and a "sleep" mode. During the awake mode, the target device 930 may be configured to receive signals via receive antenna 122, transform the received signals using signal transformation circuitry 124c, and transmit the transformed signals via transmit antenna 126. During the sleep mode, one or more components of the target device 930 may be turned off such that the target device does not transmit signals via transmit antenna 126.

In some embodiments, the target device 930 may be configured switch between the awake and sleep modes in response to a communication received from an external device. In the illustrative embodiment of FIG. 9C, for example, the auxiliary receiver 938 may be configured to receive a communication from an external device and, in response to the communication, turn off one or more of the amplifiers 936, 942, 944, and 946, thereby putting target device 930 into sleep mode. It should be appreciated that although in the illustrative embodiment of FIG. 9C, auxiliary receiver 938 is shown as part of signal transformation circuitry 124c, in other embodiments, auxiliary receiver 938 may be part of any other suitable circuitry of the target device. For example, in some embodiments, target device 930 may include control circuitry (e.g., control circuitry 128 described with reference to FIG. 2) and/or an external communications module (e.g., external communications module 130 described with reference to FIG. 2) and auxiliary receiver 938 may be part of the control circuitry or the external communications module. Auxiliary receiver 938 may be of any suitable type and, for example, may be a ZigBee compatible module such that the auxiliary receiver 938 is configured to communicate according to one or more IEEE 802.15.4-based communication protocols.

The target device 930 may be manufactured in any of the ways described herein including in any of the ways described with reference to target device 900. For example, in some embodiments, the target device 930 may comprise a substrate having the receive antenna 122 and transmit antenna 126 fabricated thereon, and a semiconductor die mounted to the substrate, coupled to the receive and transmit antennas, and having at least some (e.g., all) of signal transformation circuitry 124c fabricated thereon. In such embodiments, signal transformation circuitry 124c may be integrated circuitry monolithically integrated with the semiconductor die. In some embodiments, all of signal transformation circuitry 124c may be fabricated on the semiconductor die. In other embodiments, one or more components of signal processing circuitry 124c (e.g., reference oscillator 931) may be on the substrate but off the die. In yet other embodiments, no semiconductor die may be used. For example, in some embodiments, each of the components of signal processing circuitry 124c may be realized as discrete components coupled to a substrate, such as a printed circuit board, for example.

It should be appreciated that the embodiment of FIG. 9C is illustrative and that there are variations. For example, each instance of an amplifier in the signal transformation circuitry 124c may be replaced by zero, two, or more than two amplifiers in other embodiments. As one specific example, although there is a single amplifier 936 between frequency multiplier 934 and frequency mixer 945 in the embodiment of FIG. 9C, there may be zero or multiple amplifiers between the frequency multiplier 934 and frequency mixer 945 in other embodiments. As another example, the signal chain between receive antenna 122 and frequency mixer includes three amplifiers and two filters in the embodiment of FIG. 9C, other embodiments may include any suitable number amplifiers and/or filters arranged in any suitable way, as aspects of the technology described herein are not limited in this respect. As another example, although there is a single frequency multiplier 934 in the signal chain from local oscillator 932 to frequency mixer 945, there may be zero or multiple frequency mixers in this chain depending on the frequency of signals generated by local oscillator 932 and the desired frequency of signals output by frequency mixer 945. As another example, any two consecutive components in target device 930 may be differentially coupled. For example, each of receive antenna 122 and transmit antenna 126 may be differentially coupled to signal transformation circuitry 126c.

As may be appreciated from the foregoing, in some embodiments, RF signals received by receive antenna 122 and having a first center frequency (e.g., $f_1$=5.5 GHz) may be mixed with RF signals generated onboard target device 930 and having a second center frequency (e.g., $f_2$=18.5 GHz) to obtain RF signals having a third center frequency that is the sum of the first and second center frequencies (e.g., $f_3=f_2+f_1$=24 GHz). In such embodiments, the output of the frequency mixer 945 is the heterodyne signal corresponding to the sum of the frequencies of the input signals. In other embodiments, however, RF signals received by receive antenna 122 and having a first center frequency (e.g., $f_1$=5.5 GHz) may be mixed with RF signals generated onboard target device having a second center frequency (e.g., 29.5 GHz) to obtain RF signals having a third center frequency that is the difference of the first and second center frequencies (e.g., $f_3=f_2-f_1$=24 GHz). In such embodiments, the output of the frequency mixer 945 is the heterodyne signal corresponding to the difference of the frequencies of the input signals.

Another variation of the embodiment of FIG. 9C is one in which target device 930 further comprises an automatic frequency control circuit (AFC) to compensate for any drift in the frequency generated by one or more oscillators onboard the target device (e.g., oscillator 932). The AFC circuit may be configured to sense the difference between the actual oscillator frequency and the frequency that is desired and produces, based on this sensed difference, a control voltage proportional to the difference. In turn, the control voltage may be used to compensate for any drift in the frequency generated by one or more oscillators onboard the target device, which drift may result from variations in temperature, loading, and/or for any other reason. Any suitable AFC circuit may be used as part of target device 930, as aspects of the technology described herein are not limited in this respect. Additionally, in some embodiments, any suitable AFC circuit may be used as part of an interrogator that interrogates target device 930.

Figure 9D:
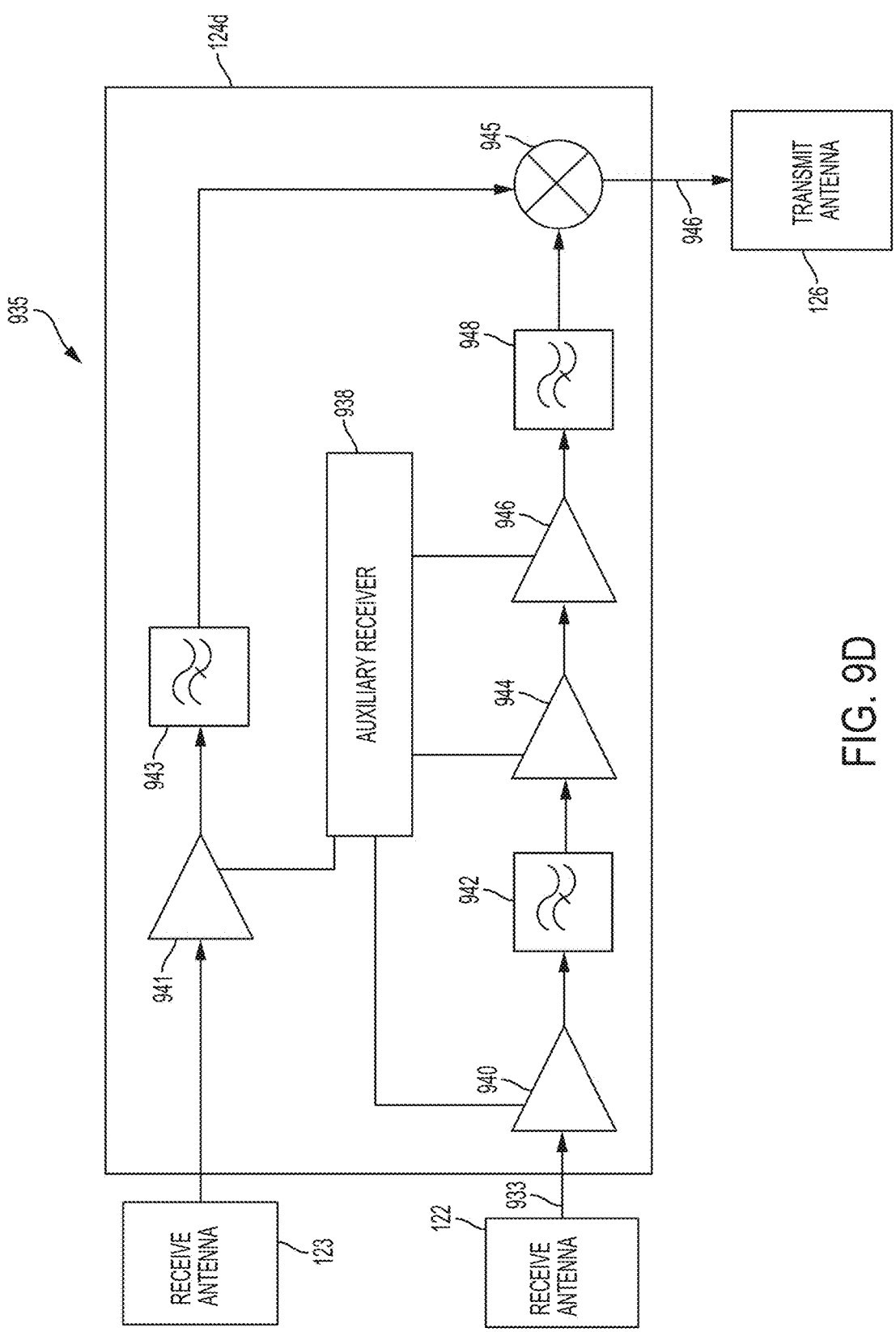
FIG. 9D is a block diagram illustrating components of another type target device, in accordance with some embodiments of the technology described herein.

Another variation of the embodiment of FIG. 9C is illustrated in FIG. 9D, which shows a target device 935 that includes receive antenna 122, a second receive antenna 123, signal transformation circuitry 124d, and transmit antenna 126. Antennas 122, 123, and 126 may be of any suitable type of antenna, examples of which are provided herein. In this embodiment, instead of relying on a reference signal produced locally at the target device by oscillators 931 and 932 as shown in FIG. 9C, target device 935 receives a continuous wave reference signal via receive antenna 123. The continuous wave reference signal is then provided to amplifier 941 and filter 943 prior to being provided to frequency multiplier 934. In this way, the target device need not include a local oscillator, which may be expensive to manufacture as part of the target device, and receives a reference signal rather synthesizing it on its own. In this way, the cost of manufacturing the target device may be reduced.

FIG. 9E is a block diagram illustrating components of a target device 950, in accordance with some embodiments of the technology described herein. In the illustrative embodiment of FIG. 9E, target device 950 includes receive antenna 122, signal transformation circuitry 124e, and transmit antenna 126. The output of receive antenna 122 is coupled to an input of signal transformation circuitry 124e. The output of signal transformation circuitry 124e is coupled to an input of transmit antenna 126. Receive antenna 122 and transmit antenna 126 may be of any suitable type, examples of which are provided herein.

As shown in FIG. 9E, signal transformation circuitry 124e includes amplifier 952, filter 954 and frequency multiplier 956. Signals received by receive antenna 122 are provided to amplifier 952 via line 951. Signals amplified by amplifier 952 are provided, via lines 953, to frequency multiplier 956 and to filter 954. Signals filtered by filter 954 are fed back to amplifier 952 via line 955. The frequency multiplier 956 generates output signals whose frequency is a multiple of the frequency of the input signals received from amplifier 952, via lines 953, and provides the output signals to transmit antenna 126 via line 957.

In the embodiment of FIG. 9E, the signal transformation circuitry 124e includes a feedback loop for amplifier 952 in that at least some of the signal output by the amplifier 952 is fed (through lines 953, filter 954, and line 955) back to its input. This positive feedback increases the gain of the amplifier 952. The process of increasing the gain of an amplifying device by a feedback loop is sometimes called "regeneration" and, for this reason, it may be said that target device 950 performs regenerative amplification and/or includes a regenerative circuit. The regenerative circuit comprises the amplifier 952 and its feedback loop, which includes filter 954, lines 953, and line 955. Using regenerative amplification to increase the gain of the amplifier 952[3] allows the target device 952 to include a single amplifier to achieve a desired gain instead of using multiple amplifiers to achieve the same desired gain. In this way, the amount of circuitry included in target device 950 and the amount of power required to operate target device 950 may be reduced, which in turn decreases the cost of manufacturing target device 950.

[3] In the context of regeneration, the language "gain of the amplifier 952" is a shorthand for the gain induced to the signals provided (e.g., by receive antenna 122) to the regenerative circuit, which includes the amplifier 952 and its feedback loop. An increase in the gain of the amplifier 952 refers to the gain achieved by using the regenerative circuit with the amplifier 952 relative to using amplifier 952 without a feedback loop.

The filter 954, part of the feedback loop of amplifier 952, is used to control the gain of the signal fed back to amplifier 952 (which gain is sometimes referred to as loop gain) such that the circuit does not become unstable and oscillate out of control. Rather, filter 954 provides sufficient loop gain control to stabilize the regenerative amplification process while, at the same time, increasing the overall gain produced by the regenerative circuit. For example, in some embodiments, the feedback loop may be operated stably and allow for a 30 dB gain increase in the gain of amplifier 952. In some instances, as much as a 50× increase in the gain of amplifier 952 may be achieved.

In some embodiments, additional components may be added to the regenerative circuit to further stabilize its operation while allowing for an even greater increase of the gain produced by the regenerative circuit. One such embodiment is illustrated in FIG. 9F, which shows a target device 960 having signal transformation circuitry 124f that includes quench control circuitry 958 in addition to the circuitry shown in and described with respect to FIG. 9E. Quench control circuitry 958 may be configured to monitor the level of current in the regenerative circuit and reduce the amount of power provided to amplifier 952 in order to prevent the circuit from oscillating out of control. The additional gain control provided by quench control circuitry 958 (in addition to the gain control provided by filter 954) may provide an additional 10-20 dB of gain, in some embodiments, by allowing the regenerative circuit to behave closer to (but not at) a state of out-of-control oscillation. As the introduction of quench control circuitry 958 allows for an even greater increase in the gain of the regenerative circuit, the resulting circuit (i.e., amplifier 952, its feedback loop through lines 953, filter 954, and line 955, and quench control circuit 958) may be termed a super-regenerative circuit.

In the embodiments of FIGS. 9E and 9F, amplifier 952 may be any suitable type of amplifier, filter 954 may be any suitable type of filter, and frequency multiplier 956 may be any suitable type of frequency multiplier including any of the types described with reference to frequency multiplier 908 shown in FIG. 9A. The target devices 950 and 960 may be implemented in any suitable way. For example, in some embodiments, the target device 950 (or 960) may comprise a substrate having the receive antenna 122 and transmit antenna 126 fabricated thereon, and a semiconductor die mounted to the substrate, coupled to the receive and transmit antennas, and having signal transformation circuitry 124e (or 124f) fabricated thereon.

Figure 9G:
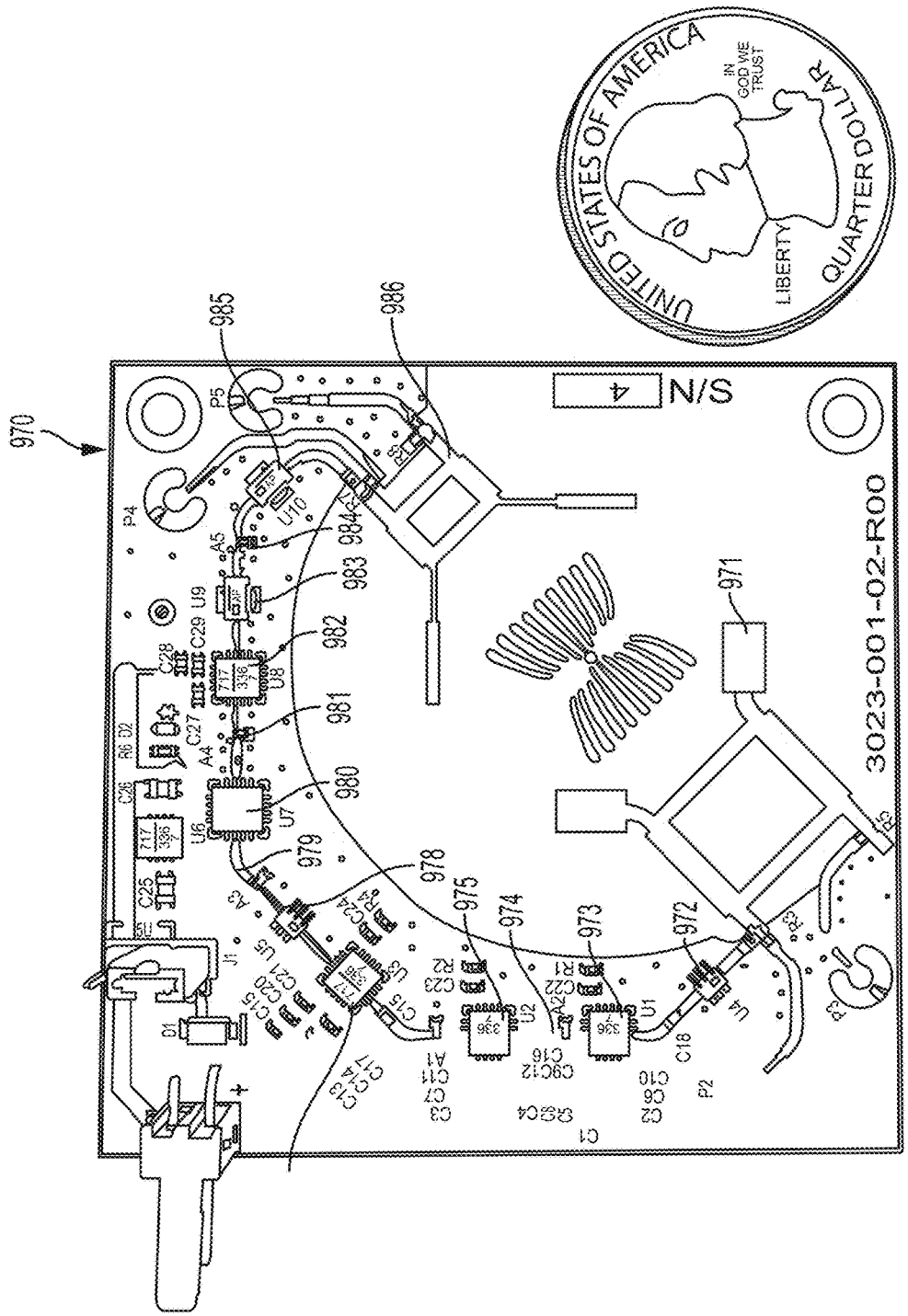
FIG. 9G is a diagram illustrating a front view of components of a target device implemented on a printed circuit board, in accordance with some embodiments of the technology described herein.
Figure 9H:
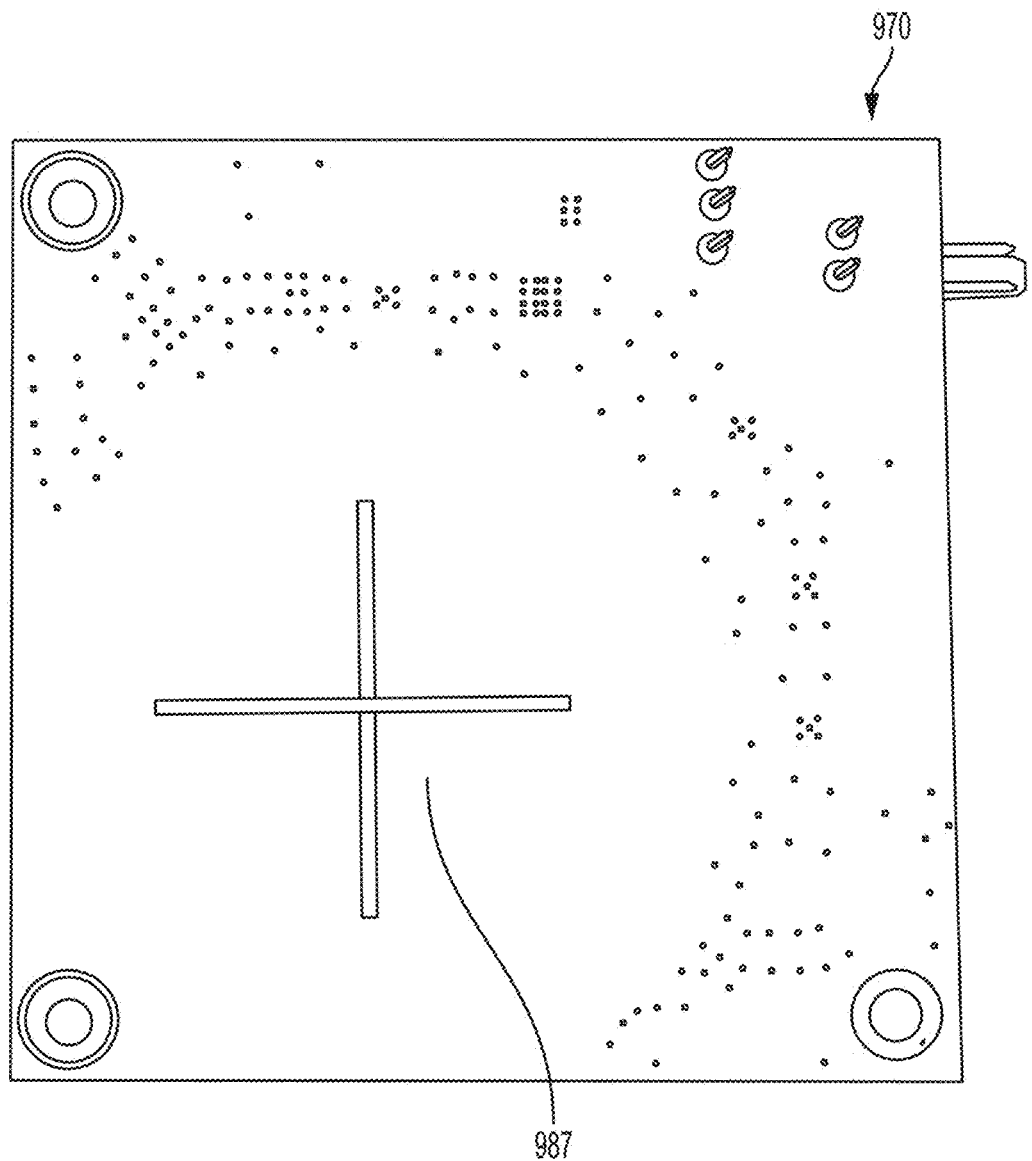
FIG. 9H is a diagram of illustrating a back view of components of the target device of FIG. 9G, in accordance with some embodiments of the technology described herein.

As discussed herein, in some embodiments, one or more components of a target device may be integrated circuits fabricated on a semiconductor die that is part of the target device. For example, the target device may comprise a substrate having one or more antennas coupled to the substrate and a semiconductor die, also coupled to the substrate, having signal transformation circuitry integrated therewith. However, in other embodiments, a target device may be realized as a collection of discrete components coupled to a substrate (e.g., without implementing any of the components as integrated circuitry). One such embodiment of a target device is illustrated in FIGS. 9G and 9H, which show front and back views of target device 970 implemented as a collection of discrete components on a printed circuit board. The front view of target device 970 is shown next to a US quarter dollar coin to provide a sense of the size of the target device.

Target device 970 comprises a circular polarized dual mode slot antenna 987—the slots are on the back of the printed circuit board, as shown in FIG. 9H. As shown in FIG. 9G, RF signals received by antenna 987 are output to splitter 971, which outputs RF signals to filter 972. RF signals filtered by filter 982 are provided to a low-noise amplifier 973. RF signals output by the low-noise amplifier 973 are attenuated by attenuator 974 and, subsequently, amplified by amplifier 975. RF signals output by amplifier 975 are attenuated by attenuator 976 and, subsequently, amplified by amplifier 977. RF signals output by amplifier 977 are filtered by filter 978, attenuated by attenuator 979, and then are provided to frequency multiplier 980. Frequency multiplier 980 is configured to receive input signals having a center frequency of $f_0$ (e.g., 5 GHz) and generate output signals having a center frequency that is $2f_0$ (e.g., 10 GHz) thereby operating as a frequency doubler.

Next, RF signals output by frequency multiplier 980 are attenuated by attenuator 981 and, subsequently, amplified by amplifier 982. RF signals amplified by amplifier 982 are filtered by filter 983, attenuated by attenuator 984, filtered by filter 985 and provided to splitter 986. Splitter 986 is coupled to dual mode slot antenna 987 and provides RF signals to the dual mode slot antenna for transmission. Splitter 986 splits the RF signals to generate two 90-degree out of phase RF signals (sometimes termed "in-phase" and "quadrature" signals) and provides these signals to dual mode slot antenna 987.

Figure 10:
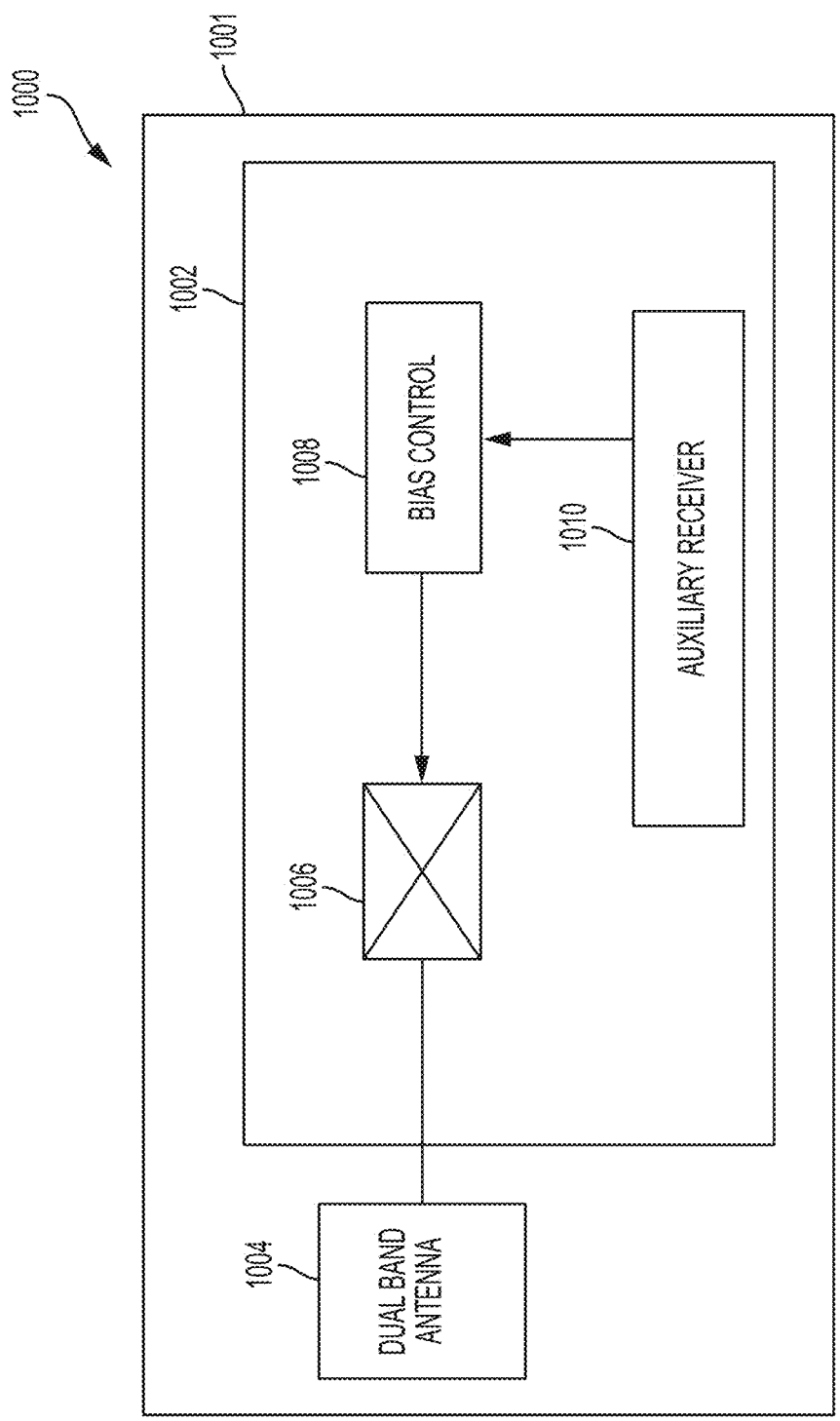
FIG. 10 is a block diagram illustrating components of a target device having a single dual band antenna, in accordance with some embodiments of the technology described herein.

As may be appreciated from the illustrative embodiments of a target device described above, in some embodiments, a target device may have a single dual band antenna configured to transmit and receive RF signals at frequencies in different bands. Another illustrative example of a target device having a dual band antenna is shown in FIG. 10, which is a block diagram of target device 1000 comprising a substrate 1001 having a single dual band antenna 1004 and circuitry 1002 disposed thereon. Circuitry 1002 includes frequency multiplier 1006 coupled to dual band antenna 1004, bias control circuitry 1008 coupled to frequency multiplier 1006, and auxiliary receiver 1010 coupled to bias control circuitry 1008. The frequency multiplier 1006 may be of any suitable type including of any type described herein. Auxiliary receiver 1010 may be of any suitable type and, for example, may be a ZigBee compatible module such that the auxiliary receiver 1010 is configured to communicate according to one or more IEEE 802.15.4-based communication protocols.

In some embodiments, RF signals received on the receive channel of the dual band antenna 1004 are provided to frequency multiplier 1006 (e.g., a 2× multiplier, a 3× multiplier, a 4× multiplier, an 8× multiplier, etc.) and, subsequent to being acted upon by the frequency multiplier 1006, are transmitted using the transmit channel of the dual band antenna 1004. For example, microwave RF signals having a first center frequency $f_0$ may be received on the receive channel of dual band antenna 1004 and provided to frequency multiplier 1006, which may transform the received microwave RF signals to generate RF signals having a second center frequency that is a harmonic of the first center frequency (e.g., $2f_0$).

In some embodiments, the target device 1000 may be configured switch between the awake and sleep modes in response to a communication received from an external device. For example, the auxiliary receiver 1010 may be configured to receive, from an external device (e.g., a controller), a communication indicating that the target device is to be turned off and, in response to the communication, cause the bias control circuitry 1008 to reverse bias the frequency multiplier 1006 so that the target device 1000 stops transmitting RF signals in response to receiving RF signals. As another example, the auxiliary receiver 1010 may be configured to receive, from an external device (e.g., a controller), a communication indicating that the target device is to be turned on and, in response to the communication, cause the bias control circuitry 1008 to forward bias the frequency multiplier 1006 so that the target device 1000 begins to transmit RF signals in response to receiving RF signals.

In some embodiments, bias control circuitry 1008 may be configured to apply a forward bias to frequency multiplier 1006 to increase the gain of the dual band antenna 1004 so as to increase the amplitude of the RF signals transmitted by the dual band antenna 1004. For example, in some embodiments, the bias control circuitry 1008 may be configured to apply a forward bias to the frequency multiplier 1006 so as to optimize the impedance match between the dual band antenna 1004 and the frequency multiplier 1006.

Target device 1000 may be manufactured in any suitable way. For example, in some embodiments, the target device 1000 may comprise a semiconductor die mounted to the substrate 1001 and at least some of the circuitry 1002 may be integrated circuitry fabricated on the semiconductor die. For example, in some embodiments, the frequency multiplier 1006 and bias control circuitry 1008 may be fabricated on the semiconductor die. As another example, in some embodiments, the frequency multiplier 1006, the bias control circuitry 1008, and the auxiliary receiver 1010 may be fabricated on the semiconductor die. In some embodiments, auxiliary receiver 1010 may be fabricated on substrate 1001, but not on the semiconductor die. In some embodiments, the semiconductor die may be flip-chip bonded to the substrate 1001, which substrate may be a printed circuit board, for example. In some embodiments, the substrate 1001 may comprise one or more conductive layer and the dual band antenna may be fabricated on the substrate by patterning the conductive layer(s). Although, in some embodiments, one or more portions target device 1000 may be part of integrated circuitry fabricated on a semiconductor die, in other embodiments, the same portion(s) may be realized as discrete components on the substrate (e.g., as discrete components mounted on a PCB substrate).

As described with reference to FIGS. 9A-9H and 10, a target device may be configured to receive RF signals having a first center frequency (e.g., 5 GHz or 60 GHz) and transmit RF signals having a second center frequency that is a harmonic of the first center frequency (e.g., 10 GHz or 120 GHz). It should be appreciated, however, that a target device is not limited to transmitting RF signals at a single harmonic of the center frequency of the RF signals it receives. For example, in some embodiments, a target device may be configured to receive RF signals having a first center frequency (e.g., 5 GHz or 60 GHz) and transmit: (1) RF signals having a second center frequency (e.g., 10 GHz or 120 GHz) that is a harmonic of the first center frequency; and (2) RF signals having a third center frequency (e.g., 15 GHz or 180 GHz) that is a harmonic of the first center frequency and is different from the second frequency. In some embodiments, the target device may be further configured to transmit RF signals having center frequencies at other harmonic(s) of the first center frequency (e.g., 20 GHz or 240 GHz).

A target device that is configured to transmit RF signals at multiple different harmonics of a center frequency in response to receiving RF signals having the center frequency may be called a "multi-spectral target device." An interrogator device configured to transmit, to a target device, RF signals having a center frequency and to receive, from the target device, RF signals at multiple different harmonics of the center frequency may be called a "multi-spectral interrogator device." A multi-spectral target device is not limited to responding with RF signals only at harmonics of a center frequency of a received RF signal and, in some embodiments, may respond at multiple different frequencies each of which depends on the center frequency in some way. For example, each of the multiple different frequencies may be: (1) a respective harmonic of the center frequency (as described with reference to FIG. 11A); (2) offset from the center frequency by a respective amount; and/or (3) a respective harmonic of the sum of the center frequency and an offset frequency (e.g., as described with reference to FIG. 11B). Similarly, a multi-spectral interrogator may be configured to receive at any set of different frequencies that a corresponding multi-spectral target device is configured to emit.

The inventors have appreciated that using a system comprising one or more multi-spectral interrogators configured to communicate with one or more multi-spectral target devices may increase the accuracy with which the location of a multi-spectral target device (and/or multi-spectral interrogator) may be determined. For example, when a multi-spectral interrogator transmits, to a multi-spectral target device, an RF signal having a center frequency and receives, from a multi-spectral target device, multiple RF signals at different harmonics of the center frequency, the overall bandwidth of the received RF signals received by the interrogator is increased relative to the situation where a target device transmits RF signals at only one harmonic of the center frequency. An increase in the bandwidth of the received RF signals improves the range resolution with which the multi-spectral device may be located.

For example, an interrogator may transmit, to a target device, a chirp having a center frequency of 61.25 GHz with its instantaneous frequency changing linearly from 61 GHz to 61.5 GHz over its duration so that the bandwidth of the transmitted chirp is 500 MHz and may receive, from the target device, a responsive chirp having a center frequency of 122.5 GHz with its instantaneous frequency changing linearly from 122 GHz to 123 GHz over its duration so that the bandwidth of the received chirp is 1 GHz. By contrast, when the interrogator transmits the same chirp to a multi-spectral target device, the interrogator may receive: (1) a first responsive chirp having a center frequency of 122.5 GHz and a bandwidth of 1 GHz; and (2) a second responsive chirp having a center frequency of 245 GHz and a bandwidth of 2 GHz such that the total bandwidth of the RF signals received by the interrogator is 3 GHz (unlike the 1 GHz of total bandwidth when a multi-spectral target device is not used). Applying phase-coherent processing to a received RF signal having a bandwidth of 1 GHz may yield a range resolution of 15 cm. Increasing that bandwidth to 3 GHz may yield a range resolution of 5 cm, thereby providing a three-fold improvement in range resolution, thereby increasing the accuracy with which the location of a target device may be determined.

The inventors have also recognized that having different multi-spectral target devices squawk at different combinations of harmonics of a center frequency may provide a way of determining which multi-spectral devices are transmitting RF signals. For example, multi-spectral device A may be configured to receive RF signals having a center frequency (e.g., 5 GHz) and transmit responsive RF signals at the first and third harmonics of the center frequency (e.g., 10 GHz and 20 GHz). On the other hand, multi-spectral device B may be configured to receive RF signals having the same center frequency (e.g., 5 GHz) and transmit response RF signals at the first and second harmonics of the center frequency (e.g., 10 GHz and 15 GHz). Thus, receiving an RF signal from a multi-spectral target device having frequency content at 20 GHz may indicate that multi-spectral target device A transmitted the RF signal, whereas receiving an RF signal from a multi-spectral device having frequency content at 15 GHz may indicate that multi-spectral target device transmitted the RF signal. More generally, different multi-spectral target devices may be configured to squawk at different combinations of harmonics of a given center frequency thereby providing a way of "harmonically coding" their respective identities, which may facilitate determining which multi-spectral target device(s) are transmitting RF signals at a given time. Additionally or alternatively, such harmonic coding may be used to encode the angle and/or orientation of a multi-spectral target device relative to a multi-spectral interrogator.

Figure 11A:
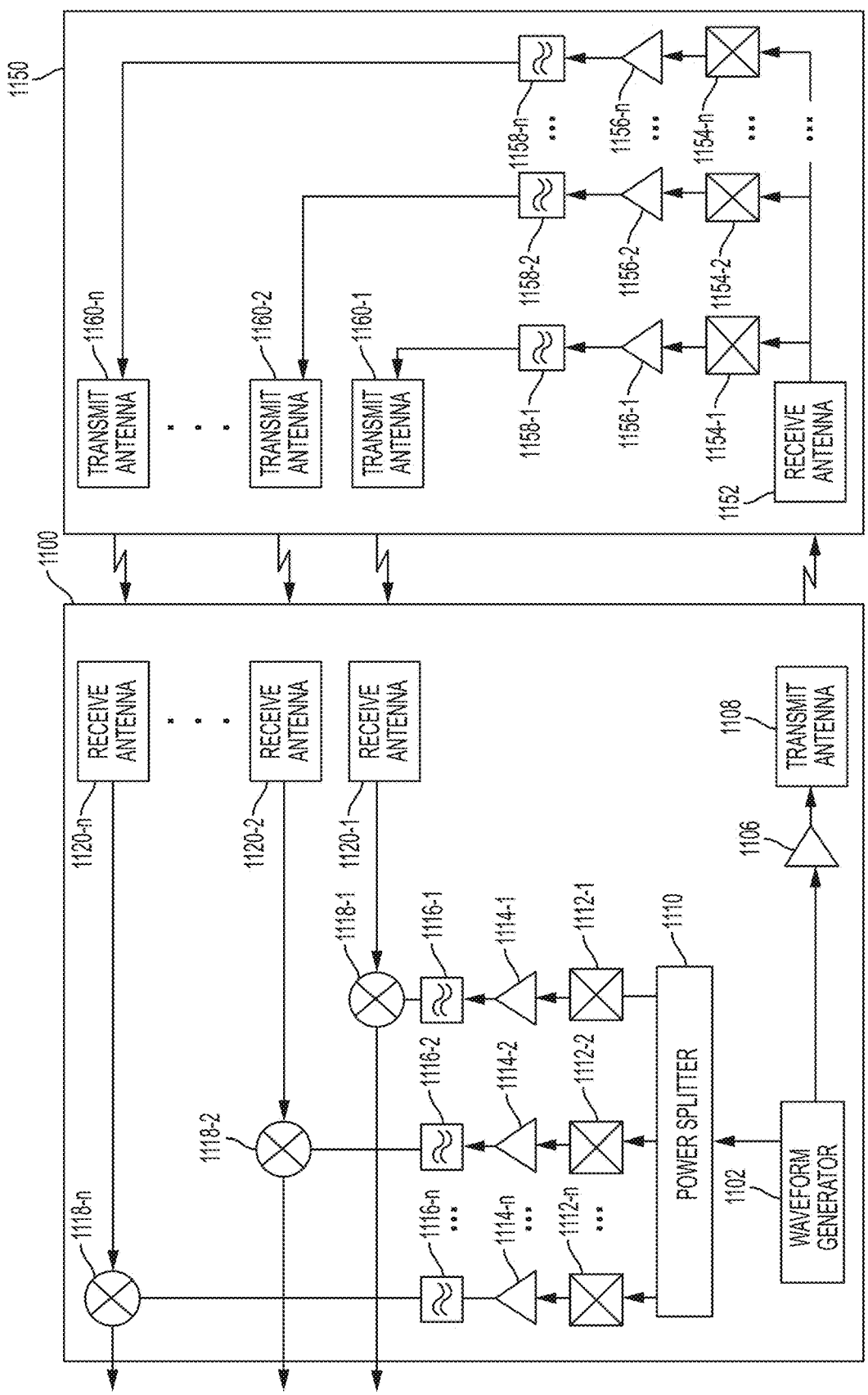
FIG. 11A is a block diagram illustrating components of a multi-spectral interrogator and a multi-spectral target device, in accordance with some embodiments of the technology described herein.

FIG. 11A is a block diagram illustrating components of a multi-spectral interrogator 1100 and a multi-spectral target device 1150, in accordance with some embodiments of the technology described herein. Multi-spectral interrogator 1100 comprises waveform generator 1102, amplifier 1106, and transmit antenna 1108 configured to transmit RF signals generated by waveform generator 1102 and amplified by amplifier 1106. The RF signals generated by the waveform generator 1102 are also provided to power splitter 1110 and, subsequently, to receive circuitry in the interrogator configured to perform phase-coherent processing of the RF signals transmitted by transmit antenna 1108 and RF signals received by receive antennas 1120-1, 1120-2, . . . , 1120-$n$, where n is any suitable integer greater than or equal to 3. The receive circuitry of interrogator 1100 comprises n different receive chains, one for each of the receive antennas 1120-1, 1120-2, . . . , 1120-$n$ (or, more generally, a different receive chain for each different center frequency at which the target device 1150 transmits and the interrogator device 1100 receives RF signals).

As shown in FIG. 11A, the receive circuitry of interrogator 1100 includes a first receive chain including frequency multiplier 1112-1, amplifier 1114-1, filter 1116-1, and frequency mixer 1118-1, which is used for phase-coherent processing of RF signals received by antenna 1120-1. The receive circuitry of interrogator 1100 further includes a second receive chain including frequency multiplier 1112-2, amplifier 1114-2, filter 1116-2, and frequency mixer 1118-2, which is used for phase-coherent processing of RF signals received by antenna 1120-2. The receive circuitry of interrogator 1100 further includes an nth receive chain including frequency multiplier 1112-$n$, amplifier 1114-$n$, filter 1116-$n$, and frequency mixer 1118-$n$, which is used for phase-coherent processing of RF signals received by antenna 1120-$n$.

It should be appreciated that although in the illustrative embodiment of FIG. 11A, the interrogator includes three or more receive antennas (and, consequently, three or more receive chains), in some embodiments, a multi-spectral interrogator may include two receive antennas and two associated receive chains (e.g., all the components of interrogator 1100 whose labels end with "-1" and "-2," but not those components whose labels end with "-n." Additionally, although there are "n" separate receive antennas shown as being part of interrogator 1100, that number of receive antennas may be reduced by combining at least some of the receive antennas (e.g. two receive antennas) into a single receive antenna using a multiplexer (e.g., duplexer). This may reduce the size of the interrogator.

Multi-spectral target device 1150 comprises receive antenna 1152 configured to receive RF signals at a first center frequency and multiple transmit antennas 1160-1, 1160-2, and 1160-n, configured to transmit RF signals at respective harmonics of the first center frequency. The RF signals received by receive antenna 1152 are provided to signal transformation circuitry configured to generate RF signals having as center frequencies different harmonics of the first center frequency. The signal transformation circuitry includes a respective signal transformation chain for each harmonic of the first center frequency at which the multi-spectral target device is configured to transmit RF signals.

As shown in FIG. 11A, the signal transformation circuitry of multi-spectral target device 1150 includes a first signal transformation chain including frequency multiplier 1154-1, amplifier 1156-1, and filter 1158-1. The signal transformation circuitry of multi-spectral target device 1150 further includes a second signal transformation chain including frequency multiplier 1154-2, amplifier 1156-2, and filter 1158-2. The signal transformation circuitry of multi-spectral target device 1150 further includes an nth signal transformation chain including frequency multiplier 1154-n, amplifier 1156-n, and filter 1158-n.

In some embodiments, each of the frequency multipliers 1154-1, 1154-2, and 1154-n may be configured to increase the frequencies in the received RF signals by different amounts. For example, the frequency multipliers 1154-1, 1154-2, and 1154-n may increase the frequencies by a factor of two, three, and four respectively. As a specific example, RF signals received by antenna 1152 having a center frequency of 60 GHz may be provided to frequency multipliers 1154-1, 1154-2, and 1154-n, which may generate RF signals having center frequencies of 120 GHz, 180 GHz, and 240 GHz, respectively. In this example, transmit antenna 1160-1 would transmit RF signals having a center frequency of 120 GHz, transmit antenna 1160-2 would transmit RF signals having a center frequency of 180 GHz, and transmit antenna 1160-n would transmit RF signals having a center frequency of 240 GHz. Each of frequency multipliers 1154-1, 1154-2, . . . , 1154-n may be implemented in any suitable way described herein including, for example, as a series of frequency multipliers. In this way, a higher-order frequency multiplier (e.g., a 4× frequency multiplier) may be implemented a single frequency multiplier (e.g., a 4× multiplier) or as a series of lower-order frequency multipliers (e.g., two 2× multipliers).

It should be appreciated that although in the illustrative embodiment of FIG. 11A, the target device includes three or more transmit antennas (and, consequently, three or more signal transformation chains), in some embodiments, a multi-spectral target device may include only two transmit antennas and two signal transformation chains (e.g., all the components of target device 1150 whose labels end with "-1" and "-2," but not those components whose labels end with "-n." Additionally, although there are "n" separate transmit antennas shown as being part of target device 1150, that number of transmit antennas may be reduced by combining at least some of the transmit antennas (e.g., two transmit antennas) into a single transmit antenna using a multiplexer (e.g., duplexer). This may reduce the size of the target device.

To further explain aspects of how the multi-spectral interrogator 1100 and target device 1150 operate, consider embodiments where n=3 such that the interrogator 1100 has three receive antennas and target device 1150 has three transmit antennas. In such embodiments, multi-spectral interrogator 1100 may transmit, to multi-spectral target device 1150, a first RF signal having a first center frequency (e.g., 60 GHz) using transmit antenna 1108. Multi-spectral target device may receive the first RF signal using receive antenna 1152 and generate: (1) a second RF signal having a second center frequency (e.g., 120 GHz) using frequency multiplier 1154-1, amplifier 1156-1, and filter 1158-1; (2) a third RF signal having a third center frequency (e.g., 180 GHz) different from the first and second center frequencies using frequency multiplier 1154-2, amplifier 1156-2, and filter 1158-2; and (3) a fourth RF signal having a fourth center frequency (e.g., 240 GHz) different from the first, second, and third center frequencies) using frequency multiplier 1154-n, amplifier 1156-n, and filter 1158-n. In turn, the second, third, and fourth RF signals are transmitted by transmit antennas 1160-1, 1160-2, and 1160-n, respectively.

In turn, interrogator 1100 may receive the second RF signal having the second center frequency (e.g., 120 GHz) using receive antenna 1120-1 and provide it to frequency mixer 1118-1 for mixing with a transformed signal obtained by transforming the first RF signal using frequency multiplier 1112-1, amplifier 1114-1, and filter 1116-1 and having the second center frequency. The frequency mixer 1118-1 may output a first mixed RF signal indicative of the distance between the interrogator 1100 and target device 1150. The interrogator 1100 may further receive the third RF signal having the third center frequency (e.g., 180 GHz) using receive antenna 1120-2 and provide it to frequency mixer 1118-2 for mixing with a transformed signal obtained by transforming the first RF signal using frequency multiplier 1112-2, amplifier 1114-2, and filter 1116-2 and having the third center frequency. The frequency mixer 1118-2 may output a second mixed RF signal indicative of the distance between the interrogator 1100 and target device 1150. The interrogator 1100 may further receive the fourth RF signal having the fourth center frequency (e.g., 240 GHz) using receive antenna 1120-n and provide it to frequency mixer 1118-n for mixing with a transformed signal obtained by transforming the first RF signal using frequency multiplier 1112-n, amplifier 1114-n, and filter 1116-n and having the fourth center frequency. The frequency mixer 1118-n may output a third mixed RF signal indicative of the distance between the interrogator 1100 and target device 1150.

Next the first, second, and third mixed RF signals generated by frequency mixers 1118-1, 1118-2, and 1118-n may be processed (e.g., using a processor not shown in FIG. 11A, but which may be in or external to interrogator 1100) to determine the distance between the interrogator 1100 and target device 1150. This may be done in any suitable way. For example, in some embodiments, the first, second and third mixed RF signals may be combined to generate a single RF signal indicative of the distance between the interrogator 1100 and target device 1150. In some embodiments, the mixed RF signals may be combined in the frequency domain. For example, the mixed RF signals may be apodized (e.g., windowed with a suitable windowing function) and added to one another in the frequency domain to generate the combined signal. As another example, the mixed RF signals may be used to estimate a combined RF signal using bandwidth extension techniques. Any of the foregoing combination techniques may be implemented in the time-domain and/or in the frequency domain. Regardless of how the mixed RF signals are combined to generate a combine RF signal, the combined RF signal may be used to determine the distance between the interrogator 1100 and target device 1150. This may be done by performing an inverse Fourier transform on the combined RF signal and identifying the location of the peak, which location indicates the time of flight between interrogator 1100 and target device 1150, and convert the location of the peak to an estimate of the distance between the interrogator and target device, or in any other suitable way.

Multi-spectral interrogator 1100 may be manufactured in any suitable way. For example, in some embodiments, the interrogator 1100 may comprise a substrate having the transmit antenna 1108 and receive antennas 1120-1, 1120-2, and 1120-*n* fabricated thereon. For example the substrate may comprise one or more conductive layers and the transmit and receive antennas may be patterned in the conductive layer(s). In some embodiments, the interrogator device may comprise a semiconductor die mounted on the substrate and the receive circuitry (e.g., frequency multipliers 1112-1, 1112-2, 1112-*n*, amplifiers 1114-1, 1114-2, . . . , 1114-*n*, filters 1116-1, 1116-2, . . . , 1116-*n*, and frequency multipliers 1118-1, 1118-2, . . . , 1118-*n*) may be integrated circuitry fabricated on the semiconductor die. In some embodiments, transmit circuitry including waveform generator 1102 and amplifier 1106 may also be integrated circuitry fabricated on the semiconductor die. In some embodiments, waveform generator may be at least partially or fully off the semiconductor die but on the substrate. Although, in some embodiments, one or more portions of the interrogator 1100 may be part of integrated circuitry fabricated on a semiconductor die, in other embodiments, the same portion(s) may be realized as discrete components on the substrate (e.g., as discrete components mounted on a PCB substrate).

Multi-spectral target device 1150 may be manufactured in any suitable way. For example, in some embodiments, the target device may comprise a substrate having the receive antenna 1152 and transmit antennas 1160-1, 1160-2, and 1160-*n* fabricated thereon. For example the substrate may comprise one or more conductive layers and the transmit and receive antennas may be patterned in the conductive layer(s). In some embodiments, the target device may comprise a semiconductor die mounted on the substrate and the signal transformation circuitry (e.g., frequency multipliers 1154-1, 1154-2, 1154-*n*, amplifiers 1156-1, 1156-2, . . . , 1156-*n*, and filters 1158-1, 1158-2, . . . , 1158-*n*) may be integrated circuitry fabricated on the semiconductor die. Although, in some embodiments, one or more portions of the target device 1150 may be part of integrated circuitry fabricated on a semiconductor die, in other embodiments, the same portion(s) may be realized as discrete components on the substrate (e.g., as discrete components mounted on a PCB substrate).

Figure 11B:
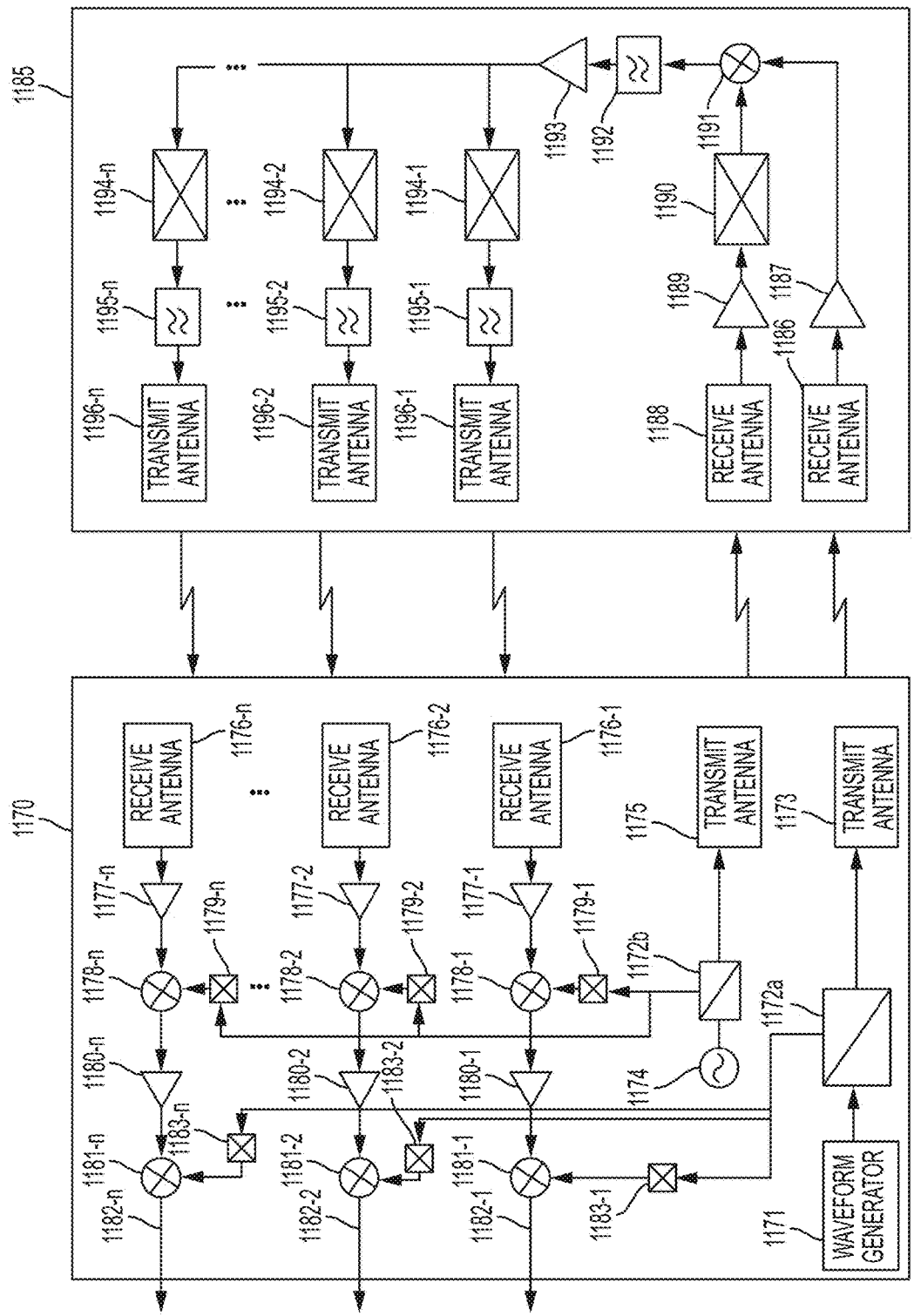
FIG. 11B is a block diagram illustrating components of another type of multi-spectral interrogator and another type of multi-spectral target device, in accordance with some embodiments of the technology described herein.

FIG. 11B is a block diagram illustrating components multi-spectral interrogator 1170 and multi-spectral target device 1185, in accordance with some embodiments of the technology described herein. In the embodiment illustrated in FIG. 11B, the interrogator 1170 transmits two different RF signals to target device: (1) a first RF signal generated at least in part by using waveform generator 1171 (this signal is analogous to the signal transmitted by interrogator 1100 described with reference to FIG. 11A); and (2) a second RF signal generated by local oscillator 1174 (this has no counterpart in the embodiment of FIG. 11A). After being received by the target device, this second RF signal (after any suitable amplification and/or frequency multiplication) may be mixed with the first RF signal to shift the first RF signal by a desired amount to obtain a frequency-shifted RF signal. In turn, the frequency-shifted RF signal may be frequency multiplied by any suitable factors to generate RF signals to transmit back to interrogator device 1170. This configuration is described in greater detail below.

Multi-spectral interrogator 1170 comprises waveform generator 1171, power splitter 1172*a*, and transmit antenna 1173 configured to transmit RF signals generated by the waveform generator 1171. Interrogator 1170 further comprises oscillator 1174, power splitter 1172*b*, and transmit antenna 1175 configured to transmit RF signals (e.g., continuous wave signals) generated by oscillator 1174. The RF signals generated by waveform generator 1171 and oscillator 1174 are also provided to receive circuitry in interrogator 1170 configured to perform phase-coherent processing of the RF signals transmitted by transmit antennas 1173 and 1175, and RF signals received by receive antennas 1176-1, 1176-2, . . . , 1176-*n*, where n is any suitable integer greater than or equal to 3. The receive circuitry of interrogator 1170 comprises n different receive chains, one for each of the receive antennas 1176-1, 1176-2, . . . , 1176-*n* (or, more generally, a different receive chain for each different center frequency at which the target device 1185 transmits and the interrogator device 1170 receives RF signals).

As shown in FIG. 11B, the receive circuitry of interrogator 1170 includes a first receive chain including frequency multipliers 1179-1 and 1183-1, amplifiers 1177-1 and 1180-1, and frequency mixers 1178-1 and 1182-1, which receive chain is used for phase-coherent processing of RF signals received by antenna 1176-1. The receive circuitry of interrogator 1170 further includes a second receive chain including frequency multipliers 1179-2 and 1183-2, amplifiers 1177-2 and 1180-2, and frequency mixers 1178-2 and 1182-2, which receive chain is used for phase-coherent processing of RF signals received by antenna 1176-2. The receive circuitry of interrogator 1170 further includes an nth receive chain including frequency multipliers 1179-*n* and 1183-*n*, amplifiers 1177-*n* and 1180-*n*, and frequency mixers 1178-*n* and 1182-*n*, which receive chain is used for phase-coherent processing of RF signals received by antenna 1176-*n*.

Although in the illustrative embodiment of FIG. 11B, the interrogator 1170 includes three or more receive antennas (and, consequently, three or more receive chains), in some embodiments, a multi-spectral interrogator may include two receive antennas and two associated receive chains (e.g., all the components of interrogator 1100 whose labels end with "-1" and "-2," but not those components whose labels end with "-n." Additionally, although there are "n" separate receive antennas shown as being part of interrogator 1170, that number of receive antennas may be reduced by combining at least some of the receive antennas (e.g. two receive antennas) into a single receive antenna using a multiplexer (e.g., duplexer). This may reduce the size of the interrogator.

Multi-spectral target device 1185 comprises receive antenna 1186 configured to receive RF signals at a first center frequency $f_1$ (e.g., chirps generated by waveform generator 1171 transmitted by transmit antenna 1173) and receive antenna 1188 configured to receive RF signals having a second center frequency $f_2$ (e.g., a continuous wave signals generated by oscillator 1174 and transmitted by transmit antenna 1175). Target device 1185 further comprises amplifiers 1187, amplifier 1189, frequency multiplier 1190 and frequency mixer 1191. The frequency mixer 1191 is configured to mix RF signals received by antenna 1186 and amplified by amplifier 1187 with RF signals received by antenna 1188, amplified by amplifier 1189 and frequency multiplied by frequency multiplier 1190 to obtain frequency shifted RF signals having a third center frequency $f_3$ (which may be given by $f_3=f_1+kf_2$, where k is the multiplicative factor induced by frequency multiplier 1190). Target device 1185 further comprises multiple transmit antennas 1196-1, 1196-2, and 1196-n, configured to transmit RF signals at respective harmonics of the third center frequency (e.g., $2f_3$, $3f_3$, etc.). The frequency-shifted RF signals output by frequency mixer 1191 and having the third center frequency are filtered by filter 1192, amplified by amplifier 1193, and provided to signal transformation circuitry configured to generate RF signals having as center frequencies different harmonics of the third center frequency. The signal transformation circuitry includes a respective signal transformation chain for each harmonic of the third center frequency at which the target device 1185 is configured to transmit RF signals.

As shown in FIG. 11B, the signal transformation circuitry of target device 1185 includes a first signal transformation chain including frequency multiplier 1194-1 and filter 1195-1, a second signal transformation chain including frequency multiplier 1194-2, and filter 1195-2, and an nth chain including frequency multiplier 1194-n and filter 1195-n.

It should be appreciated that although in the illustrative embodiment of FIG. 11B, the target device 1185 includes three or more transmit antennas (and, consequently, three or more signal transformation chains), in some embodiments, a multi-spectral target device may include only two transmit antennas and two signal transformation chains (e.g., all the components of target device 1150 whose labels end with "-1" and "-2," but not those components whose labels end with "-n." Additionally, although there are "n" separate transmit antennas shown as being part of target device 1150, that number of transmit antennas may be reduced by combining at least some of the transmit antennas (e.g., two transmit antennas) into a single transmit antenna using a multiplexer (e.g., duplexer). This may reduce the size of the target device.

To further explain aspects of how the interrogator 1170 and target device 1185 operate, consider embodiments where n=3 such that the interrogator 1170 has three receive antennas and target device 1185 has three transmit antennas. In such embodiments, interrogator 1170 may transmit, to target device 1185, a first RF signal having a first center frequency (e.g., 40 GHz) using transmit antenna 1173 and a second RF signal having a second center frequency (e.g., 10 GHz) using transmit antenna 1175. Target device 1185 may receive the first RF signal using antenna 1186, amplify it using amplifier 1187, and provide the result as a first input to frequency mixer 1191. Target device 1185 may also receive the second RF signal using antenna 1188, amplify it using amplifier 1189, and increase the frequency in the resulting signal by a factor of two using frequency multiplier 1190 to obtain an RF signal having a center frequency twice that of the second center frequency (e.g., 20 GHz), and provide the result as a second input to frequency mixer 1191. Based on these inputs, frequency mixer 1191 may be configured to generate a third RF signal having a third center frequency (60 GHz). Target device 1185 may then use the third RF signal to generate: (1) a fourth RF signal having a fourth center frequency (e.g., 120 GHz) at least by using frequency multiplier 1194-1; (2) a fifth RF signal having a fifth center frequency (e.g., 180 GHz) at least by using frequency multiplier 1194-2; and (3) a sixth RF signal having a sixth center frequency (e.g., 240 GHz) at least by using frequency multiplier 1194. The fourth, fifth, and sixth RF signals are subsequently transmitted by transmit antennas 1196-1, 1196-2, and 1196-n, respectively.

In turn, interrogator 1170 may receive the fourth RF signal having the fourth center frequency (e.g., 120 GHz) using receive antenna 1176-1, amplify it using amplifier 1177-1, and provide it as an input to frequency mixer 1178-1 for mixing with a transformed signal obtained by transforming the second RF signal using frequency multiplier 1179-1. The output of frequency mixer 1178-1 is amplified by amplifier 1180-1 and provided as an input to frequency mixer 1181-1 for mixing with a transformed signal obtained by transforming the first RF signal using frequency multiplier 1183-1. The frequency mixer 1181-1 outputs, on line 1182-1, a first mixed RF signal indicative of the distance between the interrogator 1170 and target device 1185. The interrogator 1170 may also receive the fifth RF signal having the fifth center frequency (e.g., 180 GHz) using receive antenna 1176-2, amplify it using amplifier 1177-2, and provide it as an input to frequency mixer 1178-2 for mixing with a transformed signal obtained by transforming the second RF signal using frequency multiplier 1179-2. The output of frequency mixer 1178-2 is amplified by amplifier 1180-2 and provided as an input to frequency mixer 1181-2 for mixing with a transformed signal obtained by transforming the first RF signal using frequency multiplier 1183-2. The frequency mixer 1181-2 outputs, on line 1182-2, a second mixed RF signal indicative of the distance between the interrogator 1170 and target device 1185. The interrogator 1170 may also receive the sixth RF signal having the sixth center frequency (e.g., 240 GHz) using receive antenna 1176-n, amplify it using amplifier 1177-n, and provide it as an input to frequency mixer 1178-n for mixing with a transformed signal obtained by transforming the second RF signal using frequency multiplier 1179-n. The output of frequency mixer 1178-n is amplified by amplifier 1180-n and provided as an input to frequency mixer 1181-n for mixing with a transformed signal obtained by transforming the first RF signal using frequency multiplier 1183-n. The frequency mixer 1181-n outputs, on line 1182-n, a second mixed RF signal indicative of the distance between the interrogator 1170 and target device 1185.

Next the first, second, and third mixed RF signals generated by frequency mixers 1181-1, 1181-2, and 1181-n may be processed (e.g., using a processor not shown in FIG. 11B, but which may be in or external to interrogator 1170) to determine the distance between the interrogator 1170 and target device 1185. This may be done in any suitable way including in any of the ways described above with reference to FIG. 11A.

Multi-spectral interrogator 1170 may be manufactured in any suitable way. For example, in some embodiments, the interrogator 1170 may comprise a substrate having the transmit antennas 1173 and 1175, and receive antennas 1176-1, 1176-2, and 1176-n fabricated thereon. For example the substrate may comprise one or more conductive layers and the transmit and receive antennas may be patterned in the conductive layer(s). In some embodiments, the interrogator may comprise a semiconductor die mounted on the substrate and the receive circuitry (e.g., the frequency multipliers, frequency mixers, and amplifiers shown as part of interrogator 1170) may be integrated circuitry fabricated on the semiconductor die. In some embodiments, waveform generator 1171 and oscillator 1174 may also be integrated circuitry fabricated on the semiconductor die, but in other embodiments one or both of waveform generator 1171 and oscillator 1174 may be realized as discrete components on the substrate (e.g., as discrete components mounted on a PCB substrate).

Similarly, target device 1150 may be manufactured in any suitable way. In some embodiments, the target device may comprise a substrate having the receive antennas 1186 and 1188, and transmit antennas 1196-1, 1196-2, and 1196-n fabricated thereon. For example the substrate may comprise one or more conductive layers and the transmit and receive antennas may be patterned in the conductive layer(s). In some embodiments, the target device may comprise a semiconductor die mounted on the substrate and the signal transformation circuitry (e.g., the frequency multipliers, frequency mixers, filters, and amplifiers shown as part of target device 1185) may be integrated circuitry fabricated on the semiconductor die. Although, in some embodiments, one or more portions of the target device 1185 may be part of integrated circuitry fabricated on a semiconductor die, in other embodiments, the same portion(s) may be realized as discrete components on the substrate (e.g., as discrete components mounted on a PCB substrate).

It should be appreciated that the embodiments of multispectral interrogators and target devices shown in FIGS. 11A and 11B are illustrative and that there are variations. For example, in some embodiments, there may be zero, one, two, three, or any other suitable number of amplifiers of any suitable type between any pair of circuits shown in FIGS. 11A and 11B. As another example, there may be zero, one, two, three, or any other suitable number of filters of any suitable type between any pair of circuits shown in FIGS. 11A and 11B. As yet another example, the target device 1185 may be implemented without frequency multiplier 1190, in some embodiments. It should also be appreciated that any of the amplifiers, frequency mixers, frequency multipliers, and filters shown in FIGS. 11A and 11b may be of any suitable type and may be implemented in any suitable way, as aspects of the technology described herein are not limited in this respect. Additionally, it should be appreciated that each of waveform generators 1102 and 1171 may be configured to generate RF signals of any suitable type including any of the types described herein with reference to waveform generator 110.

As discussed herein including with reference to FIG. 9C, in some embodiments, a target device may include a local oscillator configured to generate a signal having a fixed frequency used to offset the frequencies in RF signals received from an interrogator device as part of generating RF signals to transmit back to the interrogator device. For example, in some embodiments, a target device may include: (1) an oscillator configured to generate a first RF signal having a first center frequency $f_1$ (the first RF signal may be a continuous wave signal having a fixed frequency to be used as an offset frequency); (2) a receive antenna configured to receive, from an interrogator, a second RF signal having a second center frequency $f_2$ (the second RF signal may be a chirp, for example); and (3) a frequency mixer configured to mix the first RF signal with the second RF signal to obtain a third RF signal having a third center frequency $f_3$ (e.g., where $f_3=f_2\pm f_1$). The target device may further include a transmit antenna configured to transmit the third RF signal to the interrogator device.

In some embodiments, such a target device architecture may be realized using an antenna disposed on a semiconductor substrate. For example, in some embodiments, a target device may comprise: (1) a substrate; (2) an oscillator disposed on the substrate and configured to generate a first RF signal having a first center frequency; (3) a dual band antenna mounted on the substrate and configured to receive a second RF signal having a second center frequency from an interrogator; and (4) a frequency mixer configured to generate a third RF signal by mixing the first RF signal with the second RF signal and provide the generated third RF signal to the dual band antenna for transmission back to the interrogator device. In some embodiments, the substrate may be a semiconductor substrate, the dual band antenna may be a microelectromechanical system (MEMS) antenna mounted on the semiconductor substrate, and the frequency mixer may be mounted on the dual band antenna.

Figure 12A:
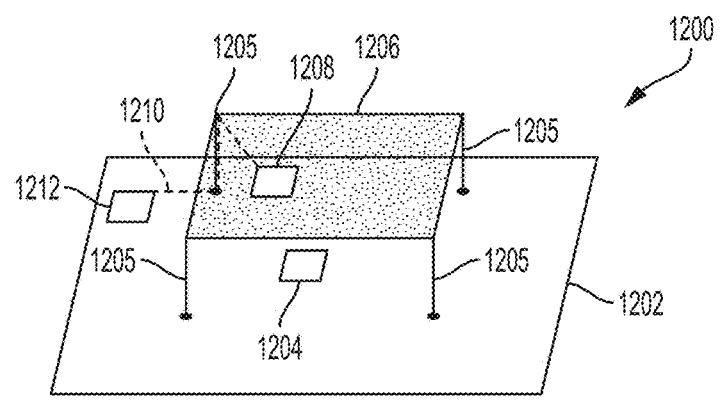
FIG. 12A is a diagram illustrating a target device having a local oscillator and a dual-band antenna, in accordance with some embodiments of the technology described herein.

FIG. 12A is a diagram of an illustrative target device 1200 comprising a substrate 1202, an oscillator 1204 disposed on the substrate 1202; a dual band antenna 1206 mounted on the substrate 1202 using posts 1205; and frequency mixer 1208 disposed on dual band antenna 1206. In some embodiments, the frequency mixer 1208 comprises (e.g., consists of) a single transistor or a single diode. The oscillator 1204 may be electromagnetically coupled to frequency mixer 1208. For example, in the illustrated embodiment of FIG. 12A, oscillator 1204 is located on the substrate at a location below the dual band antenna and, thereby, is configured to generate RF signals and radiate them at frequency mixer 1208, which is disposed on the dual band antenna 1206.

In embodiments where, the frequency mixer 1208 comprises or consists of a single diode, the frequency mixer 1208 may be a Schottky diode, a silicon diode, a varistor-type diode frequency multiplier, a varactor-type frequency multiplier, a step recover diode frequency multiplier, or a PIN diode frequency multiplier, any (e.g., all) of which may or may not be biased with a quiescent bias current.

In some embodiments, oscillator 1204 may be configured to generate a first RF signal having a first frequency and radiate the first RF signal into the dual band antenna 1206. The frequency mixer 1208 may be configured to mix the first RF signal, generated by the oscillator 1204, with a second RF signal having a second center frequency and received by the dual band antenna from an interrogator device to obtain, as the output of frequency mixer 1208, a third RF signal having a third center frequency (which may be the sum or difference of the first and second center frequencies). In turn, the RF signal output by the frequency mixer 1208 may be transmitted by the dual band antenna, for example, to the interrogator device.

In some embodiments, the substrate 1202 may be a semiconductor substrate and, for example, may be a semiconductor die. The semiconductor die may be a silicon die, for instance from a bulk silicon wafer or silicon-on-insulator (SOI) wafer. In some embodiments, the die may be a single crystal silicon die. In some embodiments, the die may be a CMOS die, a BiCMOS die, a GaAs die, a GaN die, or may be formed of any other semiconductor material.

In some embodiments, the oscillator 1204 may be a cavity resonator formed within the substrate (e.g., within a semiconductor die), a planar microwave oscillator, or any other suitable type of oscillator. As shown in the illustrative embodiment of FIG. 12A, the oscillator 1204 is located on the substrate 1202 at a location underneath the dual band antenna 1206. In other embodiments, however, the oscillator 1204 may be located at a location that is not beneath the dual band antenna 1206. In such embodiments, the oscillator 1204 may be coupled, via a feed line, to a coupling device disposed on the substrate at a location underneath the dual band antenna 1206. This is one example of how the oscillator 1204 may be electromagnetically coupled to frequency mixer 1208 without being located directly underneath the dual band antenna 1206 on which the frequency mixer 1208 is located.

In some embodiments, the dual mode antenna 1206 may be a MEMS antenna. For example, in embodiments where the dual mode antenna 1206 is configured to receive RF signals in a range of 50-70 GHz and transmit RF signals in a range of 100-140 GHz, the dual mode antenna may be realized as a MEMS antenna. The MEMS antenna may be fabricated on the semiconductor substrate 1202 using any suitable semiconductor fabrication process(es) (e.g., deposition, etching, lithography, patterning, etc.). It should be appreciated, however, that the dual mode antenna 1206 is not limited to being a MEMS antenna and may be a larger physical structure, manufactured separately from the substrate 1202, as the case may be in embodiments where the dual mode antenna is configured to receive/transmit RF signals at lower frequencies (requiring larger wavelengths and, therefore, a larger antenna). For example, in some embodiments, a dual band antenna configured to receive RF signals in a range of 4-6 GHz and transmit RF signals in a range of 8-12 GHz may be manufactured separately from the substrate 1202 (e.g., without using semiconductor fabrication techniques) and subsequently be mounted on substrate 1202. Such an antenna may be fabricated from any suitable material such as, for example, aluminum or brass. In some embodiments, the dual band antenna may be a patch antenna and/or a planar antenna.

As shown in FIG. 12A, the dual band antenna 1206 is mounted on substrate 1202 using four posts 1205. However, it should be appreciated that the dual band antenna 1206 may be mounted on substrate 1202 using any suitable number of posts (e.g., 2, 3, 5, etc.) or any other suitable support structure(s), as aspects of the technology described herein are not limited in this respect. In embodiments where the dual band antenna 1206 is a MEMS antenna, the posts 1205 may be manufactured using any suitable semiconductor fabrication technique(s).

Additionally, as shown in FIG. 12A, target device 1200 further comprises bias control circuitry 1212 disposed on substrate 1202 and electrically coupled to frequency mixer 1208 using line 1210. In the illustrated embodiment, line 1210 runs along substrate 1202 from bias control circuitry 1212 to one of the posts 1205, up along the post 1205, and then along dual band antenna 1206 to the frequency mixer 1208. It should be appreciated, however, that bias control circuitry 1212 may be electrically coupled to frequency mixer 1208 in any other suitable way, as aspects of the technology described herein are not limited in this respect. For example, in some embodiments, line 1210 may transition from substrate 1202 to antenna 1206 using its own dedicated post, separate from posts 1205.

The bias control circuitry 1212 may be configured to perform one or more function analogous to those of bias control circuitry 1008 described with reference to FIG. 10. For example, the bias control circuitry 1212 may be configured to reverse bias the frequency mixer 1208 to turn the target device 1200 off (e.g., so that the target device 1200 stops transmitting RF signals in response to receiving RF signals). In some embodiments, bias control circuitry 1212 may be configured to apply a forward bias to frequency mixer 1208 to increase the gain of the dual band antenna 1206 so as to increase the amplitude of the RF signals transmitted by the dual band antenna 1206. For example, in some embodiments, the bias control circuitry 1212 may be configured to apply a forward bias to the frequency mixer 1208 so as to optimize the impedance match between the dual band antenna 1206 and the frequency mixer 1208.

Figure 12B:
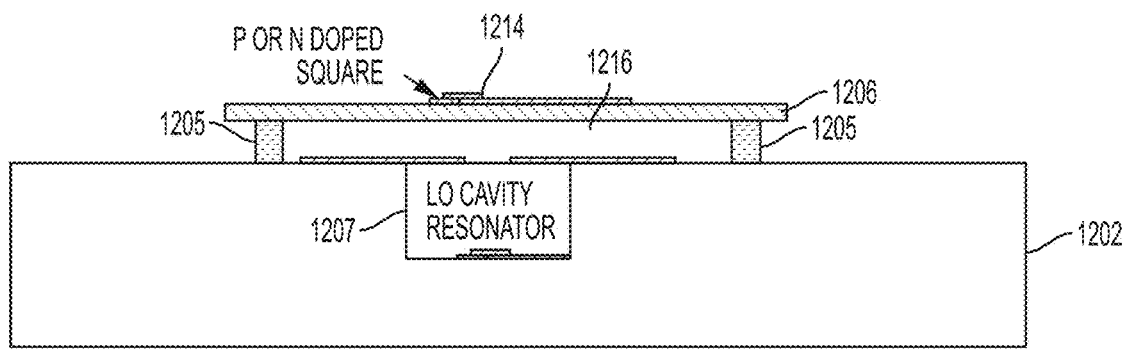
FIG. 12B is a diagram of a side view of a target device having a local oscillator and a dual band antenna, in accordance with some embodiments of the technology described herein.

FIG. 12B is a diagram of a side view of a target device 1200 in an embodiments, where the oscillator 1204 is realized as a cavity resonator 1207, dual band antenna 1206 is a MEMS antenna, and frequency mixer 1208 is realized as a P or N doped square 1214 disposed on the MEMS antenna 1206. Cavity resonator 1207 is configured to generate RF signals and transmit them to dual band antenna 1206 through air gap. In this configuration, the dual band antenna 1206 may be efficient It should be appreciated that the embodiments illustrated in FIGS. 12A and 12B are illustrative and that there are variations. For example, in some embodiments, target device 1200 may further comprise circuitry for amplifying RF signals after they are received by dual band antenna 1206 and/or before RF signals are to be transmitted by dual band antenna 1206. For example, in some embodiments, the target device may comprise a single-stage transistor operating as both a frequency mixer and as an amplifier. The input of the single-stage transistor may be impedance tuned via the receive mode of the dual band antenna 1206 and the output of the single-stage transistor may be impedance tuned via the transmit mode of the dual band antenna 1206.

As discussed herein, in some embodiments, a localization system may comprise multiple interrogator devices configured to interrogate one or more target devices in order to determine the location(s) of the target device(s) based on their respective responses to the interrogating RF signals. In some embodiments, each of the multiple interrogator devices may be configured to transmit RF signals to a target device and receive responsive RF signals from the target device. However, in other embodiments, only one of the interrogator devices may interrogate the target devices by transmitting RF signals to the target device, while all the interrogator devices (including the transmitting interrogator) may "listen" by receiving RF signals generated by the target device in response to receiving RF signals from the transmitting interrogator. The transmitting interrogator device may be referred herein to as a "master" interrogator device. The "listening" interrogator devices may be referred to herein as "slave" interrogator devices.

In some embodiments, a slave interrogator device may not include a transmit antenna for transmitting RF signals to a target device nor transmit circuitry for generating RF signals for transmission. This may reduce the cost of manufacturing, the size, and the power consumption of the slave interrogator relative to an interrogator device that performs both transmit and receive functions. For example, the size of a receive-only interrogator die substrate may be reduced because it does not need to accommodate a transmit antenna. As another example, the size of the semiconductor die in the receive-only interrogator may be reduced because it does not need to include transmit circuitry.

In some embodiments, the master interrogator and one or more slave interrogators may be phase coherent with one another. In some embodiments, phase coherence among the master and slave interrogators may be achieved by using synchronization circuitry to provide all the oscillators a common reference signal (e.g., a chirped direct digitally synthesized reference signal or a signal generated by fixed-frequency reference oscillator). The common reference signal may embody RF signal synthesis information that each of the slave interrogators may utilize for generating a respective local version of the RF signal transmitted to the target device by the master interrogator. In turn, at a particular slave interrogator, the local version of the RF signal transmitted to the target device by the master interrogator may be processed phase coherently with the RF signal received by the slave interrogator from the target device. In this way, each slave interrogators may determine a distance (or at least generate a mixed RF signal indicative of the distance) between the slave interrogator and the target device.

Figure 14A:
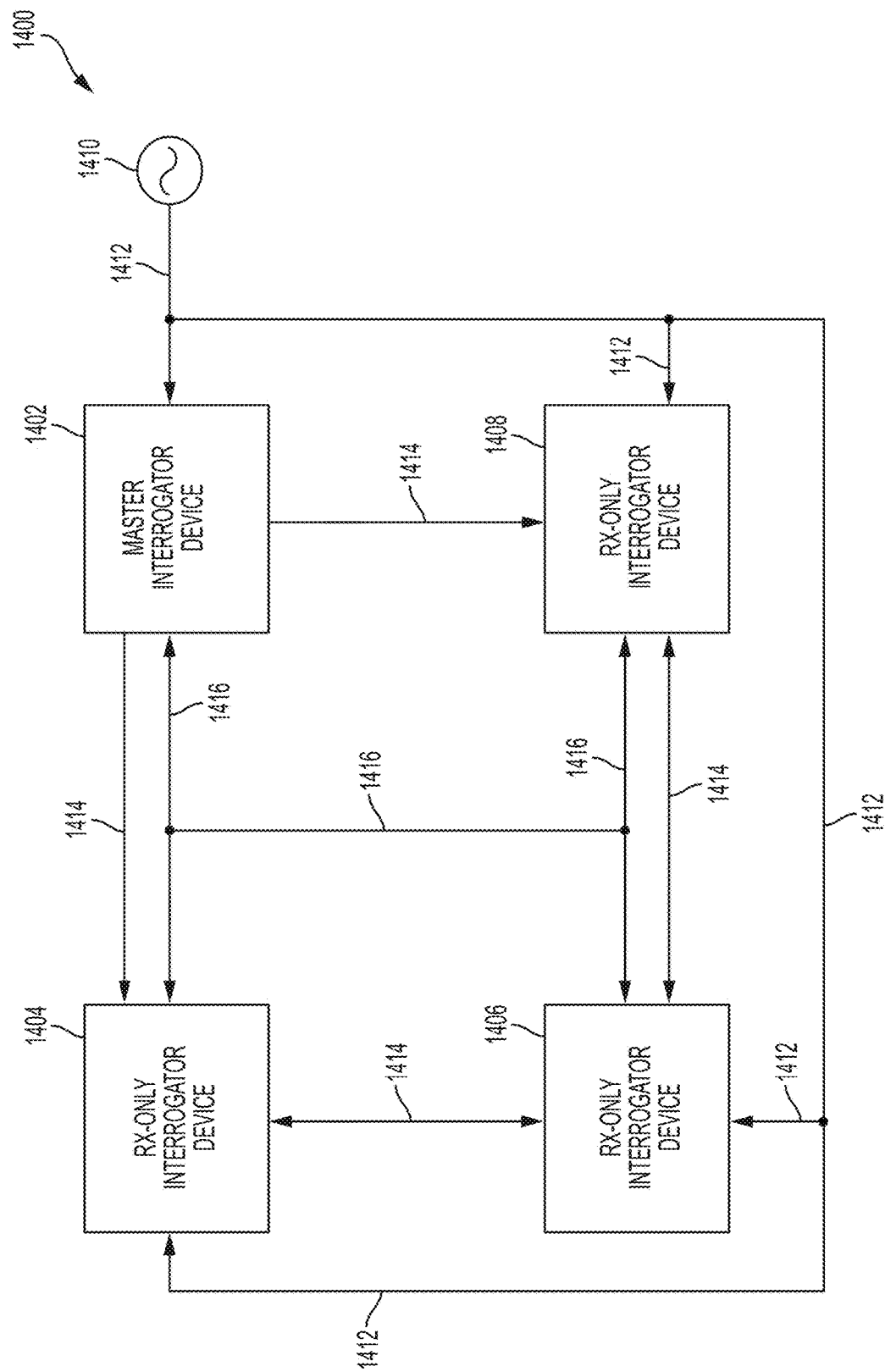
FIG. 14A is a block diagram of an illustrative localization system comprising multiple synchronized interrogator devices including at least one transmit and receive interrogator device and multiple receive-only interrogator device, in accordance with some embodiments of the technology described herein.

FIG. 14A is a block diagram of an illustrative localization system 1400 comprising multiple synchronized (e.g., phase coherent) interrogators including master interrogator 1402 and three receive-only interrogators 1404, 1406, 1408. Although there are three receive-only interrogators shown in the illustrative embodiment of FIG. 14A, in other embodiments, a localization system may include any suitable number (e.g., one, two, four, five, six, seven, eight, nine, ten, etc.) of receive-only interrogators synchronized with master interrogator 1402. In addition, although in the illustrated embodiment of FIG. 14A each of the interrogators 1404, 1406, and 1408 is a receive-only interrogator, in other embodiments, any of the interrogators 1404, 1406, and 1408 may be capable of transmitting and receiving RF signals, but may be configured to operate in a receive-only mode.

The system 1400 further includes synchronization circuitry comprising fixed-frequency reference oscillator 1410 and lines 1412 configured to provide output of oscillator 1410 to each of the interrogators 1402, 1404, 1406, and 1408. The master interrogator 1402 may be of any suitable type including any of the types interrogators described herein. Each of interrogators 1404, 1406, and 1408, may be of any suitable type including the type described below with reference to FIG. 14C.

As shown in FIG. 14A, the system 1400 also includes trigger lines 1414, which help to ensure that each of the receive-only interrogators 1404, 1406, and 1408 generates, at the same time, a local version of the RF signal transmitted by the master interrogator 1402. This local version of the transmitted RF signal will be used to generate a local signal for mixing with a received RF signal from the target device that was generated by the target device in response to receiving the RF signal transmitted by the master interrogator 1402. When the RF signals involved are chirps, the trigger lines 1414 may be said to allow the receive-only interrogators to "receive-chirp" at the same time. Accordingly, in some embodiments, the master interrogator 1402 may be configured to share a trigger signal with receive-only interrogators 1404, 1406, and 1408 using trigger lines 1414. The master interrogator 1402 may be configured to transmit and receive RF signals at a rising edge of the trigger signal, and each of the receive-only interrogators 1404, 1406, and 1408 may generate their local versions of the RF signal transmitted by interrogator 1402 and receive an RF signal from the target device at the rising edge of the same trigger. For example, the master interrogator 1402 may be configured to transmit and receive chirps at a rising edge of the trigger signal, and each of the receive-only interrogators 1404, 1406, and 1408 may generate their local versions of the transmitted chirp and receive a chirp from the target device at the rising edge of the same trigger.

In some embodiments, any one (e.g., all) of the receive-only interrogators 1404, 1406, and 1406 may be configured to generate information indicative of the distance between the interrogator and the target device. A receive-only interrogator may provide the generated information to the master interrogator 1402 via data lines 1414. For example, in some embodiments, each receive-only interrogator may be configured to determine an estimate of the distance for an RF signal between itself and the target device and provide the determined estimate to master interrogator 1402. Based on the provided estimates, the master interrogator 1402 may determine a location of the target device and may include circuitry (e.g., a processor) for performing such a determination.

As another example, in some embodiments, a receive-only interrogator may obtain information indicative of the distance between the receive interrogator and the target device, but may not be configured to complete processing this information to determine an estimate of the distance. Rather, the receive-only interrogator may provide this information to the master interrogator 1402 for further processing, and the master interrogator 1402 may complete processing of this information to derive an estimate of the distance between the receive-only interrogator and the target device. To this end, master interrogator 1402 may include circuitry (e.g., a processor, an ADC, etc.) for performing such processing. For example, in some embodiments, a receive-only interrogator may generate a mixed RF signal indicative of the distance between the interrogator and the target device by mixing the RF signal received from a target device with a local version of the RF signal transmitted by the master interrogator, that has been transformed in a manner analogous to the processing performed by the target device (e.g., by passing the local version of the RF signal through a frequency multiplier), and may provide the mixed RF signal to the master interrogator for further processing. Alternatively, the receive only-interrogator may sample the mixed RF signal and provide raw ADC counts to the master interrogator.

It should be appreciated that although, in some embodiments, each of the receive-only interrogators 1404, 1406, and 1408 is configured to provide information to master interrogator 1402 via data lines 1414, in other embodiments, each receive-only interrogator as well as the master interrogator may provide information indicative of the distance between the receive interrogator and the target device to a separate processor (e.g., a processor not part of any interrogator device and, for example, on a separate semiconductor die) for further processing.

In some embodiments, during operation of system 1400, master interrogator 1402 may: (1) receive, via lines 1412, a fixed-frequency reference signal; (2) generate, using the fixed-frequency reference signal, an RF signal for transmission (e.g., an RF signal having a first center frequency); and (3) transmit the generated RF signal to a target device via the master interrogator's transmit antenna. The target device may receive the RF signal transmitted by the interrogator 1402, transform the received RF signal (e.g., by doubling its frequencies) to obtain a transformed RF signal having a second center frequency that is a harmonic of the first center frequency (e.g., twice the first center frequency), and transmit the transformed RF signal using a transmit antenna onboard the target device. Each of the interrogators 1402, 1404, 1406, and 1406 may receive, via their respective receive antennas, a version of the transformed RF signal.

After receiving the target device's responsive RF signal, interrogator 1402 may use the responsive RF signal and a version of the transmitted RF signal to generate a first mixed RF signal indicative of a distance between the interrogator 1402 and the target device. Each of receive-only interrogators 1404, 1406, and 1408 may receive, via lines 1412, a fixed-frequency reference signal and generate, using the received fixed-frequency reference signal, a local version of the RF signal transmitted by master interrogator 1402. Next, each of receive-only interrogators 1404, 1406, and 1408 may receive a respective responsive RF signal from the target device and may generate, using the received responsive RF signal and a respective local version of the transmitted RF signal, a respective mixed RF signal indicative of a distance between the receive-only interrogator and the target device.

Next, in some embodiments, each of the interrogators 1402, 1404, 1406, and 1408 may: (1) determine an estimate of the distance between the interrogator and the target device from the mixed RF signal; and (2) provide the determined estimate to the master interrogator 1402 or other processor. In turn, the master interrogator 1402 or other processor may estimate the location of the target device from the received distance estimates. Alternatively, each of the interrogators 1404, 1406, and 1408 may not be configured to determine an estimate of the distance, but instead may provide information that can be used to make such a determination (e.g., the mixed RF signals, a sampled version of the mixed RF signals, etc.) to master interrogator 1402 or other processor. The master interrogator 1402 or other processor may then determine: (1) an estimate of the distance between each interrogator (both receive only and master interrogator) and the target device; and (2) determine the location of the target device based on these estimates.

Figure 14B:
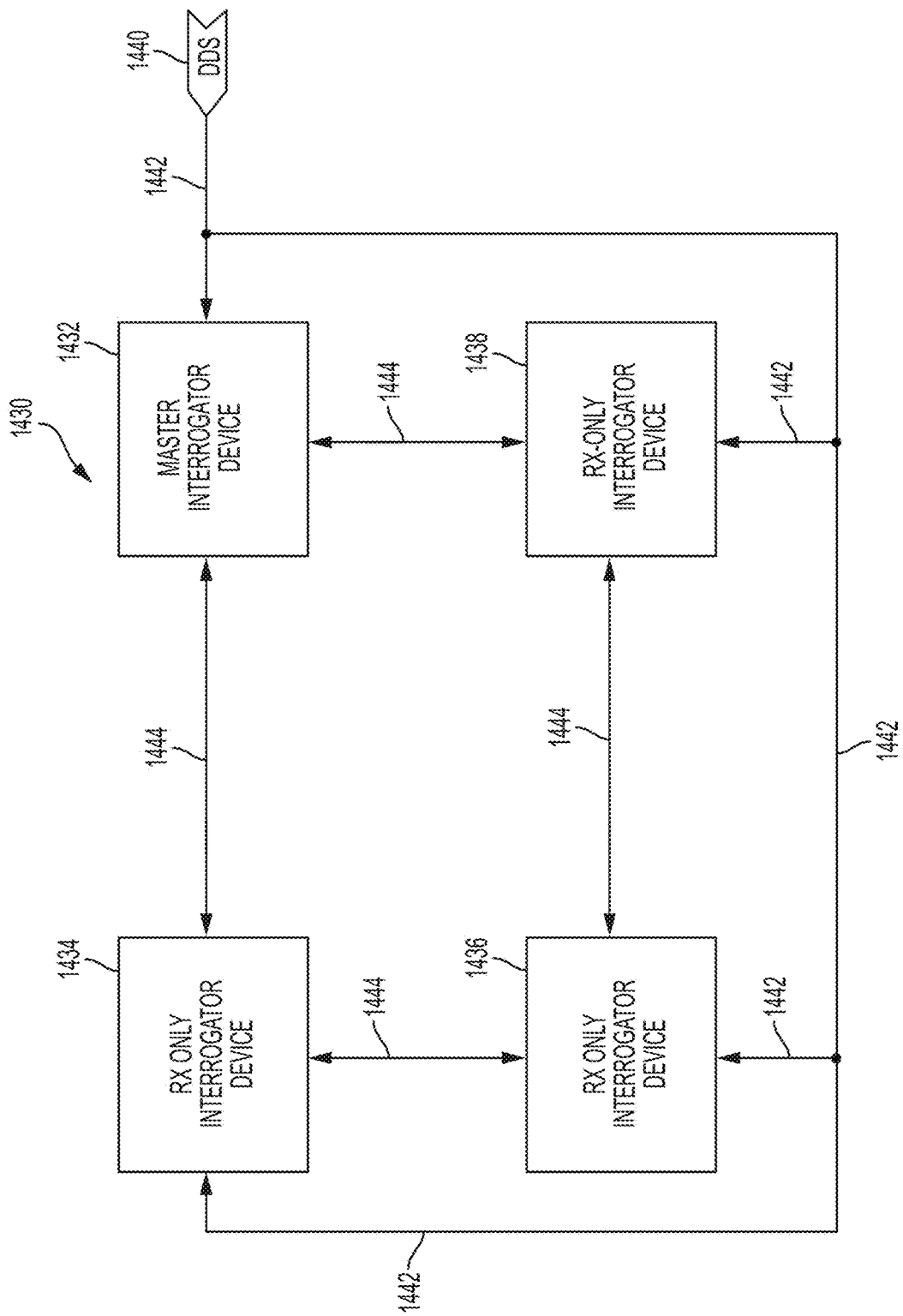
FIG. 14B is a block diagram of another illustrative localization system comprising multiple synchronized interrogator devices including at least one transmit and receive interrogator device and multiple receive-only interrogator device, in accordance with some embodiments of the technology described herein.
Figure 14C:
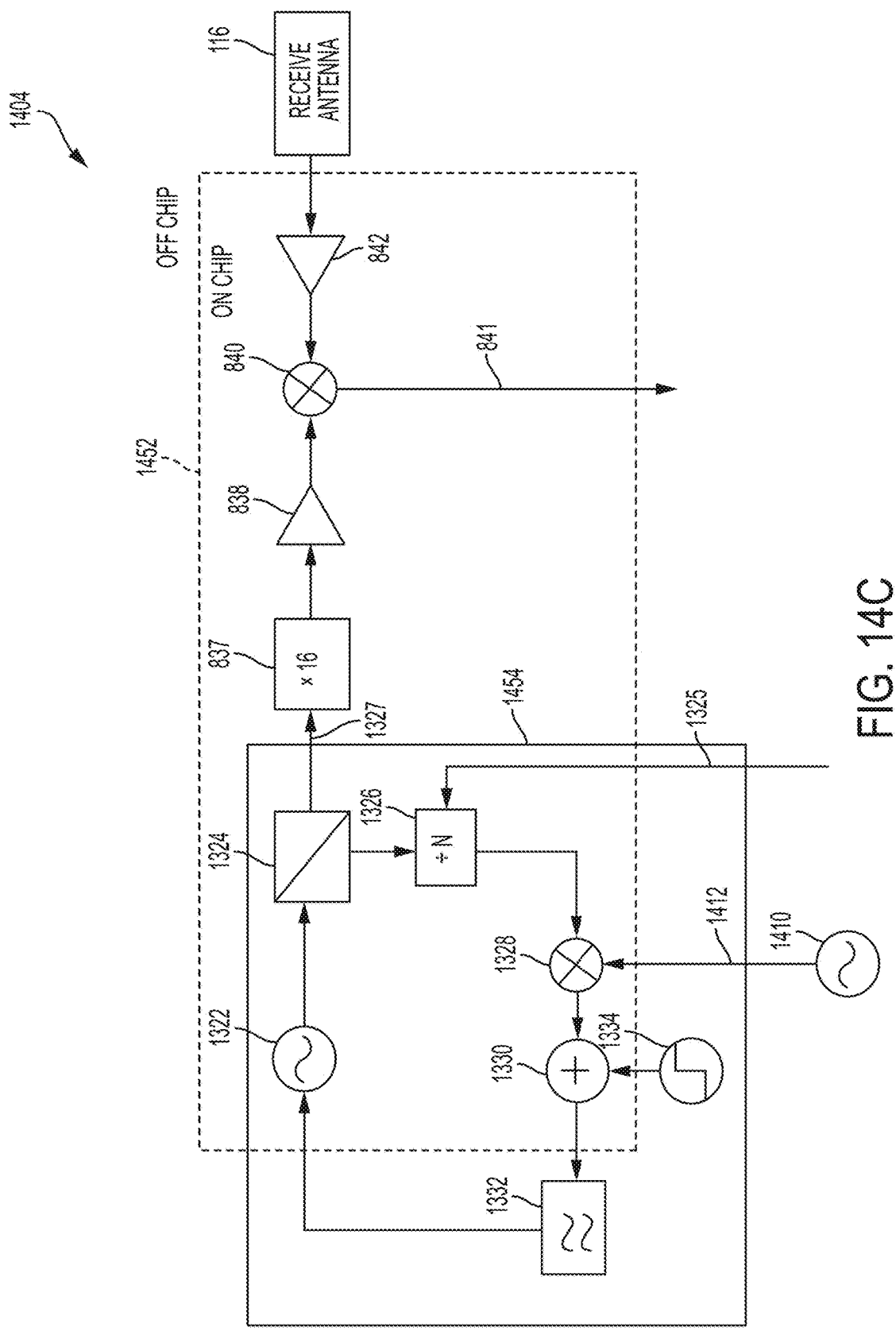
FIG. 14C is a block diagram of a receive-only interrogator device part of the illustrative localization system of FIG. 14A, in accordance with some embodiments of the technology described herein.

FIG. 14C is a block diagram of a receive-only interrogator device 1404 part of the illustrative localization system of FIG. 14A, in accordance with some embodiments of the technology described herein. In some embodiments, receive-only interrogators 1406 and 1408 may also be implemented in accordance with the illustrative embodiments of receive-only interrogator 1404 shown in FIG. 14C.

As described above, in some embodiments, receive-only interrogator 1404 may be configured to operates phase coherently with master interrogator 1402. For example, as shown in FIG. 14C, receive-only interrogator 1404 may be configured to generate RF signals that are phase coherent with the RF signals generated and transmitted by the master interrogator 1402. To this end, receive-only interrogator 1404 includes waveform generation circuitry 1454 for generating frequency-modulated waveforms using a phase locked loop in a "feedback loop perturbation" approach, which was described above with reference to FIG. 13B. However, unlike the waveform generation circuitry 1320 shown in FIG. 13B, the waveform generation circuitry 1454 replaces the fixed-frequency reference oscillator 1336 with shared fixed-frequency reference oscillator 1410 (which is shared among all the receive-only interrogators 1404, 1406, and 1408 shown in FIG. 14A). As shown in FIG. 14C, the shared fixed-frequency reference oscillator 1410 is coupled to frequency multiplier 1328 via line 1412.

As shown in FIG. 14C, the waveform generator circuitry 1454 also includes a voltage controlled oscillator (VCO) 1322, signal splitter 1324, programmable digital divider 1326 that is programmable by input provided via line 1325, summation block 1330, loop filter 1332, and a step/impulse generator 1334. The summation block 1330 is within the phase locked loop so that a step and/or impulse generated by step/impulse generator 1334 may be fed directly into the loop thereby perturbing the loop to sweep up to a desired frequency then correct-back-down to its programmed frequency. This perturbation in the feedback loop would cause an up-then-down chirp, relying on a second order transfer function of the loop filter 1332 so that the output provided on line 1327 is a linear chirp.

The RF signals provided on line 1327 are processed, by interrogator 1404, in a manner similar to RF signals provided via line 830 shown in FIG. 8B. As shown in FIG. 14C, the RF signals are provided, via line 1327, to frequency multiplier circuitry 837, which increases the frequencies in the RF signals by a desired factor. For example, in the illustrative embodiment of FIG. 14C, the frequency multiplier circuitry 837 increases the frequencies in the RF signals by a factor of 16 (e.g., from RF signals having a center frequency of 7.5 GHz to RF signals having a center frequency of 120 GHz). However, in other embodiments, the frequency multiplier circuitry 837 may increase the frequencies in the RF signal by any other suitable factor (e.g., by a factor of 2, 4, 8, 32, etc.), as aspects of the technology described herein are not limited in this respect. The frequency multiplier circuitry 837 may be implemented in any suitable way (e.g., using one frequency multiplier or a series of frequency multipliers with zero, one, or multiple amplification stages in the series).

The RF signals output by frequency multiplier circuitry 837 are amplified by amplifier 838 and mixed, using frequency mixer 840, with RF signals received from a target device by receive antenna 116 and amplified by amplifier 842 to obtain mixed RF signals output from frequency mixer 840 on line 841. The mixed RF signals output on line 841 may be indicative of the distance between interrogator device 825 and the target device. The mixed signals output on line 841 may be further processed in any suitable way and, for example, may be processed by one or more amplifiers and/or filters prior to being digitized using an ADC.

In some embodiments, the circuitry shown within block 1452 may be implemented as integrated circuitry integrated with a semiconductor die. However, in other embodiments, one or more components within block 1452 may be implemented not on a semi-conductor die (e.g., as a discrete component on a PCB) and/or one or more components not within block 1452 may be implemented as integrated circuitry on a semiconductor die (e.g., loop filter 1332).

It should be appreciated that the receive-only interrogator 1404 does not include either transmit circuitry or a transmit antenna. As discussed above, this may reduce the cost of manufacturing, the size, and the power consumption of the receive-only interrogator relative to an interrogator device that performs both transmit and receive functions.

FIG. 14B is a block diagram of an illustrative localization system 1430 comprising multiple synchronized (e.g., phase coherent) interrogators including master interrogator 1432 and three receive-only interrogators 1434, 1436, 1438. Although there are three receive-only interrogators shown in the illustrative embodiment of FIG. 14B, in other embodiments, a localization system may include any suitable number (e.g., one, two, four, five, six, seven, eight, nine, ten, etc.) of receive-only interrogators synchronized with master interrogator 1432. In addition, although in the illustrated embodiment of FIG. 14B each of the interrogators 1434, 1436, and 1438 is a receive-only interrogator, in other embodiments, any of the interrogators 1434, 1436, and 1438 may be capable of transmitting and receiving RF signals, but may be configured to operate in a receive-only mode.

The system 1430 further includes synchronization circuitry comprising shared direct digital synthesizer 1440 and lines 1442 configured to provide output of DDS 1440 to each of the interrogators 1432, 1434, 1436, and 1438. The master interrogator 1432 may be of any suitable type including any of the types interrogators described herein. Each of interrogators 1434, 1436, and 1438, may be of any suitable type including the type described with reference to FIG. 14D.

In some embodiments, any one (e.g., all) of the receive-only interrogators 1434, 1436, and 1436 may be configured to generate information indicative of the distance between the interrogator and the target device. A receive-only interrogator may provide the generated information to the master interrogator 1432 via data lines 1444. For example, in some embodiments, each receive-only interrogator may be configured to determine an estimate of the distance between itself and the target device and provide the determined estimate to master interrogator 1432. Based on the provided estimates, the master interrogator 1432 may determine a location of the target device and may include circuitry (e.g., a processor) for performing such a determination.

As another example, in some embodiments, a receive-only interrogator may obtain information indicative of the distance between the receive interrogator and the target device, but may not be configured to complete processing this information to determine an estimate of the distance. Rather, the receive-only interrogator may provide this information to the master interrogator 1432 for further processing, and the master interrogator 1432 may complete processing of this information to derive an estimate of the distance between the receive-only interrogator and the target device. To this end, master interrogator 1432 may include circuitry (e.g., a processor, an ADC, etc.) for performing such processing. For example, in some embodiments, a receive-only interrogator may generate a mixed RF signal indicative of the distance between the interrogator and the target device by mixing the RF signal received from a target device with a local version of the RF signal transmitted by the master interrogator, that has been transformed in a manner analogous to the processing performed by the target device (e.g., by passing the local version of the RF signal through a frequency multiplier), and may provide the mixed RF signal to the master interrogator for further processing. Alternatively, the receive only-interrogator may sample the mixed RF signal and provide raw ADC counts to the master interrogator. In other embodiments, each receive-only interrogator as well as the master interrogator may provide information indicative of the distance between the receive interrogator and the target device to a separate processor (e.g., a processor not part of any interrogator device and, for example, on a separate semiconductor die) for further processing.

In some embodiments, during operation of system 1430, master interrogator 1432 may: (1) receive, via lines 1442, a reference RF signal synthesized by DDS 1440; (2) generate, using the reference RF signal, an RF signal for transmission (e.g., an RF signal having a first center frequency); and (3) transmit the generated RF signal to a target device via the master interrogator's transmit antenna. The target device may receive the RF signal transmitted by the interrogator 1432, transform the received RF signal (e.g., by doubling its frequencies) to obtain a transformed RF signal having a second center frequency that is a harmonic of the first center frequency (e.g., twice the first center frequency), and transmit the transformed RF signal using a transmit antenna onboard the target device. Each of the interrogators 1432, 1434, 1436, and 1436 may receive, via their respective receive antennas, a version of the transformed RF signal.

After receiving the target device's responsive RF signal, interrogator 1432 may use the responsive RF signal and a version of the transmitted RF signal to generate a first mixed RF signal indicative of the distance between the interrogator 1432 and the target device. Each of receive-only interrogators 1434, 1436, and 1438 may receive, via lines 1442, the reference signal generated by the DDS 1440, and generate using the received reference signal, a local version of the RF signal transmitted by master interrogator 1432. Next, each of receive-only interrogators 1434, 1436, and 1438 may receive a respective responsive RF signal from the target device and may generate, using the received responsive RF signal and a respective local version of the transmitted RF signal, a respective mixed RF signal indicative of the distance between the receive-only interrogator and the target device.

Next, in some embodiments, each of the interrogators 1432, 1434, 1436, and 1438 may: (1) determine an estimate of the distance between the interrogator and the target device from the mixed RF signal; and (2) provide the determined estimate to the master interrogator 1432 or other processor. In turn, the master interrogator 1432 or other processor may estimate the location of the target device from the received distance estimates. Alternatively, each of the interrogators 1434, 1436, and 1438 may not be configured to determine an estimate of the distance between the interrogator and the target device, but instead may provide information that can be used to make such a determination (e.g., the mixed RF signals, a sampled version of the mixed RF signals, etc.) to master interrogator 1432 or other processor. The master interrogator 1432 or other processor may then determine: (1) an estimate of the distance between each interrogator (both receive only and master interrogator) and the target device; and (2) determine the location of the target device based on these estimates.

Figure 14D:
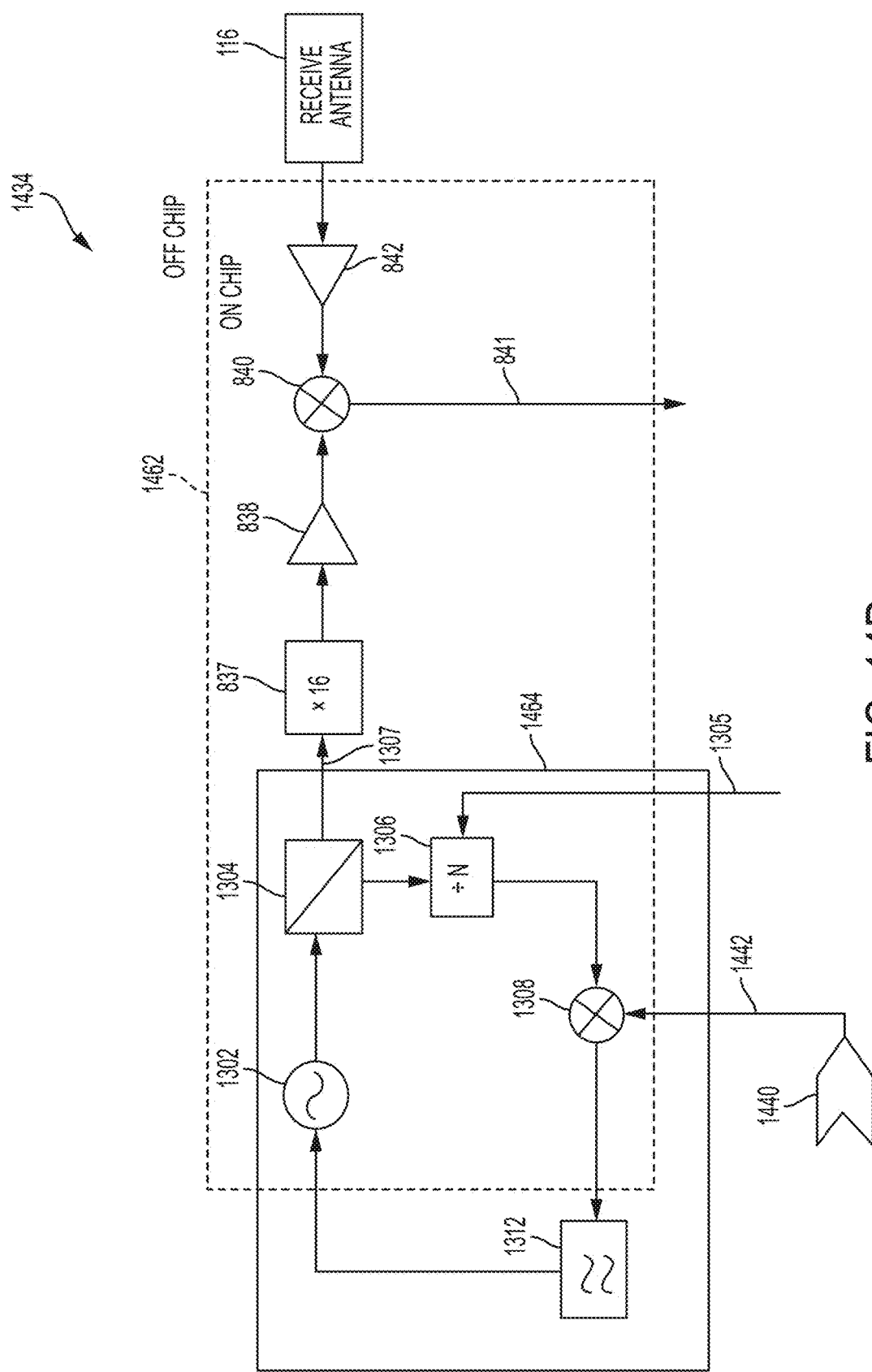
FIG. 14D is a block diagram of a receive-only interrogator device part of the illustrative localization system of FIG. 14B, in accordance with some embodiments of the technology described herein.

FIG. 14D is a block diagram of a receive-only interrogator device 1434 part of the illustrative localization system of FIG. 14B, in accordance with some embodiments of the technology described herein. In some embodiments, receive-only interrogators 1436 and 1438 may also be implemented in accordance with the illustrative embodiments of receive-only interrogator 1434 shown in FIG. 14D.

As described above, receive-only interrogator 1434 operates phase coherently with master interrogator 1432. For example, as shown in FIG. 14D, receive-only interrogator 1434 is configured to generate RF signals that are phase coherent with the RF signals generated and transmitted by the master interrogator 1432. To this end, receive-only interrogator 1434 includes waveform generation circuitry 1464 for generating frequency-modulated waveforms using a direct digital synthesizer in a "swept reference" approach, which was described above with reference to FIG. 13A. However, unlike the waveform generation circuitry 1300 shown in FIG. 13A, the waveform generation circuitry 1464 replaces the DDS 1310 with shared direct digital synthesizer 1440 (which is shared among all the receive-only interrogators 1434, 1436, and 1438 shown in FIG. 14B). As shown in FIG. 14D, the shared DDS 1440 is coupled to frequency multiplier 1308 via line 1442.

As shown in FIG. 14D, the waveform generator circuitry 1464 also includes a voltage controlled oscillator (VCO) 1302, signal splitter 1304, programmable digital divider 1306 that is programmable by input provided via line 1305, and loop filter 1312. The DDS 1440 operates as a reference oscillator for the resulting phase locked loop. In some embodiments, the DDS 1440 may be a digital synthesizer that stores (e.g., in a memory part of DDS 1440) values for a digital waveform (e.g., a sinusoid, a chirp, or any other suitable waveform). The DDS 1440 may be configured to "play back" the stored values through a digital to analog converter (DAC). That is, the DDS 1440 may be configured to process the stored values using a DAC, which may be part of the DDS 1440 in some embodiments, and output the resulting analog values. The rate at which the DDS 1440 outputs the stored values for the digital waveform may determine its output frequency. In some embodiments, the DDS 1440 may be chirp-modulated above and below a center reference clock frequency, thereby causing the output of the VCO 1302 to chirp at its carrier frequency. The DDS 1310 may be chirp modulated in any of a variety of ways, examples of which are provided herein. The output of DDS 1310 is multiplied-up in the PLL thereby providing a chirp at the microwave frequency of interest at the RF Out line 1307.

The RF signals provided on line 1307 are processed, by interrogator 1434, in a manner similar to RF signals provided via line 830 shown in FIG. 8B. As shown in FIG. 14D, the RF signals are provided, via line 1307, to frequency multiplier circuitry 837, which increases the frequencies in the RF signals by a desired factor (e.g., as discussed above with reference to FIG. 14C). The RF signals output by frequency multiplier circuitry 837 are amplified by amplifier 838 and mixed, using frequency mixer 840, with RF signals received from a target device by receive antenna 116 and amplified by amplifier 842 to obtain mixed RF signals output from frequency mixer 840 on line 841. The mixed RF signals output on line 841 may be indicative of a distance between interrogator device 825 and the target device. The mixed signals output on line 841 may be further processed in any suitable way and, for example, may be processed by one or more amplifiers and/or filters prior to being digitized using an ADC.

In some embodiments, the circuitry shown within block 1462 may be implemented as integrated circuitry integrated with a semiconductor die. However, in other embodiments, one or more components within block 1462 may be implemented not on a semi-conductor die (e.g., as a discrete component on a PCB) and/or one or more components not within block 1462 may be implemented as integrated circuitry on a semiconductor die (e.g., loop filter 1312). It should be appreciated, like interrogator 1404, the receive-only interrogator 1434 does not include either transmit circuitry or a transmit antenna. As discussed above, this may reduce the cost of manufacturing, the size, and the power consumption of the receive-only interrogator relative to an interrogator device that performs both transmit and receive functions.

Figure 17:
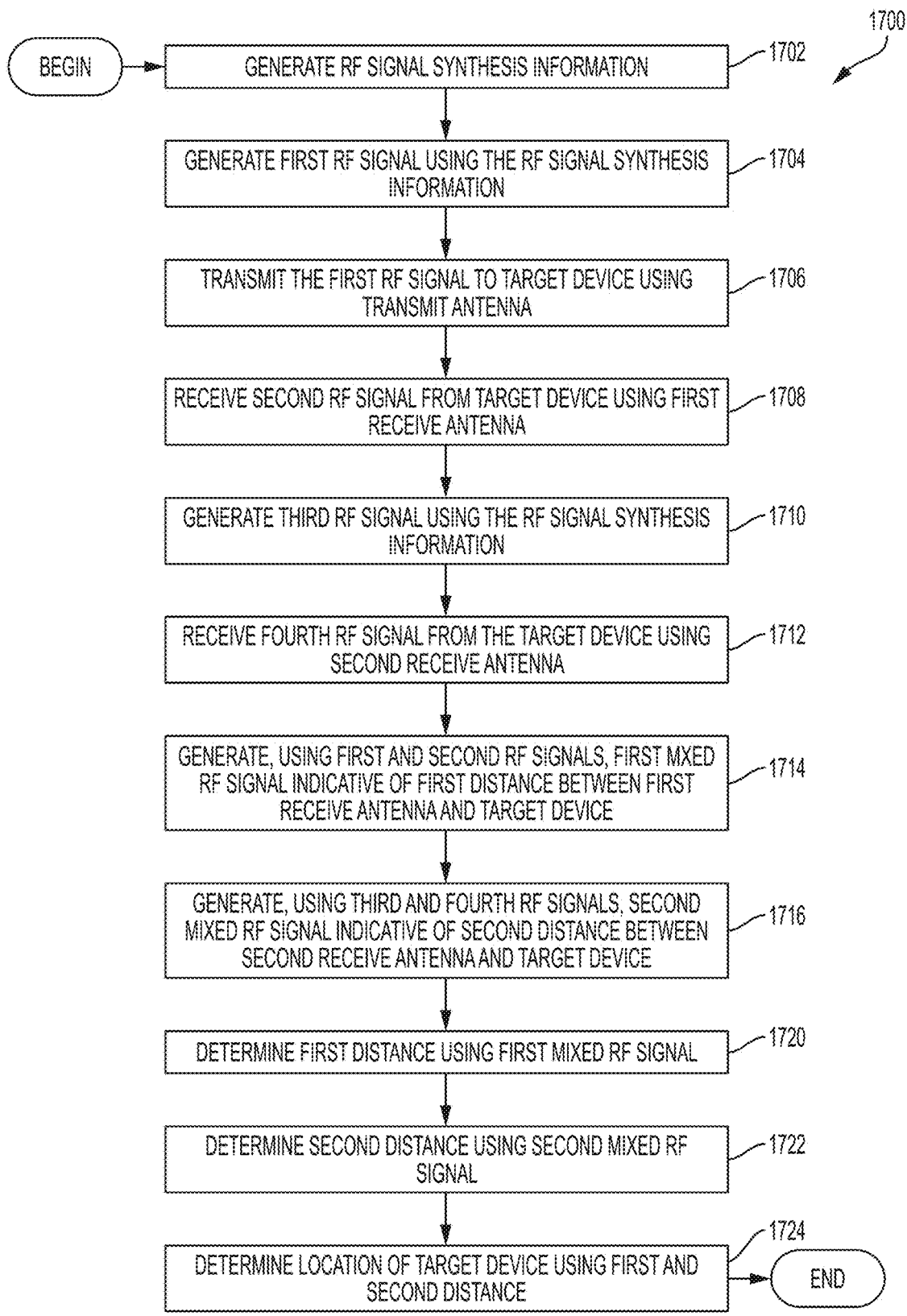
FIG. 17 is a flowchart of an illustrative process for determining the location of a target device using multiple synchronized interrogator devices including at least one master interrogator device and a receive-only interrogator device, in accordance with some embodiments of the technology described herein.

FIG. 17 is a flowchart of an illustrative process 1700 for determining the location of a target device using multiple synchronized interrogator devices including at least one master interrogator device and a receive-only interrogator device, in accordance with some embodiments of the technology described herein. In some embodiments, the receive-only interrogator may not be capable of transmitting RF signals (e.g., it may not have circuitry for generating RF signals for transmitting using a transmit antenna and/or a transmit antenna). In other embodiments, the receive-only interrogator may be capable of transmitting and receiving RF signals (e.g., it may have a transmit RF antenna and circuitry for generating RF signals for transmission by the transmit antenna), but may be configured to operate in a receive-only mode. Process 1700 may be performed by any suitable system and, for example, may be performed by system 200 described with reference to FIG. 2, system 1400 described with reference to FIG. 14A, and system 1430 described with reference to FIG. 14B.

Process 1700 begins at act 1702, where RF synthesis information is generated by the system performing process 1700. For example, the RF synthesis information may comprise a fixed-frequency reference signal generated by fixed-frequency reference oscillator (e.g., oscillator 1410). As another example, the RF synthesis information may comprise a reference signal generated by a direct digital synthesizer (e.g., DDS 1440).

At act 1704, the master interrogator in the system performing process 1700 generates a first RF signal using the RF signal synthesis information generated at act 1402. For example, master interrogator 1402 may generate the first RF signal using the fixed-frequency reference signal generated by oscillator 1410. As another example, master interrogator 1432 may generate the first RF signal using the reference signal generated by DDS 1440. After the first RF signal is generated at act 1704, the master interrogator uses its transmit antenna to transmit the first RF signal to a target device at act 1706.

At act 1708, the master interrogator may receive a second RF signal from the target device using the master interrogator's receive antenna (the "first" receive antenna). The received second RF signal is a result of propagation, from the target device to the master interrogator, of an RF signal generated by the target device in response to receiving the first RF signal from the master interrogator.

At act 1710, a receive-only interrogator part of the system executing process 1700 generates a third RF signal using the RF signal synthesis information generated at act 1402. For example, receive-only interrogator 1404 may generate the third RF signal using the fixed-frequency reference signal generated by oscillator 1410. As another example, receive-only interrogator 1434 may generate the third RF signal using the reference signal generated by DDS 1440.

At act 1712, the receive-only interrogator may receive a fourth RF signal from the target device using the receive-only interrogator's receive antenna (the "second" receive antenna). The received fourth RF signal is a result of propagation, from the target device to the master interrogator, of an RF signal generated by the target device in response to receiving the first RF signal from the master interrogator. Although the second RF signal and the fourth RF signal may have the same frequency content they need not and, in any case, they are received by different devices, as the second RF signal is received by a master interrogator and the fourth RF signal is received by the receive-only interrogator different from the master interrogator.

At act 1714, the master interrogator generates, using the first and second RF signals, a first mixed RF signal. The first mixed RF signal may be indicative of a distance between the master interrogator and the target device. The first mixed RF signal may be generated in any suitable way including in any of the ways described herein. For example, the master interrogator may generate the first RF mixed signal at least in part by: (1) transforming the first RF signal in a manner analogous to how the target device transforms received RF signals prior to retransmitting them (e.g., using one or multiple frequency multipliers); and (2) mixing the transformed RF signal with the second RF signal received by the first receive antenna.

At act 1716, the receive-only interrogator generates, using the third and fourth RF signals, a second mixed RF signal. The second mixed RF signal may be indicative of a distance between the receive-only interrogator and the target device. The second mixed RF signal may be generated in any suitable way including in any of the ways described herein. For example, the receive-only interrogator may generate the first RF mixed signal at least in part by: (1) transforming the third RF signal in a manner analogous to how the target device transforms received RF signals prior to retransmitting them (e.g., using one or more frequency multipliers); and (2) mixing the transformed RF signal with the fourth RF signal received by the second receive antenna.

At act 1720, the system performing process 1700 may determine the distance between the master interrogator and the target device using the first mixed RF signal obtained at act 1714. This may be done in any suitable way including in any of the ways described with reference to act 1506 of process 1500. For example, the first mixed RF signal may be sampled using an ADC and a Fourier transform (e.g., a discrete Fourier transform) may be applied to the samples to obtain a time-domain waveform. The time-domain waveform may be processed to obtain an estimate of the time of flight between the interrogator and the target device. The estimate of the time of flight may be converted (e.g., based on the speed of propagation of RF signals through air) to an estimate of the distance between the interrogator and the target device. This processing may be performed by the master interrogator, by an external processor external to the master interrogator, or by a combination of the master interrogator (e.g., the ADC may be onboard the master interrogator device) and an external processor (e.g., the Fourier analysis).

At act 1722, the system performing process 1700 may determine the distance between the receive-only interrogator and the target device using the second mixed RF signal obtained at act 1716. This may be done in any suitable way including in any of the ways described above with reference to act 1720.

Finally, at act 1724, the system performing process 1700 may determine a location of the target device using the distance between the master interrogator and the target device determined at act 1720 and the distance between the receive-only interrogator and the target device determined at act 1722. This may be done in any suitable way and, for example, using least-squares techniques. The processing of act 1724 may be performed by the master interrogator (in embodiments where the master interrogator contains a processor), by an external processor external to the master interrogator, or any suitable combination thereof.

It should be appreciated that process 1700 is illustrative and that there are variations. For example, although in the illustrative embodiment of FIG. 17, the location of the target device is estimated from two distance measurements (a measurement of distance between the master interrogator and the target device and a measurement of distance between a receive-only interrogator and the target device), in other embodiments, more than two distance measurements may be used to determine the location of the target device. For example, in some embodiments, each of multiple receive-only interrogators (e.g., each of two, three, or four receive-only interrogators) may be used to obtain a respective distance measurement to the target device such that, together with the distance measurement obtained by the master interrogator, three or more distance measurements may be used to determine the location of the target device.

Having thus described several aspects some embodiments, it is to be appreciated that various alterations, modifications, and improvements will readily occur to those skilled in the art. Such alterations, modifications, and improvements are intended to be within the spirit and scope of the present disclosure. Accordingly, the foregoing description and drawings are by way of example only.

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the concepts disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the present disclosure discussed above. The computer-readable medium or media can be transportable, such that the program or programs stored thereon can be loaded onto one or more different computers or other processors to implement various aspects of the present disclosure as discussed above.

The terms "program" or "software" are used herein to refer to any type of computer code or set of computer-executable instructions that can be employed to program a computer or other processor to implement various aspects of the present disclosure as discussed above. Additionally, it should be appreciated that according to one aspect of this embodiment, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various features and aspects of the present disclosure may be used alone, in any combination of two or more, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the concepts disclosed herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A device, comprising:
   a substrate;
   a first transmit antenna fabricated on the substrate and configured to transmit radio frequency (RF) signals at least at a first center frequency;
   a first receive antenna fabricated on the substrate and configured to receive RF signals at least at a second center frequency different than the first center frequency;
   a second receive antenna fabricated on the substrate and configured to receive RF signals at least at the first center frequency; and
   a second transmit antenna fabricated on the substrate and configured to transmit RF signals at least at the second center frequency;
   a semiconductor die mounted to the substrate and coupled to the first transmit antenna, the first receive antenna, the second transmit antenna, and the second receive antenna, the semiconductor die comprising:
      interrogator circuitry configured to provide a first RF signal having the first center frequency to the first transmit antenna, to receive a second RF signal having the second center frequency from the first receive antenna, and to determine a distance between the device and an external device that transmitted the second RF signal using the first RF signal and the second RF signal; and
      target device circuitry configured to receive RF signals having the first center frequency from the second receive antenna and provide RF signals having the second center frequency to the second transmit antenna.

2. The device of claim 1,
   wherein the interrogator circuitry comprises a frequency mixer configured to generate, using the first RF signal and the second RF signal, a mixed RF signal indicative of the distance between the device and the external device that transmitted the second RF signal.

3. The device of claim 1, wherein the target device circuitry comprises a frequency multiplier, and wherein the target device circuitry is configured to:
   receive a third RF signal having the first center frequency from the second receive antenna,
   generate a fourth RF signal having the second center frequency from the third RF signal at least in part by using the frequency multiplier; and
   provide the fourth RF signal to the second transmit antenna.

4. The device of claim 1, wherein each of the first and second transmit antennas is configured to transmit microwave RF signals, and wherein each of the first and second receive antennas is configured to receive microwave RF signals.

5. The device of claim 1, wherein the substrate comprises a printed circuit board having at least one conductive layer, and wherein the first transmit antenna, the second transmit antenna, the first receive antenna and the second receive antenna are fabricated on the substrate by patterning the at least one conductive layer.

6. The device of claim 5, wherein at least one of the first transmit antenna and the second transmit antenna and at least one of the first receive antenna and the second receive antenna are isotropic.

7. The device of claim 5, wherein at least one of the first transmit antenna and the second transmit antenna and at least one of the first receive antenna and the second receive antenna are directional.

8. A device, comprising:
   a substrate;
   a first transmit antenna fabricated on the substrate and configured to transmit radio frequency (RF) signals circularly polarized in a first rotational direction;
   a first receive antenna fabricated on the substrate and configured to receive RF signals circularly polarized in a second rotational direction different from the first rotational direction;
   a second receive antenna fabricated on the substrate and configured to receive RF signals circularly polarized in the first rotational direction; and
   a second transmit antenna fabricated on the substrate and configured to transmit RF signals circularly polarized in the second rotational direction;
   a semiconductor die mounted to the substrate and coupled to the first transmit antenna, the first receive antenna, the second transmit antenna, and the second receive antenna, the semiconductor die comprising:
   interrogator circuitry configured to provide a first RF signal having the first rotational direction to the first transmit antenna, to receive a second RF signal having the second rotational direction from the first receive antenna, and to determine a distance between the device and an external device that transmitted the second RF signal using the first RF signal and the second RF signal; and
   target device circuitry configured to receive RF signals from the second receive antenna and provide RF signals to the second transmit antenna.

* * * * *